(12) United States Patent
Izumi

(10) Patent No.: US 8,269,312 B2
(45) Date of Patent: Sep. 18, 2012

(54) SEMICONDUCTOR DEVICE WITH RESISTIVE ELEMENT

(75) Inventor: Naoki Izumi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 99 days.

(21) Appl. No.: 12/457,172

(22) Filed: Jun. 3, 2009

(65) Prior Publication Data

US 2009/0302384 A1   Dec. 10, 2009

(30) Foreign Application Priority Data

Jun. 5, 2008  (JP) ................................. 2008-147872
Jun. 6, 2008  (JP) ................................. 2008-149440

(51) Int. Cl.
    *H01L 29/00* (2006.01)
(52) U.S. Cl. ............... 257/536; 257/350; 257/E27.016; 438/382
(58) Field of Classification Search .................. 257/350, 257/360, 361, 379–381, 904, E27.016, E27.035; 438/381, 384
See application file for complete search history.

(56) References Cited

U.S. PATENT DOCUMENTS

| | | | | |
|---|---|---|---|---|
| 4,710,791 A * | 12/1987 | Shirato et al. | ........ | 257/363 |
| 5,426,067 A * | 6/1995 | Ogawa | ........ | 438/359 |
| 5,989,970 A * | 11/1999 | Ohkawa et al. | ........ | 438/384 |
| 6,140,183 A * | 10/2000 | Osanai | ........ | 438/268 |
| 6,462,386 B2 * | 10/2002 | Moriwaki et al. | ........ | 257/384 |
| 6,645,875 B2 * | 11/2003 | Ohkawa et al. | ........ | 438/745 |
| 6,818,514 B2 * | 11/2004 | Kim et al. | ........ | 438/275 |
| 6,833,586 B2 * | 12/2004 | Tsuchiko | ........ | 257/343 |
| 7,692,219 B1 * | 4/2010 | Holm-Kennedy | ........ | 257/253 |
| 7,749,822 B2 * | 7/2010 | Freeman et al. | ........ | 438/155 |
| 2002/0036352 A1 * | 3/2002 | Kim et al. | ........ | 257/774 |
| 2002/0100944 A1 * | 8/2002 | Ishibashi et al. | ........ | 257/391 |
| 2003/0042499 A1 * | 3/2003 | Reiner | ........ | 257/173 |
| 2004/0031990 A1 * | 2/2004 | Jin et al. | ........ | 257/347 |
| 2005/0085081 A1 * | 4/2005 | Liaw | ........ | 438/704 |
| 2005/0275025 A1 * | 12/2005 | Lanzerstorfer | ........ | 257/350 |
| 2006/0267143 A1 * | 11/2006 | Sugimae et al. | ........ | 257/536 |
| 2007/0117327 A1 * | 5/2007 | Lee et al. | ........ | 438/266 |
| 2007/0138592 A1 * | 6/2007 | Chang et al. | ........ | 257/500 |
| 2007/0181953 A1 * | 8/2007 | Lyu et al. | ........ | 257/382 |
| 2008/0003762 A1 * | 1/2008 | Park | ........ | 438/382 |
| 2008/0217720 A1 * | 9/2008 | Fan et al. | ........ | 257/446 |
| 2008/0230834 A1 * | 9/2008 | Akagi et al. | ........ | 257/337 |

FOREIGN PATENT DOCUMENTS

| | | | | |
|---|---|---|---|---|
| JP | 62155548 A | * | 7/1987 | |
| JP | 01286459 A | * | 11/1989 | |
| JP | 7-66283 | | 3/1995 | |

* cited by examiner

*Primary Examiner* — William F Kraig
(74) *Attorney, Agent, or Firm* — Rabin & Berdo, P.C.

(57) ABSTRACT

A semiconductor device according to an aspect of the present invention includes a semiconductor layer, an insulating film formed on the surface of the semiconductor layer, a first insulator embedded in the semiconductor layer with a thickness larger than the thickness of the insulating film, and a resistive element formed on the first insulator. A semiconductor device according to another aspect of the present invention includes a semiconductor layer, an insulating film formed on the surface of the semiconductor layer, a resistive element formed on the insulating film, and a floating region formed on a portion of the semiconductor layer opposed to the resistive element through the insulating film and electrically floating from a periphery thereof.

9 Claims, 72 Drawing Sheets

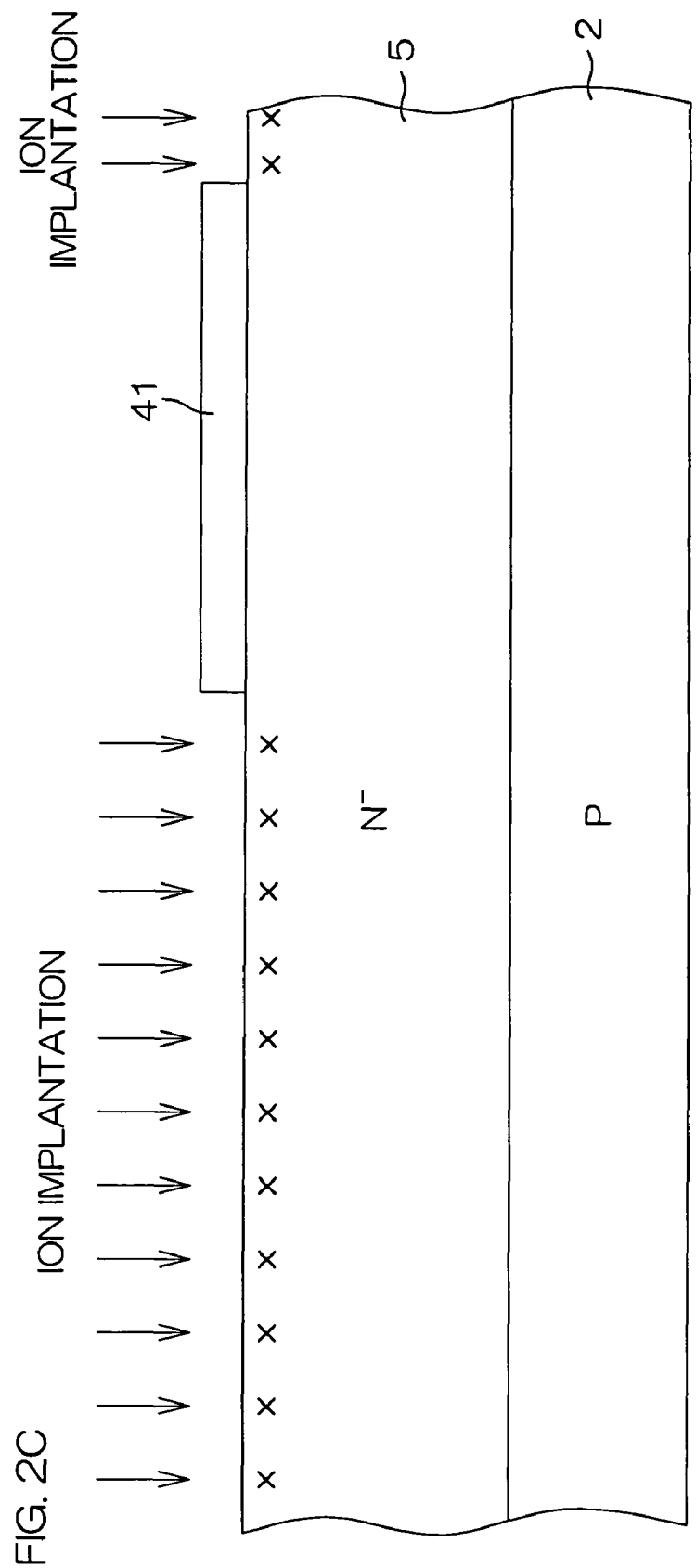

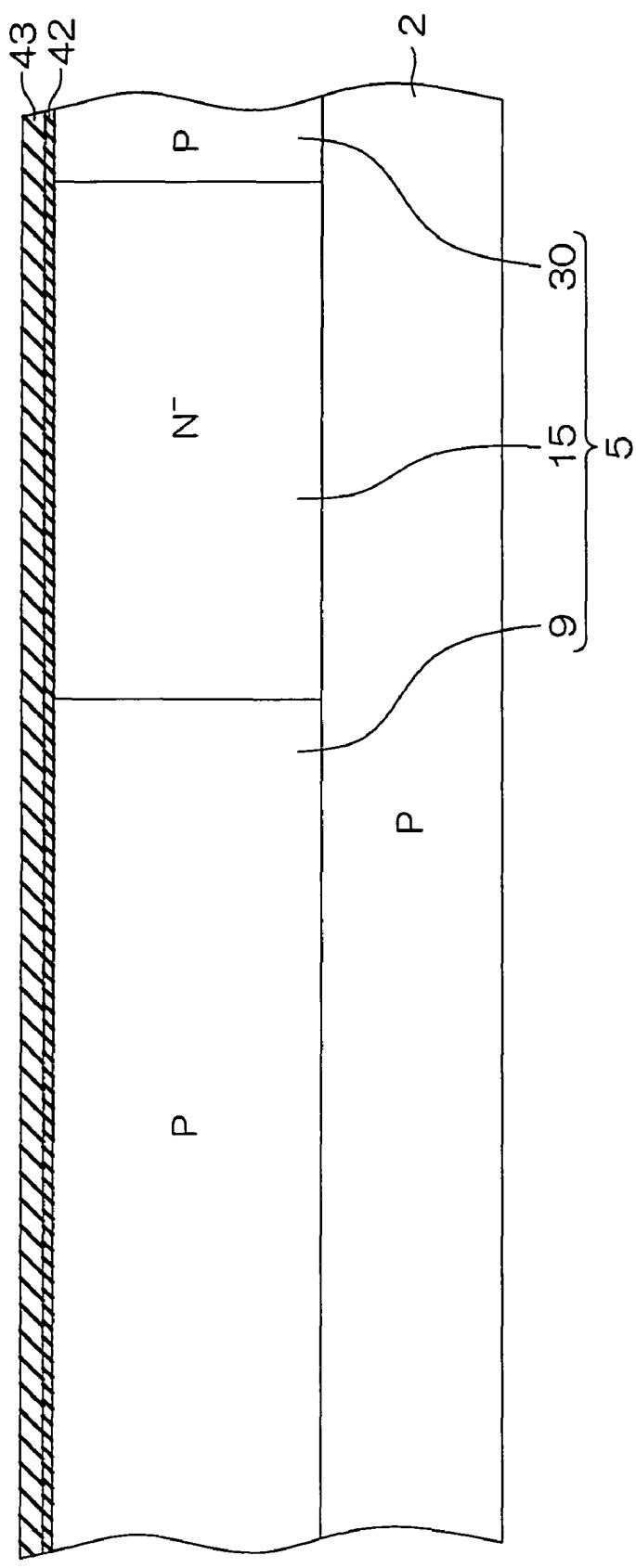

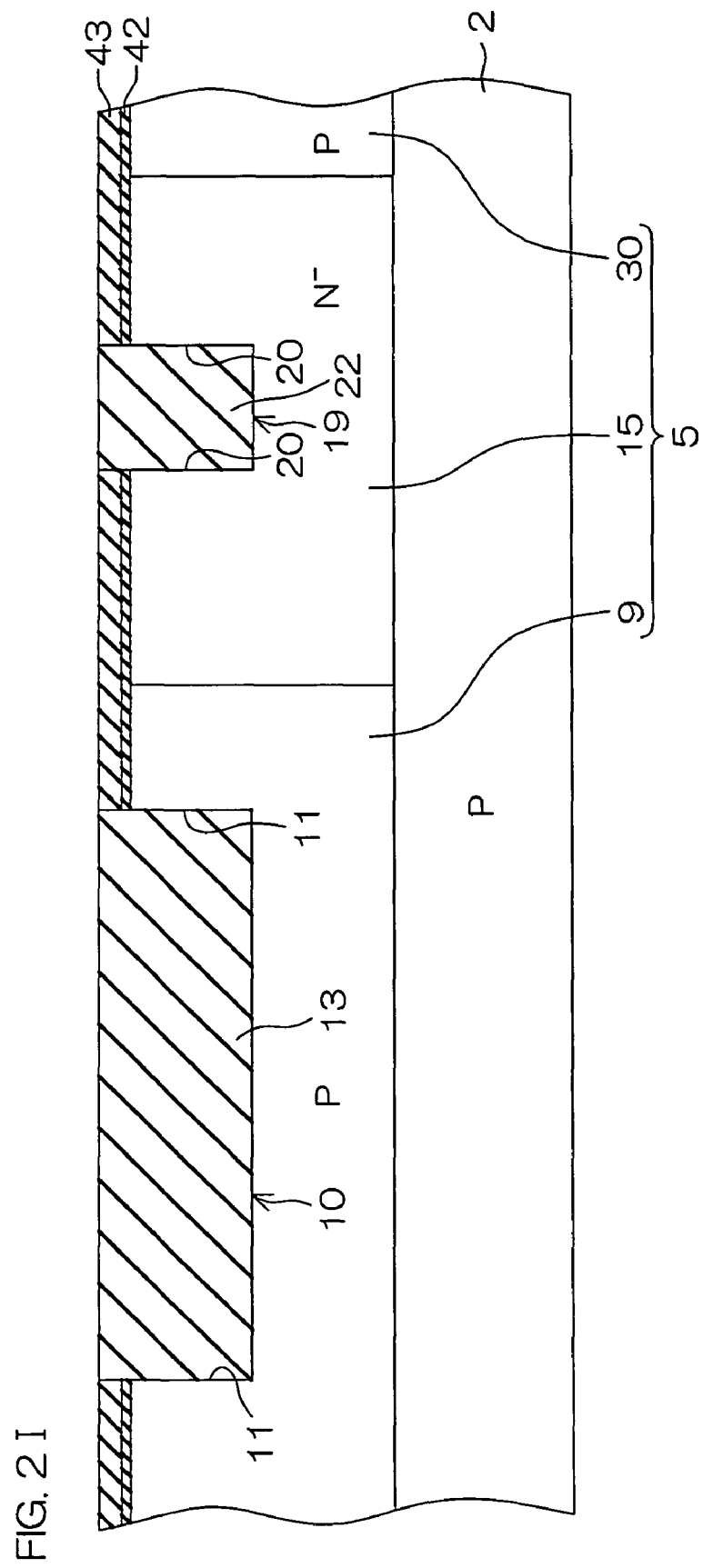

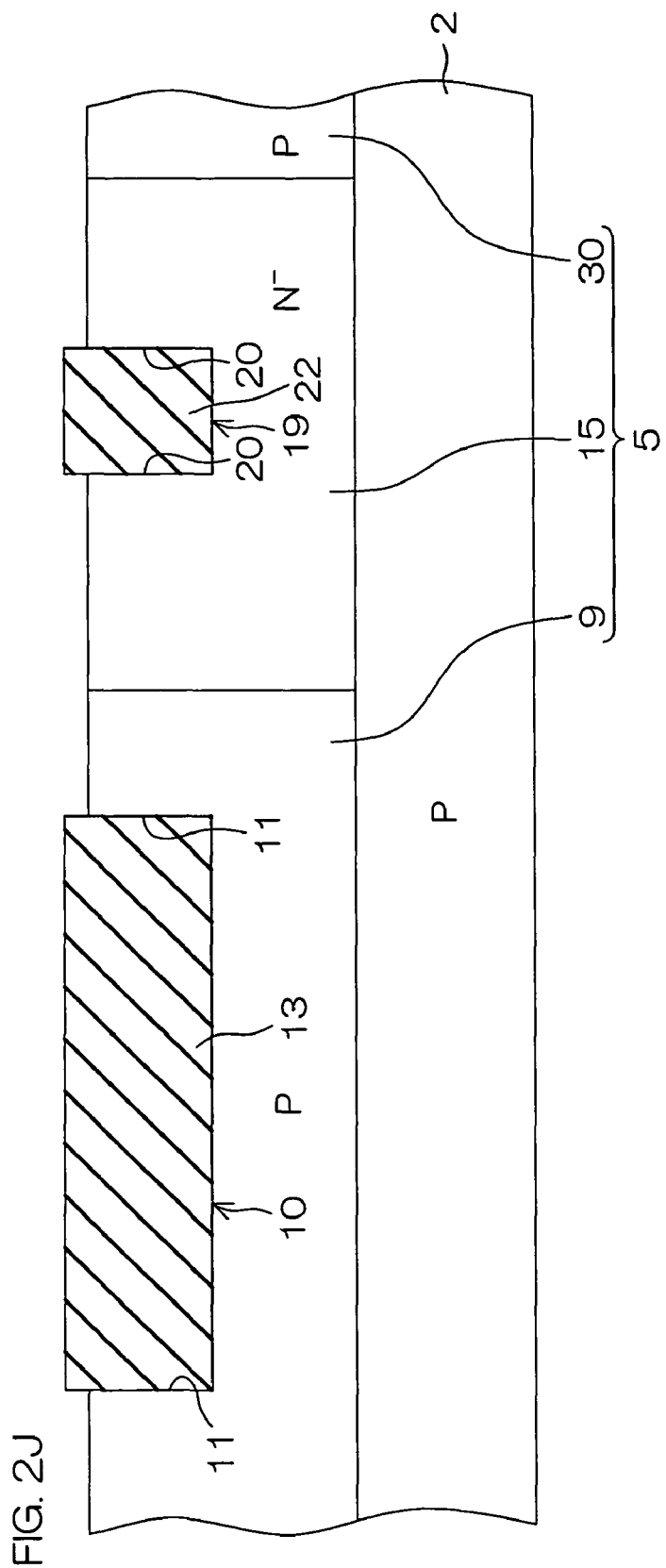

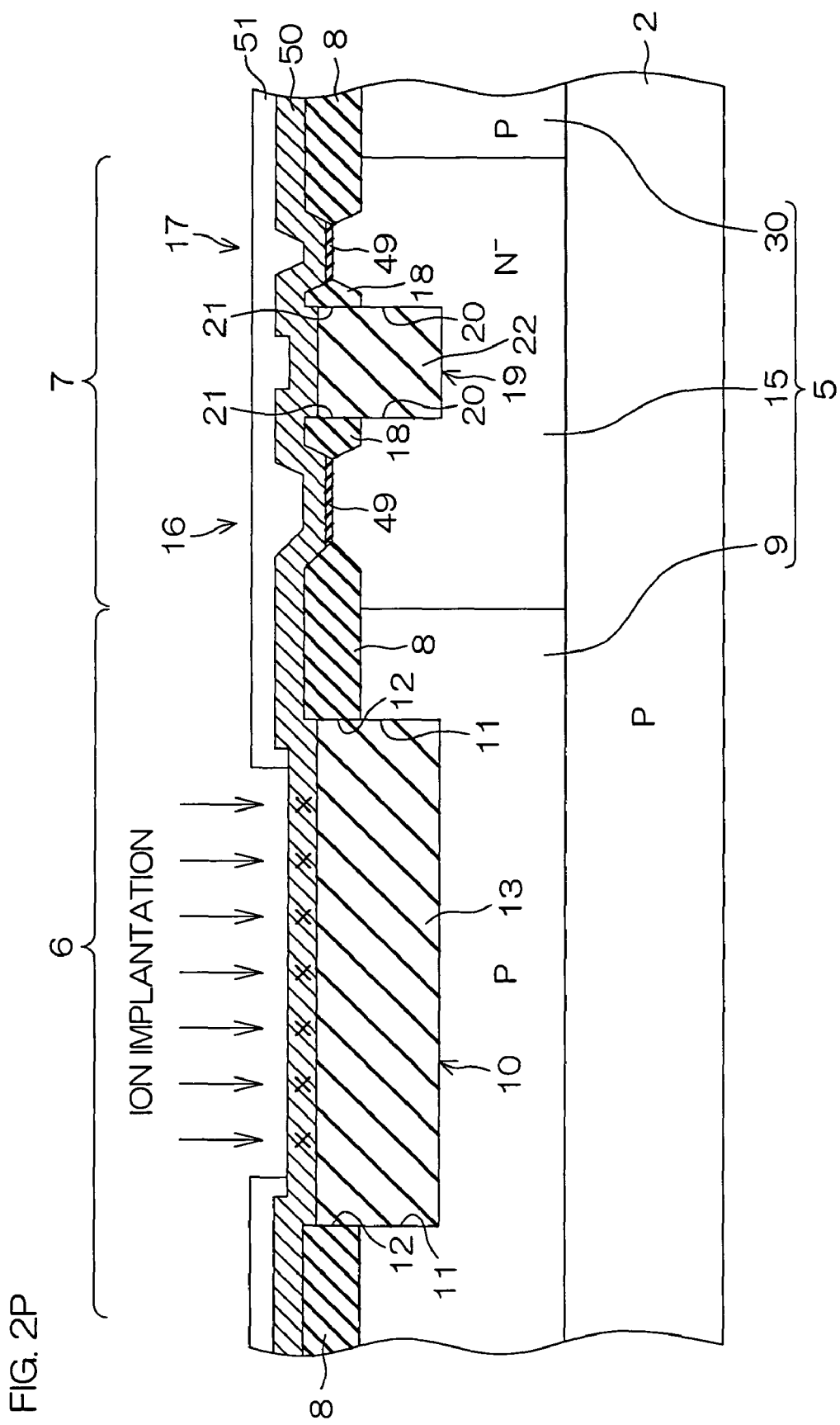

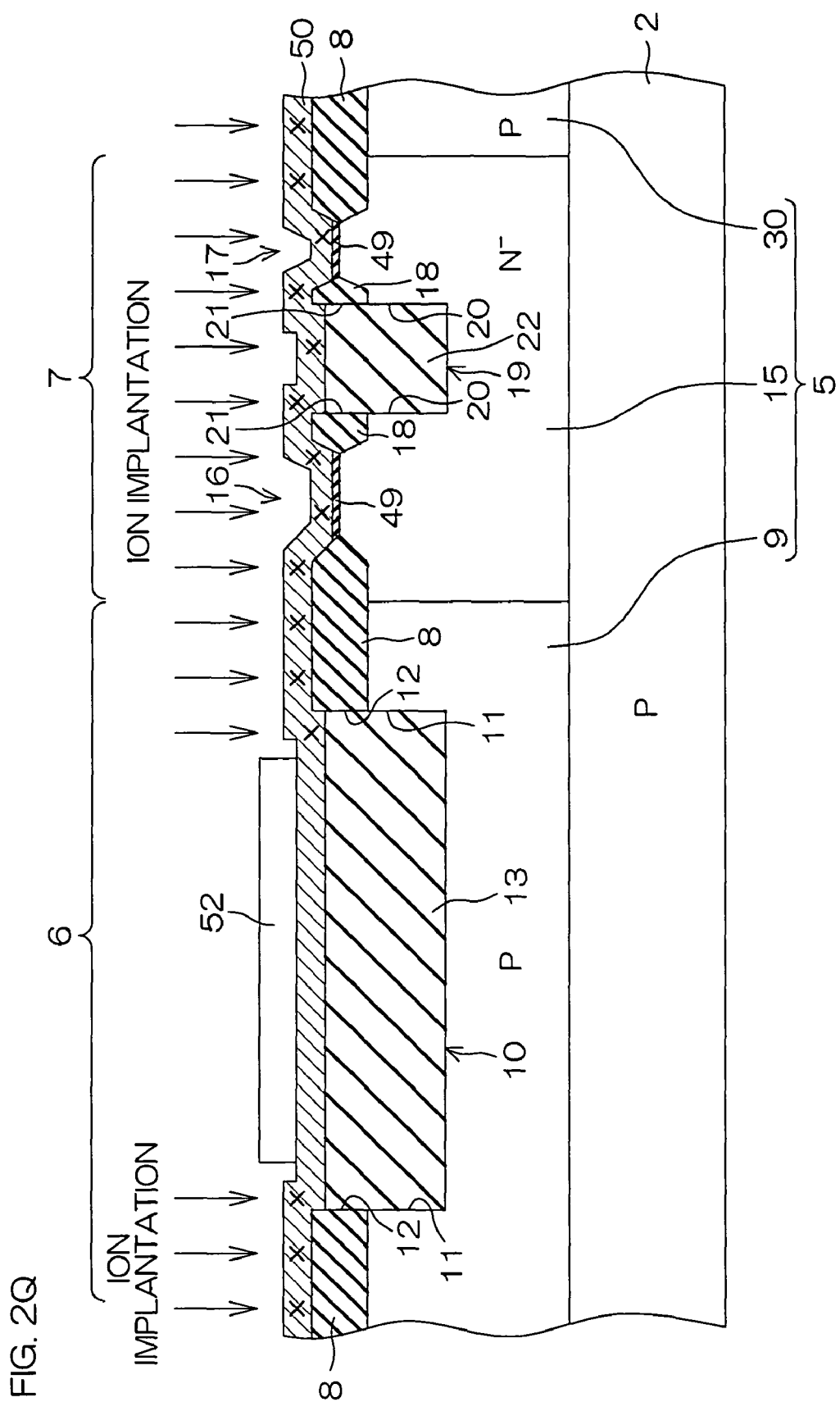

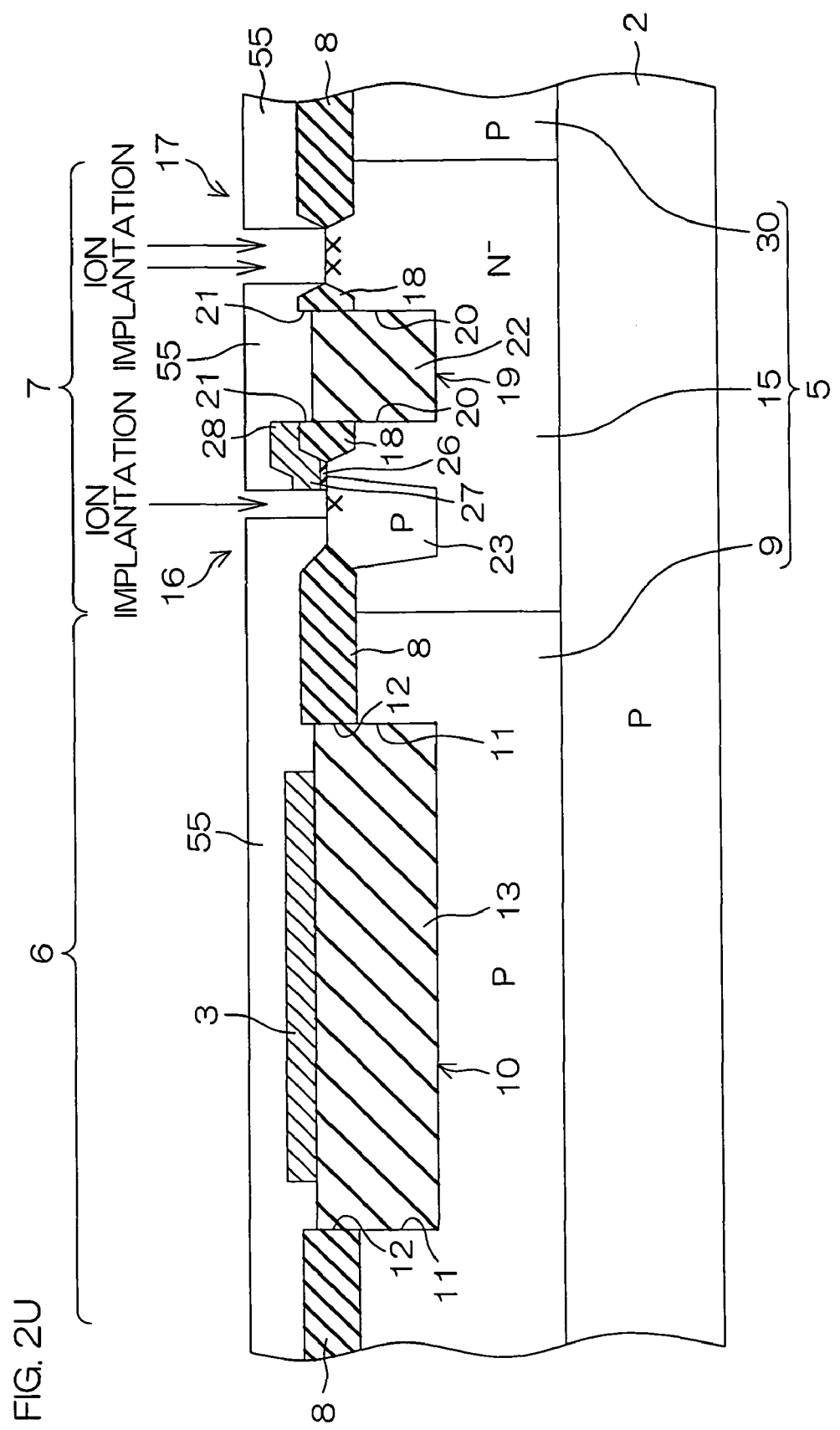

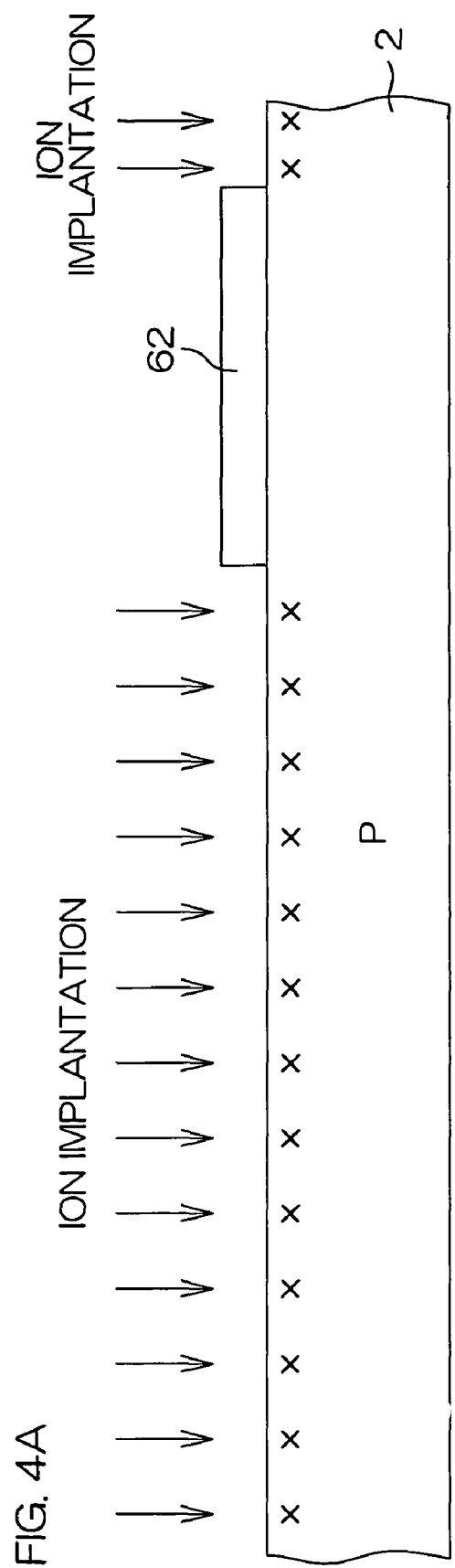

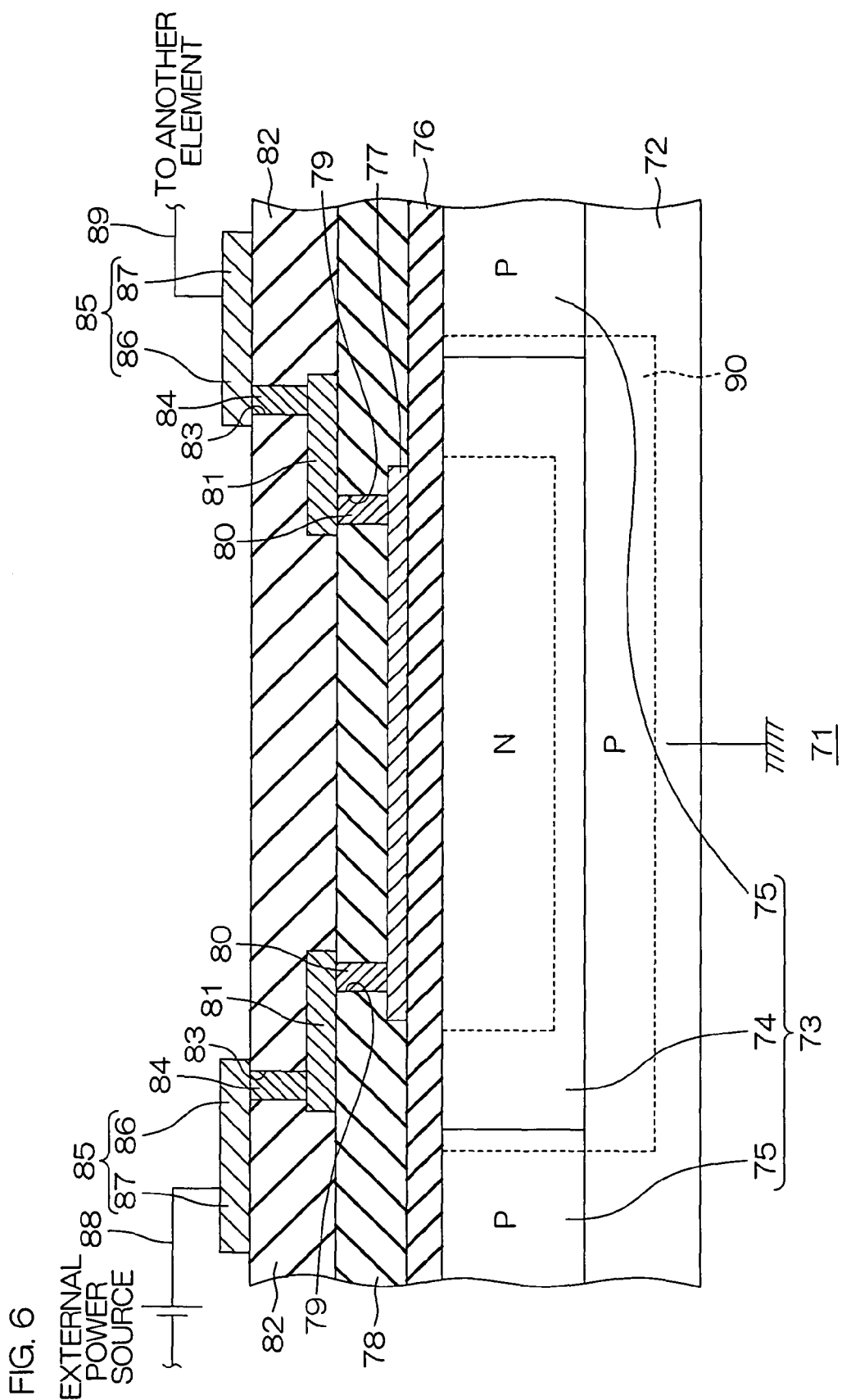

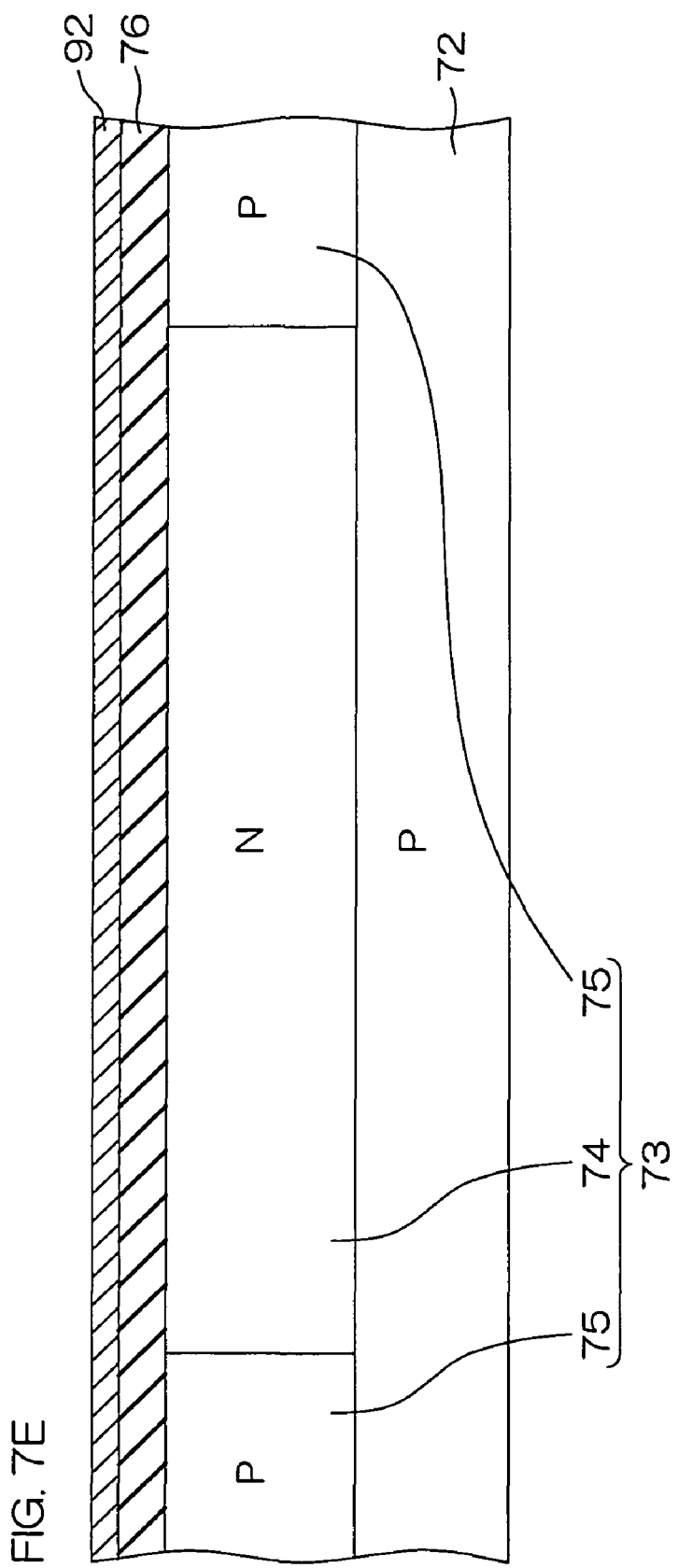

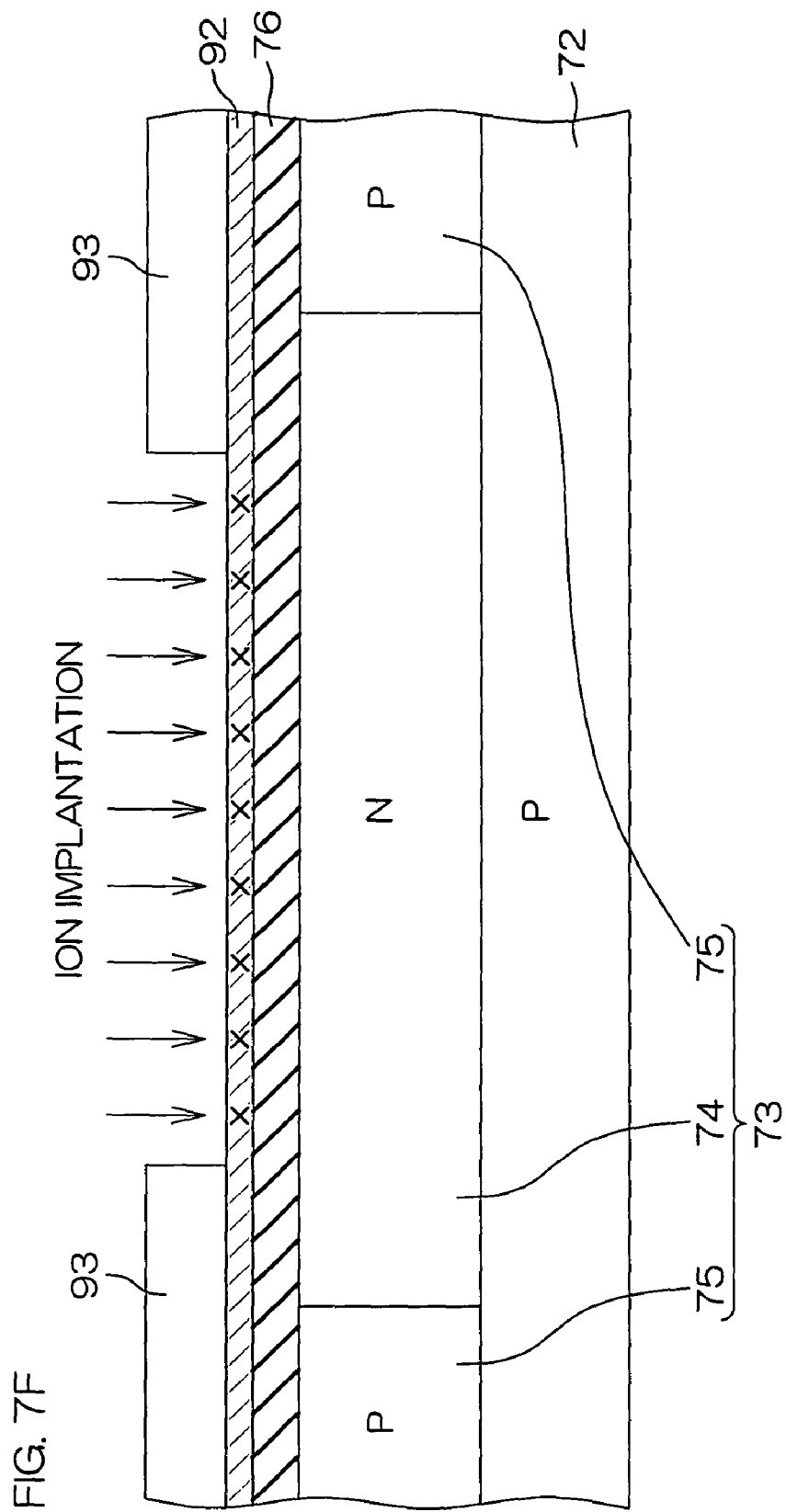

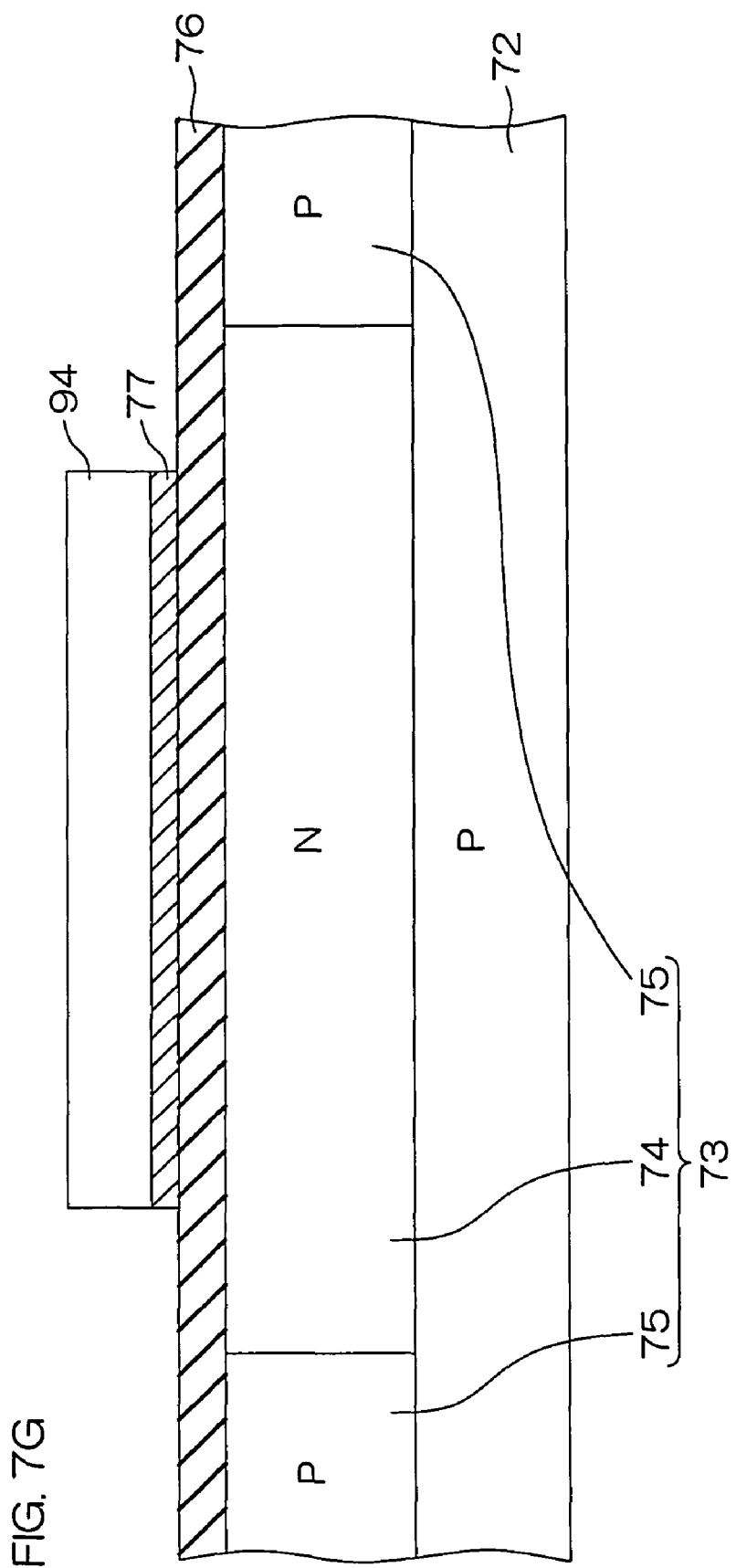

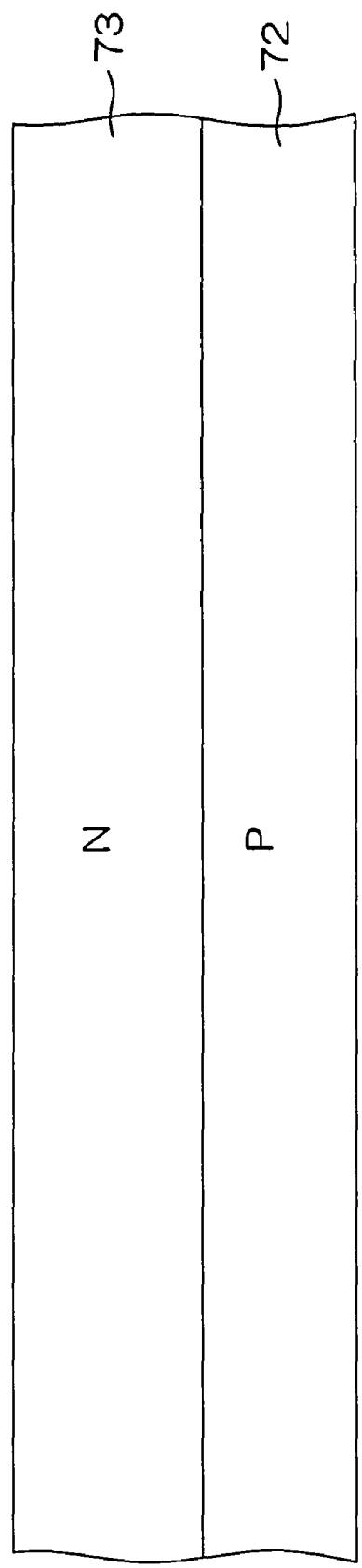

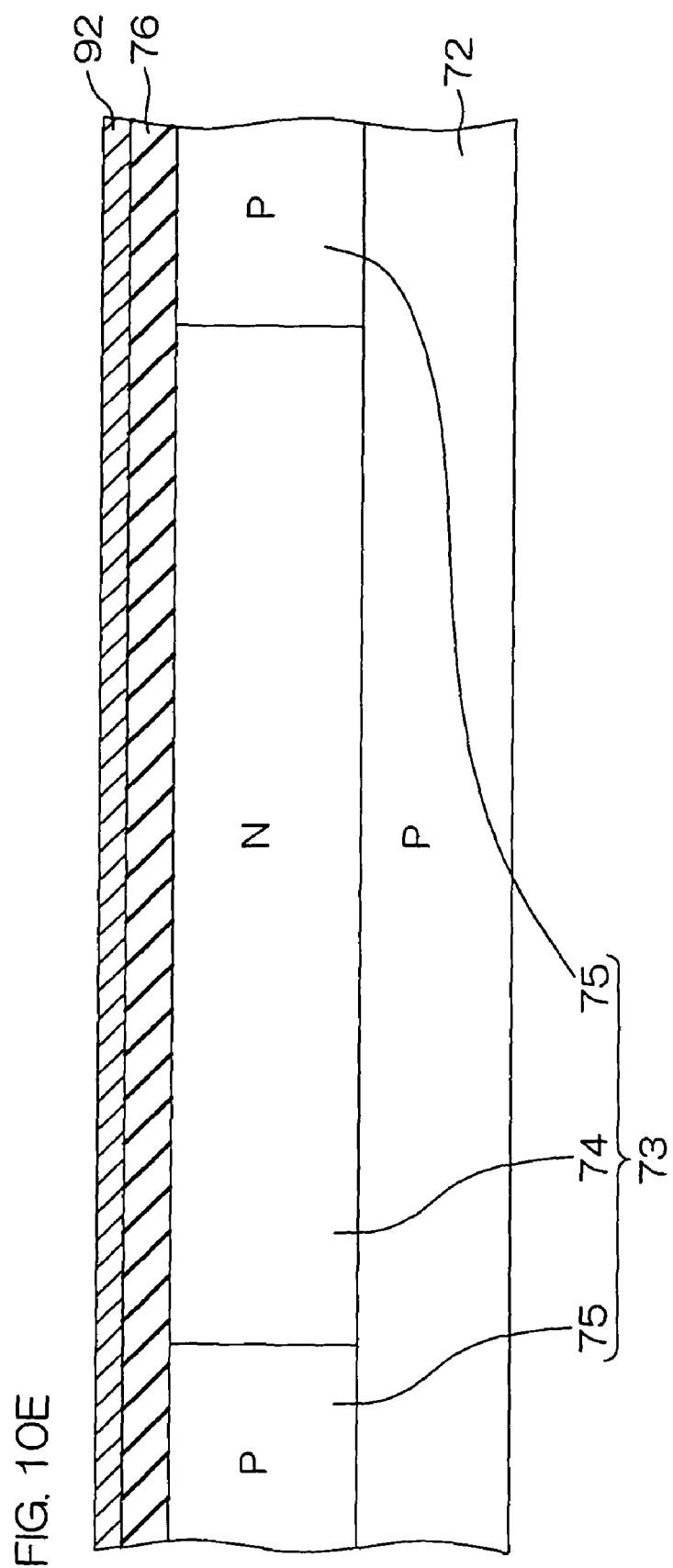

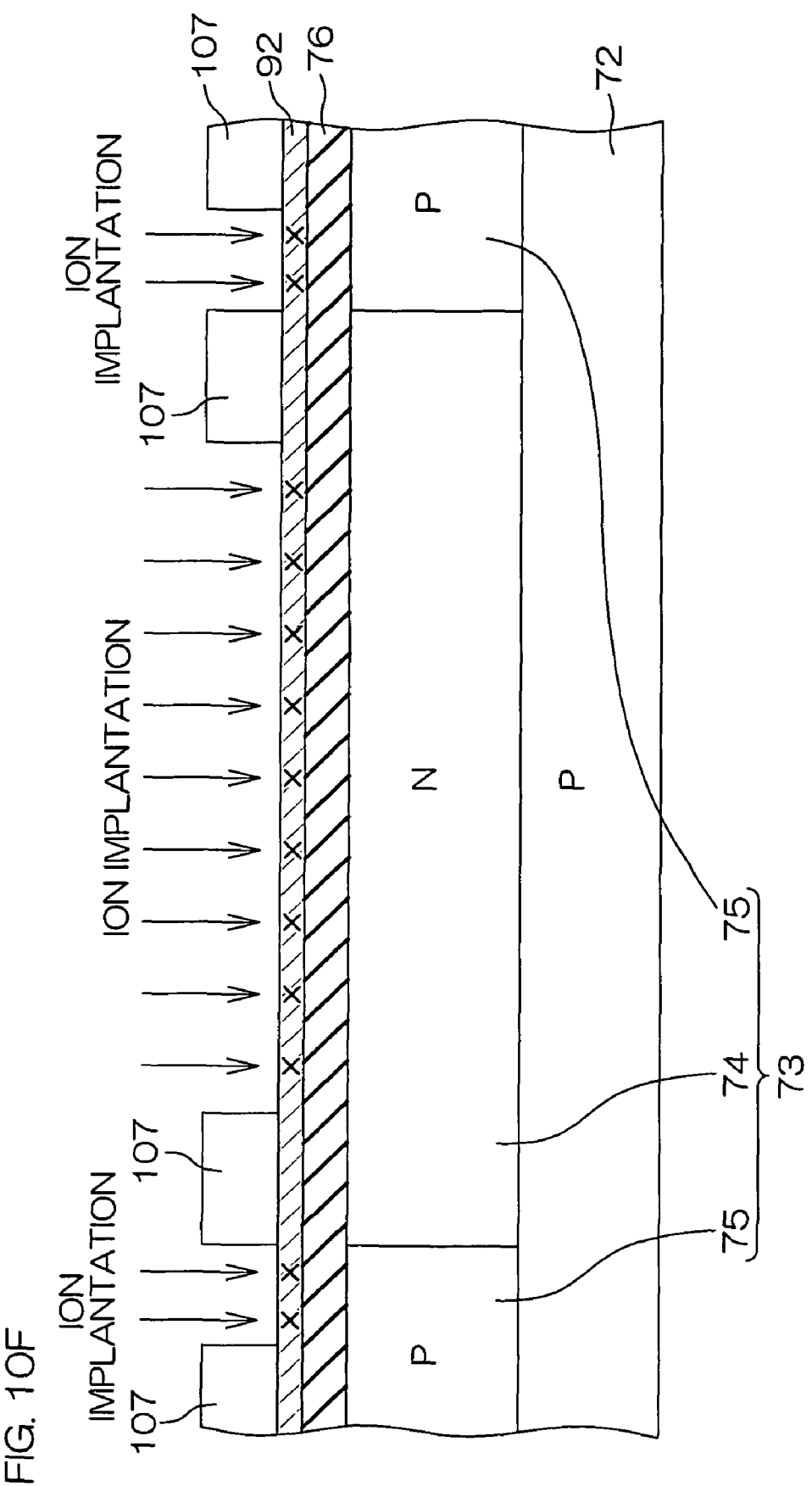

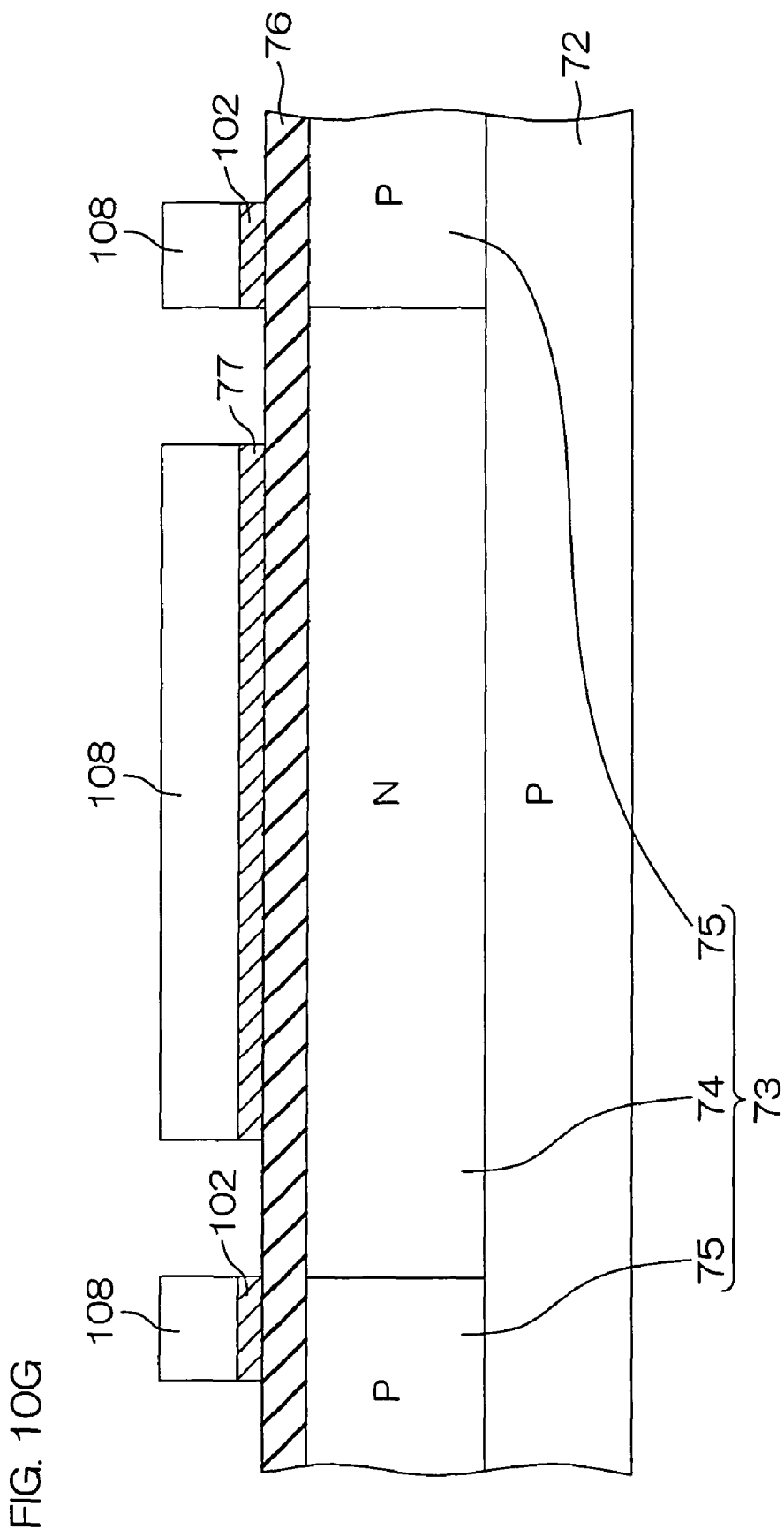

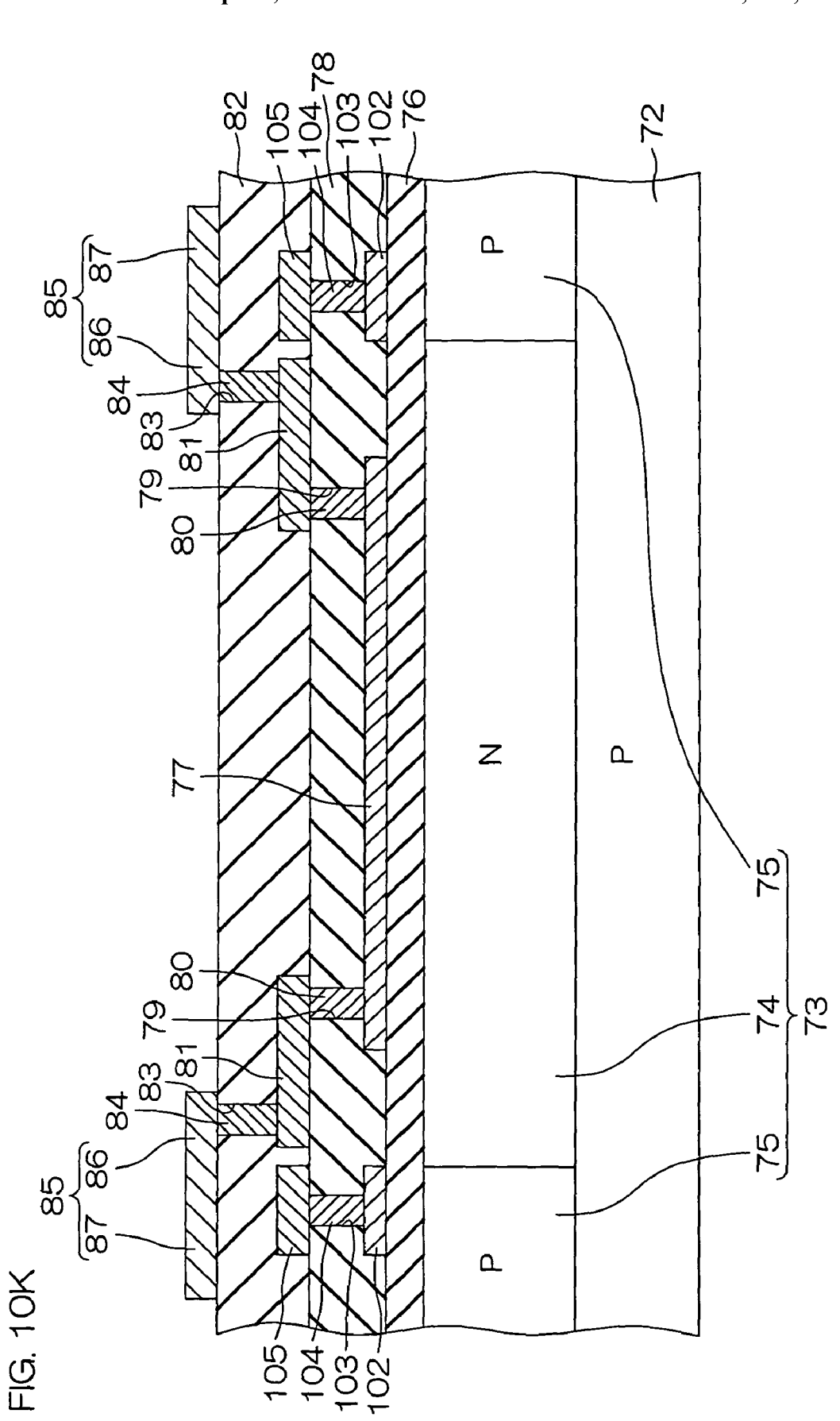

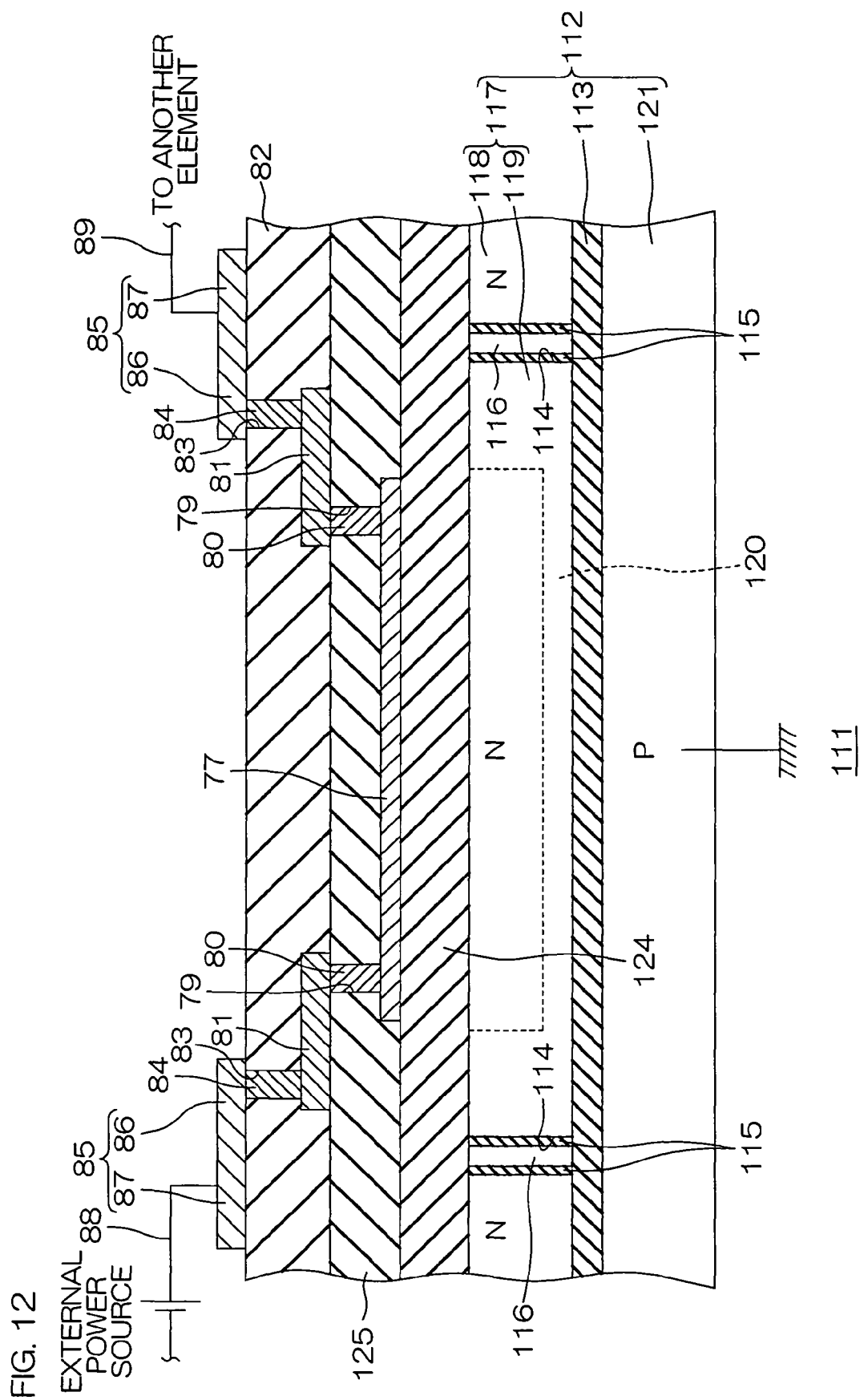

SEMICONDUCTOR DEVICE WITH RESISTIVE ELEMENT

BACKGROUND OF THE INVENTION

1. Field of the Invention

The present invention relates to a semiconductor device and a method for producing the same.

2. Description of Related Art

A high withstand voltage semiconductor device (a power device) to which a high voltage is applied is generally employed in the field of power electronics. The high withstand voltage semiconductor device includes a resistive element made of polysilicon, for example, as a passive element constituting an internal circuit along with active elements.

FIG. 14 is a schematic sectional view of a conventional high withstand voltage semiconductor device.

A semiconductor device 201 includes a P-type substrate 202. An element isolation film 203, made of an insulating material, partitioning an active region is formed on the surface of the P-type substrate 202. In the active region, various active elements (transistors, diodes and the like; not shown) are provided on the surface layer portion of the P-type substrate 202. A resistive element 204 is formed on the element isolation film 203. An interlayer dielectric film 205 is laminated on the P-type substrate 202, and covers the element isolation film 203 and the resistive element 204.

A wire 207 connected to an external power source and a wire 208 connected to another element (an active element) are arranged on the interlayer dielectric film 205 at an interval from each other. The resistive element 204 extends between a position opposed to the wire 207 and a position opposed to the wire 208 on the element isolation film 203. Contact holes 206 are formed between both end portions of the resistive element 204 in the longitudinal direction and the wires 207 and 208 respectively, to pass through the interlayer dielectric film 205 in the thickness direction. The contact holes 206 are filled up with contact plugs 209 made of a conductive material. Thus, the wire 207 is electrically connected to one end portion of the resistive element 204 through the corresponding contact plug 209, and the wire 208 is electrically connected to the other end portion of the resistive element 204 through the corresponding contact plug 209.

SUMMARY OF THE INVENTION

In the semiconductor device 201, a high voltage of several 100 V is applied from the external power source to the resistive element 204 through the wire 207. On the other hand, the P-type substrate 202 is set to the ground potential (0 V). Therefore, a voltage generally identical to the voltage applied to the resistive element 204 is applied to the element isolation film 203 held between the P-type substrate 202 and the resistive element 204. In order to prevent the element isolation film 203 from dielectric breakdown resulting from the applied voltage, the withstand voltage of the semiconductor device 201 must be improved.

While the withstand voltage can be improved by increasing the thickness of the element isolation film 203, the planar size of the element isolation film 203 is also increased if the thickness of the element isolation film 203 is increased. Therefore, the degree of integration of the elements provided on the semiconductor device 201 along with the resistive element 204 is disadvantageously reduced.

An object of the present invention is to provide a semiconductor device improving a withstand voltage against dielectric breakdown of an insulating film formed on a semiconductor layer without increasing the thickness of the insulating film and a method for producing the same.

The foregoing and other objects, features and effects of the present invention will become more apparent from the following detailed description of the embodiments with reference to the attached drawings.

BRIEF DESCRIPTION OF THE DRAWINGS

FIGS. 4A to 4D are schematic sectional views successively showing the steps of a method for producing the semiconductor device shown in FIG. 3.

FIG. 6 is a sectional view taken along a line VI-VI in FIG. 5.

FIGS. 7A to 7K are schematic sectional views successively showing the steps of a method for producing the semiconductor device shown in FIG. 5.

FIG. 12 is a sectional view taken along a line XII-XII in FIG. 11.

DETAILED DESCRIPTION OF PREFERRED EMBODIMENTS

Figure 1:
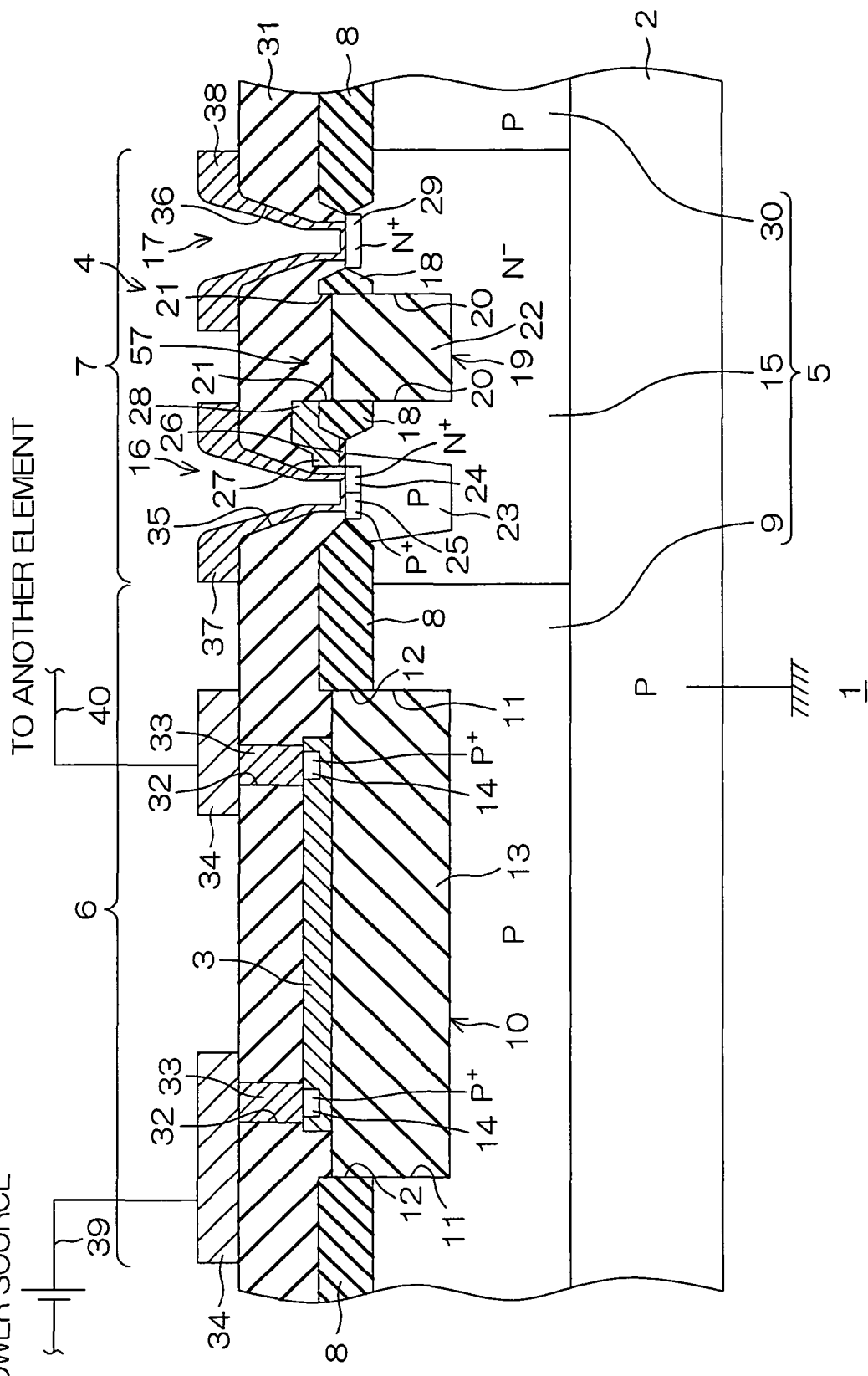
FIG. 1 is a schematic sectional view of a semiconductor device according to a first embodiment of the present invention.

A semiconductor device according to an embodiment of the present invention includes a semiconductor layer, an insulating film formed on the surface of the semiconductor layer, a first insulator embedded in the semiconductor layer with a thickness larger than the thickness of the insulating film, and a resistive element formed on the first insulator.

According to the structure, the insulating film is formed on the surface of the semiconductor layer. The first insulator having the thickness larger than the thickness of the insulating film is embedded in the semiconductor layer. The resistive element is formed on the first insulator. Therefore, at least the first insulator is interposed between the resistive element and the semiconductor layer.

Thus, a voltage applied between the semiconductor layer and the resistive element is dispersed to the first insulator. Therefore, a voltage applied to the insulating film following voltage application to the resistive element can be reduced. Even if a high voltage is applied to the resistive element, the high voltage can be partially dispersed to the first insulator, whereby dielectric breakdown of the insulating film can be suppressed. Consequently, the withstand voltage against dielectric breakdown of the insulating film can be improved without increasing the thickness of the insulating film. Further, the thickness of the insulating film may not be increased, whereby the degree of integration of active elements and other passive elements provided along with the resistive element can also be increased by properly designing the thickness of the insulating film.

The first insulator may be embedded in the semiconductor layer to be in contact with the lower surface of the insulating film. Further, the first insulator may be embedded in the semiconductor layer not to overlap with the insulating film in plan view.

Preferably, the first insulator is formed by digging a trench in the portion of the semiconductor layer opposed to the resistive element downward from the surface thereof and charging an insulating material into the trench.

According to the structure, the first insulator is formed by forming the trench in the semiconductor layer and charging the insulating material into the trench. When an isolation region for partitioning element forming regions from each other is formed on the semiconductor layer by STI (Shallow Trench Isolation), for example, the first insulator can be formed parallelly with the formation of the isolation region. Consequently, no additional step may be separately provided for forming the first insulator, whereby the steps for producing the semiconductor device can be simplified.

Preferably, the semiconductor device further includes a first conductivity type drift region formed in the semiconductor layer so that the surface thereof is selectively exposed from the insulating film, a first conductivity type drain region formed on the surface layer portion of the drift region so that the surface thereof is exposed in a region surrounded by the insulating film, a second conductivity type body region formed on the surface layer portion of the drift region so that the surface thereof is exposed from the insulating film, a first conductivity type source region formed on the surface layer portion of the body region, a gate electrode provided over the surfaces of the drift region and the body region, and a second insulator embedded in the drift region in contact with the insulating film.

According to the structure, the first conductivity type drift region having the surface selectively exposed from the insulating film is formed on the semiconductor layer. The first conductivity type drain region having the surface exposed in the region surrounded by the insulating film and the second conductivity type body region having the surface exposed from the insulating film are formed on the drift region. The first conductivity type source region is formed on the surface layer portion of the body region. The gate electrode is formed over the surfaces of the drift region and the body region. Thus, the semiconductor device includes a DMOSFET (Double diffused Metal Oxide Semiconductor Field-Effect Transistor) having the insulating film, the drift region, the drain region, the body region, the source region and the gate electrode. The DMOSFET includes the second insulator embedded in the drift region in contact with the insulating film.

The second insulator is embedded in the drift region, whereby the length of a portion of the drift region along the interface between the same and the second insulator can be regarded as the effective drift length of the DMOSFET. Therefore, an element pitch of the DMOSFET can be reduced. Consequently, the semiconductor device can be compactified as a whole.

Preferably, the first insulator does not overlap with the insulating film in plan view, but is in contact with the inner end surface of the insulating film on the side surface thereof.

Preferably, the thickness of the insulating film is 0.3 to 0.8 µm, and the thickness of the first insulator is 1.0 to 10 µm.

Preferably, the second insulator is formed by digging a second trench in the drift region downward from the surface thereof and charging an insulating material into the second trench, and the width of the second trench is smaller than the width of the trench charged with the first insulator.

Preferably, the thickness of the second insulator is identical to the thickness of the first insulator.

Preferably, the resistive element is made of polysilicon doped with a second conductivity type impurity, and the gate electrode is made of polysilicon doped with a first conductivity type impurity.

Preferably, the insulating film is a LOCOS oxide film partitioning the semiconductor layer into a resistive element forming region for forming the resistive element and a DMOSFET forming region for forming a DMOSFET including the drift region, the drain region, the body region, the source region and the gate electrode.

Preferably, the semiconductor layer forms a second conductivity type region doped with a second conductivity type impurity in the resistive element forming region, and the drift region is formed adjacently to the second conductivity type region.

A semiconductor device according to another embodiment of the present invention includes a semiconductor layer, an insulating film formed on the surface of the semiconductor layer, a resistive element formed on the insulating film, and a floating region formed on a portion of the semiconductor layer opposed to the resistive element through the insulating film and electrically floating from a periphery thereof.

According to the structure, the insulating film is formed on the surface of the semiconductor layer. The resistive element is formed on the insulating film. The semiconductor layer includes the floating region electrically floating from the periphery thereof on the portion opposed to the resistive element through the insulating film. Therefore, the resistive element is opposed to a depletion layer spreading in the floating region through the insulating film.

Thus, a voltage applied between the semiconductor layer and the resistive element is dispersed to the depletion layer. Therefore, a voltage applied to the insulating film following voltage application to the resistive element can be reduced. Even if a high voltage is applied to the resistive element, the high voltage can be partially dispersed to the depletion layer, whereby dielectric breakdown of the insulating film can be suppressed. Consequently, the withstand voltage against dielectric breakdown of the insulating film can be improved without increasing the thickness of the insulating film. Further, the thickness of the insulating film may not be increased, whereby the degree of integration of active elements and other passive elements provided along with the resistive element can also be increased by properly designing the thickness of the insulating film.

Preferably, the semiconductor device further includes a first conductivity type semiconductor substrate provided under the semiconductor layer, and a first conductivity type isolation region formed on the semiconductor layer in the form of a ring surrounding the floating region, and the floating region has a second conductivity type.

According to the structure, the first conductivity type semiconductor substrate is provided under the semiconductor layer. The first conductivity type isolation region in the form of the ring surrounding the floating region is formed on the semiconductor layer. On the other hand, the floating region has the second conductivity type. Therefore, the floating region electrically floats from the periphery thereof due to the semiconductor substrate provided under the same and the isolation region provided around the same.

In the semiconductor device, a voltage applied between the semiconductor substrate and the resistive element is dispersed to a depletion layer spreading in the floating region, the semiconductor substrate and the isolation region. Even if a high voltage is applied to the resistive element, therefore, dielectric breakdown of the insulating film can be suppressed similarly to the above. Consequently, the withstand voltage against dielectric breakdown of the insulating film can be improved without increasing the thickness of the insulating film. Further, the degree of integration of active elements and other passive elements provided along with the resistive element can also be increased by properly designing the thickness of the insulating film.

Preferably, the semiconductor device further includes a guard ring shaped into a ring corresponding to the isolation region and opposed to the isolation region through the insulating film.

According to the structure, the guard ring shaped into the ring corresponding to the isolation region is opposed to the isolation region through the insulating film.

In a high withstand voltage semiconductor device to which a high voltage is applied, the conductivity type of a semiconductor layer provided under an internal wire is easily reversed when a high voltage is applied to the internal wire, due to an influence exerted by an electric field resulting from the voltage. When the conductivity type of the semiconductor layer is reversed, a leakage current or the like is disadvantageously generated.

When the isolation region and the guard ring are opposed to each other as in the semiconductor device, an influence exerted on the isolation region by an electric field can be reduced due to the guard ring even if a high voltage is applied to the semiconductor device. Consequently, reversal of the conductivity type of the isolation region can be suppressed.

Preferably, the guard ring is formed on the insulating film with the same material as the resistive element.

According to the structure, the guard ring is formed on the insulating film with the same material as the resistive element. In the steps for producing the semiconductor device, therefore, the resistive element and the guard ring can be prepared in the same step. Consequently, no additional step may be separately provided for preparing the guard ring, whereby the steps for producing the semiconductor device can be simplified.

Preferably, the semiconductor device further includes a wire electrically connected with the resistive element and provided over the inside and outside of the floating region in plan view, and a plurality of interlayer dielectric films laminated on the insulating film and interposed between the insulating film and the wire.

According to the structure, the wire is electrically connected to the resistive element. The wire is provided over the inside and outside of the floating region in plan view. On the other hand, the interlayer dielectric films are laminated on the insulating film. The plurality of interlayer dielectric films are interposed between the insulating film and the wire.

The plurality of interlayer dielectric films are interposed between the insulating film and the wire, whereby the distance between the wire and the semiconductor layer can be increased. Consequently, an influence exerted on the semiconductor layer by an electric field can be reduced even if a high voltage is applied to the wire.

Preferably, the semiconductor device further includes an insulating layer provided under the semiconductor layer, a semiconductor substrate provided under the insulating layer, and an annular trench isolation region formed by coating at least the side surface of a trench passing through the semiconductor layer in the thickness direction with an insulating material to surround the floating region of the semiconductor layer.

According to the structure, the insulating layer is provided under the semiconductor layer. The semiconductor substrate is provided under the insulating layer. The annular trench isolation region is formed on the semiconductor layer by coating at least the side surface of the trench passing through the semiconductor layer in the thickness direction with the insulating material to surround the floating region. Therefore, the floating region electrically floats from the periphery thereof due to the insulating layer provided under the same and the trench isolation region provided around the same.

In the semiconductor device, a voltage applied between the semiconductor substrate and the resistive element is dispersed to a depletion layer spreading in the floating region and the insulating layer. Even if a high voltage is applied to the resistive element, therefore, dielectric breakdown of the insulating film can be suppressed similarly to the above. Consequently, the withstand voltage against dielectric breakdown of the insulating film can be improved without increasing the thickness of the insulating film. Further, the degree of integration of active elements and other passive elements provided along with the resistive element can also be increased by properly designing the thickness of the insulating film.

Preferably, the semiconductor device further includes a first interlayer dielectric film laminated on the semiconductor layer, a first wire formed on the first interlayer dielectric film to be inside the floating region in plan view and electrically connected with the resistive element, and a second interlayer dielectric film laminated on the first interlayer dielectric film to cover the first wire, while the wire provided over the inside and outside of the floating region in plan view is a second wire electrically connected with the first wire, and the first interlayer dielectric film and the second interlayer dielectric film are interposed between the insulating film and the second wire.

A method for producing a semiconductor device according to an embodiment of the present invention includes the steps of forming a first conductivity type drift region and a second conductivity type semiconductor region on a substrate adjacently to each other, forming trenches in the drift region and the semiconductor region by digging the drift region and the semiconductor region downward from the surfaces thereof respectively, forming a first insulator and a second insulator in the trench of the semiconductor region and the trench of the drift region respectively by charging an insulating material into the trenches, forming a hard mask on the drift region to selectively cover a first portion and a second portion of the surface thereof, forming an insulating film having a thickness smaller than the thickness of the first insulator by oxidizing the surface of the semiconductor region and a portion of the surface of the drift region exposed from the hard mask, forming a resistive element opposed to the semiconductor region and a gate electrode opposed to a part of the first portion by forming a conductive material film at least on the first insulator and on the surface of the drift region exposed from the insulating film and patterning the conductive material film after removing the hard mask, forming a body region partially opposed to the gate electrode by implanting a second conductivity type impurity from the surface of the first portion into the drift region after the formation of the gate electrode, and forming a source region and a drain region on the surface layer portion of the body region and the surface layer portion of the drift region respectively by selectively implanting a first conductivity type impurity into the surface layer portion of the body region while implanting a first conductivity type impurity from the surface of the second portion into the drift region.

According to the method, the trench is dug in the semiconductor region downward from the surface thereof. The first insulator is formed in the trench of the semiconductor region by charging the insulating material. The insulating film having the thickness smaller than the thickness of the first insulator is formed on the surface of the semiconductor region. The resistive element opposed to the semiconductor region is formed on the first insulator.

On the other hand, the trench is dug in the drift region downward from the surface thereof. The second insulator is formed in the trench of the drift region by charging the insulating material. The insulating film is formed on the surface of the drift region to expose the first portion and the second portion of the surface. The gate electrode is formed to be opposed to the part of the first portion exposed from the insulating film. After the formation of the gate electrode, the body region partially opposed to the gate electrode is formed on the first portion. The source region is formed on the surface layer portion of the body region by selectively implanting the first conductivity type impurity. On the other hand, the drain region is formed on the surface layer portion of the second portion of the drift region by implanting the first conductivity type impurity.

Thus, the semiconductor device including the resistive element formed on the semiconductor region and a DMOSFET formed on the drift region is obtained.

In the semiconductor device, at least the first insulator is interposed between the resistive element and the semiconductor region. Therefore, a voltage applied to the insulating film following voltage application to the resistive element can be reduced. Even if a high voltage is applied to the resistive element, the high voltage can be partially dispersed to the first insulator, whereby dielectric breakdown of the insulating film can be suppressed. Consequently, the withstand voltage against dielectric breakdown of the insulating film can be improved without increasing the thickness of the insulating film.

On the other hand, the second insulator is embedded in the drift region in the DMOSFET, whereby the length of a portion of the drift region along the interface between the same and the second insulator can be regarded as the effective drift length of the DMOSFET. Therefore, an element pitch of the DMOSFET can be reduced.

The trenches are formed in the semiconductor region and the drift region through the same step. Further, the first insulator and the second insulator are formed in the trenches through the same step. The trenches can be formed through a single step and the insulators can be embedded through a single step, whereby the number of the steps for producing the semiconductor device can be reduced. Consequently, the production efficiency for the semiconductor device can be improved.

As a result, a semiconductor device excellent in withstand voltage and compact as a whole can be efficiently produced according to the method.

Embodiments of the present invention are now described in more detail with reference to the attached drawings.

FIG. 1 is a schematic sectional view of a semiconductor device according to a first embodiment of the present invention.

A semiconductor device 1 is a high withstand voltage semiconductor device including a resistive element 3 and an LDMOSFET 4 on a semiconductor substrate 2 made of silicon, along with other elements (active elements and passive elements), for example, provided thereon.

An $N^-$-type epitaxial layer 5 made of silicon is laminated on the semiconductor substrate 2.

A LOCOS oxide film 8 partitioning the epitaxial layer 5 into a resistive element forming region 6 for forming the resistive element 3 and an LDMOSFET forming region 7 for forming the LDMOSFET 4 is formed on the surface of the epitaxial layer 5 as a semiconductor layer. The LOCOS oxide film 8 as an insulating film exposes the resistive element forming region 6 and the LDMOSFET forming region 7 surrounded by the LOCOS oxide film 8 in plan view as active regions respectively. The thickness of the LOCOS oxide film 8 is 0.3 to 0.8 μm, for example.

The resistive element 3 is formed in the resistive element forming region 6. In the resistive element forming region 6, the epitaxial layer 5 forms a P-type region 9 doped with a P-type impurity. The P-type impurity concentration in the P-type region 9 is $10^{15}$ to $10^{18}$ $cm^{-3}$, for example.

A first trench 10 is dug in the P-type region 9 as a semiconductor region downward from the surface thereof. The first trench 10 is so formed that a pair of side surfaces 11 opposed to each other in the right-and-left direction in FIG. 1 are generally flush with inner end surfaces 12 of the LOCOS oxide film 8 forming the outer periphery of the resistive element forming region 6. The depth of the first trench 10 is slightly larger than the thickness of the LOCOS oxide film 8, for example, and 1.0 to 10 μm, for example. The width of the first trench 10 is 10 to 100 μm, for example.

A first insulator 13 is embedded in the first trench 10 by charging an insulating material (silicon oxide, for example). The first insulator 13 fills up the first trench 10, and the surface thereof reaches an intermediate portion of the LOCOS oxide film 8 in the thickness direction. Therefore, the first insulator 13 does not overlap with the LOCOS oxide film 8 in plan view, but is in contact with the inner end surfaces 12 of the LOCOS oxide film 8 on the side surfaces thereof. The thickness of the first insulator 13 is larger than the thickness of the LOCOS oxide film 8, and 1.0 to 10 μm, for example.

The resistive element 3 is formed on the first insulator 13, and extends in the right-and-left direction in FIG. 1. The resistive element 3 is made of polysilicon doped with a P-type impurity, and partially forms an internal circuit of the semiconductor device 1. On the surface layer portion of the resistive element 3, $P^+$-type contact regions 14 having a P-type impurity concentration ($10^{19}$ to $10^{20}$ $cm^{-3}$, for example) higher than that in the P-type region 9 are formed on both end portions of the resistive element 3 in the longitudinal direction (the direction where the resistive element 3 extends).

An interlayer dielectric film 31 made of silicon oxide covering the overall element forming regions is laminated on the epitaxial layer 5.

In the interlayer dielectric film 31, two contact holes 32 passing through the interlayer dielectric film 31 in the thickness direction are formed in the resistive element forming region 6. The contact holes 32 are provided on portions opposed to both end portions of the resistive element 3 in the longitudinal direction (the right-and-left direction in FIG. 1) respectively.

Contact plugs 33 made of a conductive material are embedded in the contact holes 32. The contact plugs 33 are in contact with the resistive element 3 on the contact regions 14 of the resistive element 3. Thus, the contact plugs 33 are electrically connected to the resistive element 3.

On the interlayer dielectric film 31, a pair of wires 34 are formed in the resistive element forming region 6. The wires 34 are patterned to cover the contact plugs 33. Thus, the wires 34 are electrically connected to the contact plugs 33. One of the wires 34 is electrically connected to an external power source through a wire 39, while the other wire 34 is electrically connected to another element (an active element) through a wire 40.

The LDMOSFET 4 is formed in the LDMOSFET forming region 7. In the LDMOSFET forming region 7, the epitaxial layer 5 forms an N⁻-type drift region 15 kept in a state after epitaxy. The drift region 15 is formed adjacently to the P-type region 9 of the resistive element forming region 6. The N-type impurity concentration in the drift region 15 is $10^{14}$ to $10^{16}$ cm$^{-3}$, for example.

LOCOS oxide films 18 separating the LDMOSFET forming region 7 into a first forming region 16 provided with a source region 24 (described later) and a second forming region 17 provided with a drain region 29 (described later) are formed on the surface of the drift region 15. The LOCOS oxide films 18 extend in a direction orthogonal to the plane of FIG. 1, and both ends thereof are connected to the LOCOS oxide film 8 so that the LOCOS oxide films 18 are formed integrally with the LOCOS oxide film 8. The LOCOS oxide films 18 are paired with each other at an interval. Thus, a closed region 57 surrounded by the LOCOS oxide films 18 and 8 is formed between the pair of LOCOS oxide films 18.

In the closed region 57, a second trench 19 is dug in the drift region 15 downward from the surface thereof. The second trench 19 is so formed that a pair of side surfaces 20 opposed to each other in the right-and-left direction in FIG. 1 are generally flush with inner end surfaces 21 of the LOCOS oxide films 18 forming the outer periphery of the closed region 57. The depth (1.0 to 10 μm, for example) of the second trench 19 is generally identical to the depth of the first trench 10 of the resistive element forming region 6, for example. The width of the second trench 19 is smaller than the width of the first trench 10 of the resistive element forming region 6, and 1.0 to 60 μm, for example.

A second insulator 22 is embedded in the second trench 19 by charging an insulating material (silicon oxide, for example). The second insulator 22 fills up the second trench 19, and the surface thereof reaches intermediate portions of the LOCOS oxide films 18 in the thickness direction. Therefore, the second insulator 22 does not overlap with the LOCOS oxide films 18 in plan view, but is in contact with the inner end surfaces 21 of the LOCOS oxide films 18 on the side surfaces thereof. The thickness (1.0 to 10 μm, for example) of the second insulator 22 is generally identical to the thickness of the first insulator 13, for example.

In the first forming region 16, a P-type body region 23 is formed on the surface layer portion of the drift region 15. An end portion of the body region 23 closer to the corresponding LOCOS oxide film 18 is at an interval from the LOCOS oxide film 18. In the first forming region 16, therefore, the drift region 15 is partially exposed between the body region 23 and the LOCOS oxide film 18. The depth of the body region 23 is 1.0 to 10 μm, for example.

A P⁺-type body contact region 25 is formed on the surface layer portion of the body region 23. The body contact region 25 is positioned on a side of the body region 23 closer to the LOCOS oxide film 8, and in contact with the LOCOS oxide film 8.

On the surface layer portion of the body region 23, an N⁺-type source region 24 having an N-type impurity concentration ($10^{19}$ to $10^{20}$ cm$^{-3}$, for example) higher than that of the drift region 15 is formed adjacently to the body contact region 25. The source region 24 is positioned at an interval from the boundary between the body region 23 and the drift region 15. In the first forming region 16, therefore, the body region 23 is partially exposed between the source region 24 and the drift region 15.

A gate oxide film 26 is formed over the surface of the exposed portion of the body region 23 and the surface of the drift region 15.

A gate electrode 27 is formed on the gate oxide film 26. The gate electrode 27 is opposed to the drift region 15 and the body region 23 through the gate oxide film 26. On the LOCOS oxide film 18, a field plate 28 is formed integrally with the gate electrode 27.

In the second forming region 17, an N⁺-type drain region 29 is formed entirely over the surface layer portion of the drift region 15.

The LDMOSFET forming region 7 is also covered with the interlayer dielectric film 31, similarly to the resistive element forming region 6.

In the interlayer dielectric film 31, a source contact hole 35 is penetratingly formed in a portion opposed to the source region 24 and the body contact region 25 in the LDMOSFET forming region 7. In the interlayer dielectric film 31, further, a drain contact hole 36 is penetratingly formed in a portion opposed to the drain region 29.

On the interlayer dielectric film 31, a source wire 37 and a drain wire 38 are formed in the LDMOSFET forming region 7. The source wire 37 is electrically connected to the source region 24 and the body contact region 25 through the source contact hole 35. The drain wire 38 is electrically connected to the drain region 29 through the drain contact hole 36.

The epitaxial layer 5 also has other element forming regions partitioned by the LOCOS oxide film 8, in addition to the resistive element forming region 6 and the LDMOSFET forming region 7. FIG. 1 shows an element forming region adjacent to the LDMOSFET forming region 7, and the epitaxial layer 5 forms a P-type region 30 doped with a P-type impurity in the element forming region.

In the semiconductor device 1, a high voltage of several 100 V is applied to the resistive element 3 from the external power source through the wire 39. On the other hand, the semiconductor substrate 2 is set to the ground potential (0 V).

In the semiconductor device 1, the LOCOS oxide film 8 is formed on the epitaxial layer 5. In the resistive element forming region 6, the first trench 10 is formed in the epitaxial layer 5 (the P-type region 9). The first insulator 13 is embedded in the first trench 10. The first insulator 13 fills up the first trench 10, and is in contact with the inner end surfaces 12 of the LOCOS oxide film 8 on the side surfaces thereof. The resistive element 3 is formed on the first insulator 13. Therefore, the first insulator 13 is interposed between the resistive element 3 and the epitaxial layer 5.

Thus, a voltage applied between the semiconductor substrate 2 and the resistive element 3 is dispersed to the first insulator 13. Therefore, a voltage applied to the LOCOS oxide film 8 following the voltage application to the resistive element 3 can be reduced. Even if a high voltage is applied to the resistive element 3, the high voltage can be dispersed to the first insulator 13, whereby dielectric breakdown of the LOCOS oxide film 8 can be suppressed. Consequently, the withstand voltage against dielectric breakdown of the LOCOS oxide film 8 can be improved without increasing the thickness of the LOCOS oxide film 8. Further, the thickness of the LOCOS oxide film 8 may not be increased, whereby the degree of integration of the active elements and other passive elements provided along with the resistive element 3 can also be increased by properly designing the thickness of the LOCOS oxide film 8.

In the LDMOSFET forming region 7, the pair of LOCOS oxide films 18 separating the first forming region 16 and the second forming region 17 from each other are formed on the surface of the epitaxial layer 5 (the drift region 15). In the closed region 57 between the pair of LOCOS oxide films 18, further, the second trench 19 is formed in the epitaxial layer 5 (the drift region 15). The second insulator 22 is embedded in the second trench 19. The second insulator 22 fills up the second trench 19, and is in contact with the inner end surfaces 21 of the LOCOS oxide films 18 on the side surfaces thereof.

Thus, the peripheral length of the second trench 19 (i.e., the length obtained by adding up the depth and the width of the second trench 19) can be regarded as the effective drift length of the LDMOSFET 4 allowing the source region 24 and the drain region 29 to conduct. Therefore, an element pitch of the LDMOSFET 4 can be reduced. Consequently, the semiconductor device 1 can be compactified as a whole.

Further, the first insulator 13 and the second insulator 22 are formed by forming the trenches (the first trench 10 and the second trench 19) in the epitaxial layer 5 and charging the insulating material into the trenches. Therefore, when an isolation region for partitioning the element forming regions from each other is formed on the epitaxial layer 5 by STI (Shallow Trench Isolation), for example, the first insulator 13 and the second insulator 22 can be formed parallelly with the formation of the isolation region. Consequently, no additional steps may be separately provided for forming the first insulator 13 and the second insulator 22, whereby the steps for producing the semiconductor device 1 can be simplified.

Figure 2A:
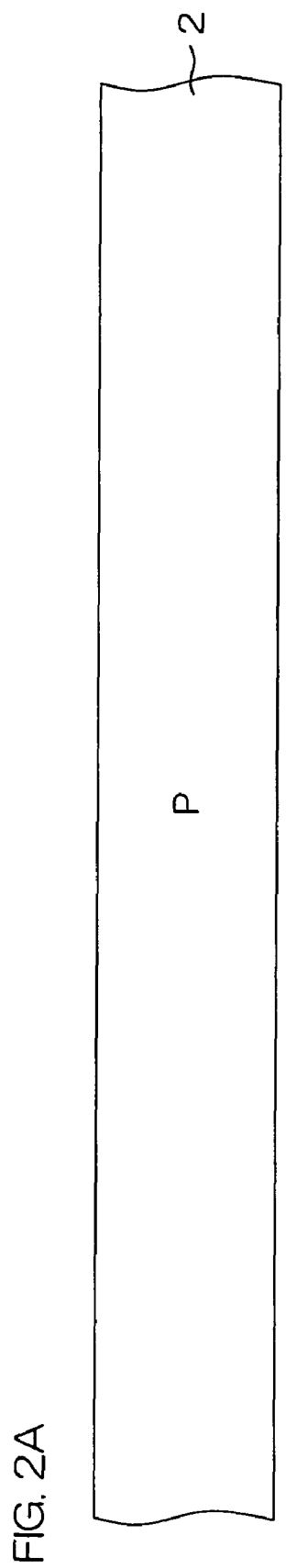
FIGS. 2A to 2Z are schematic sectional views successively showing the steps of a method for producing the semiconductor device shown in FIG. 1.
Figure 2B:
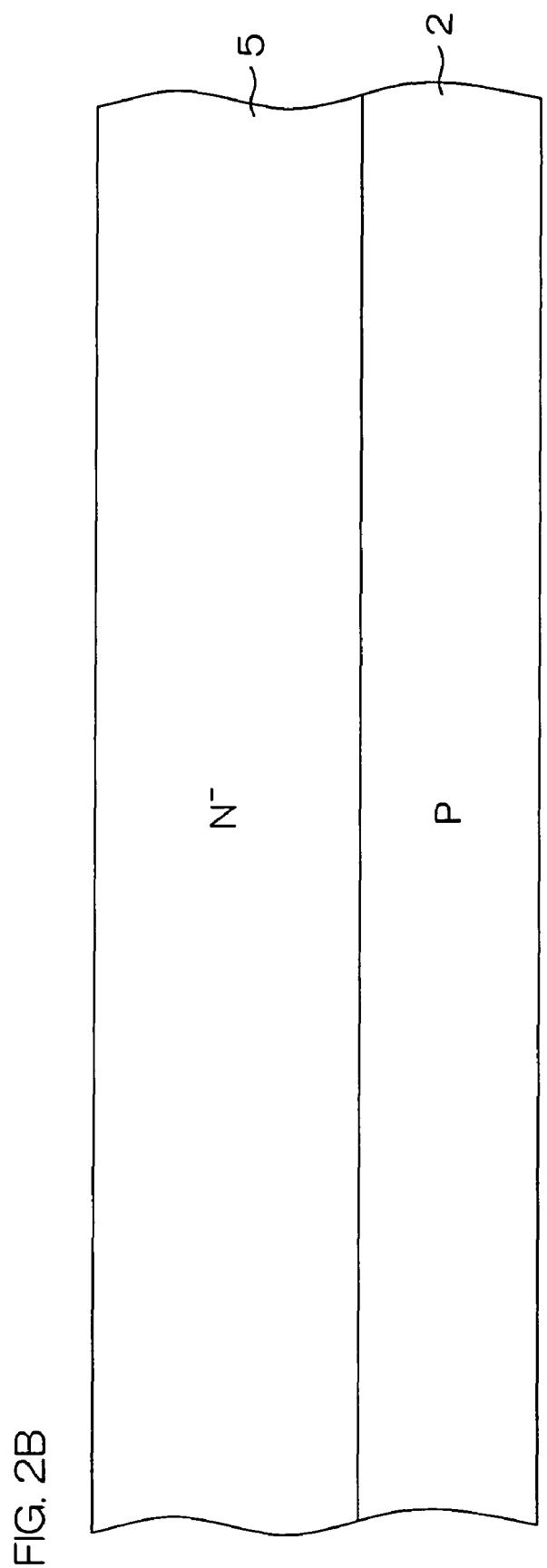
Figure 2D:
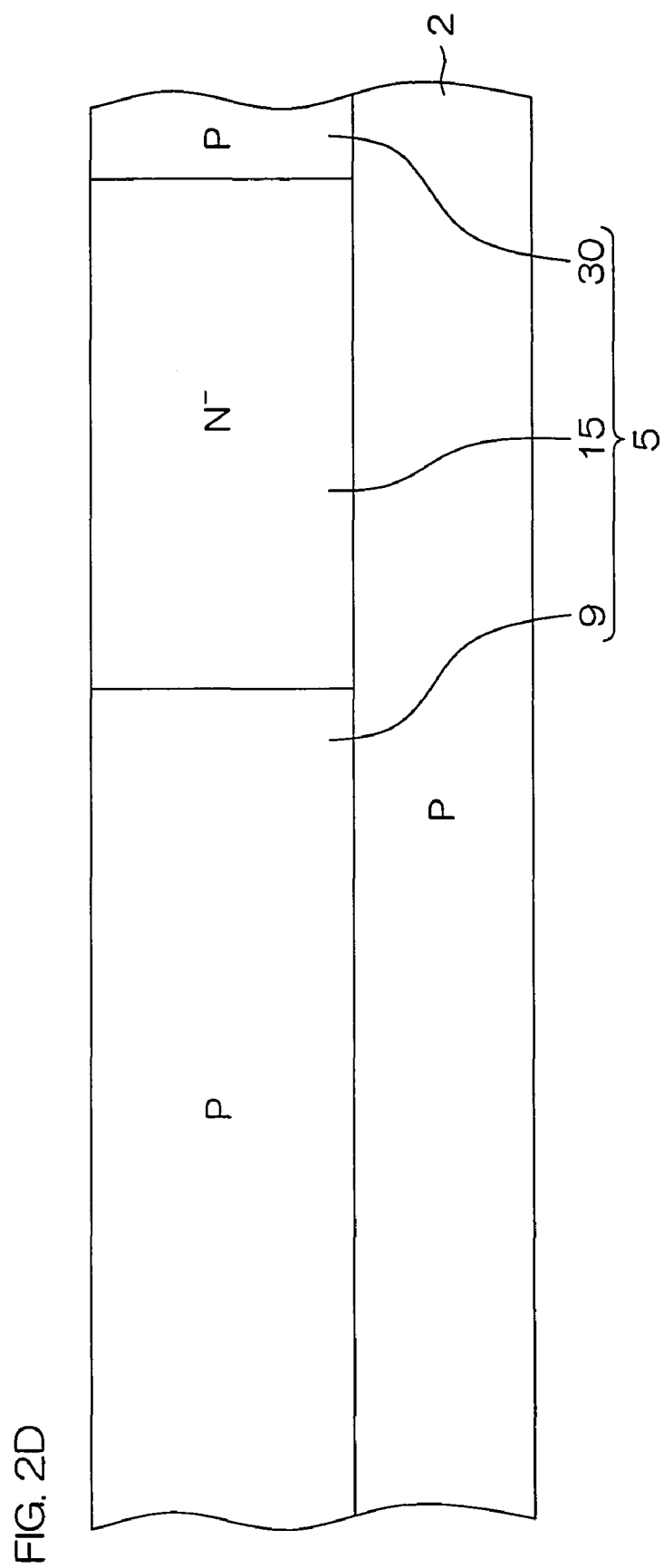
Figure 2F:
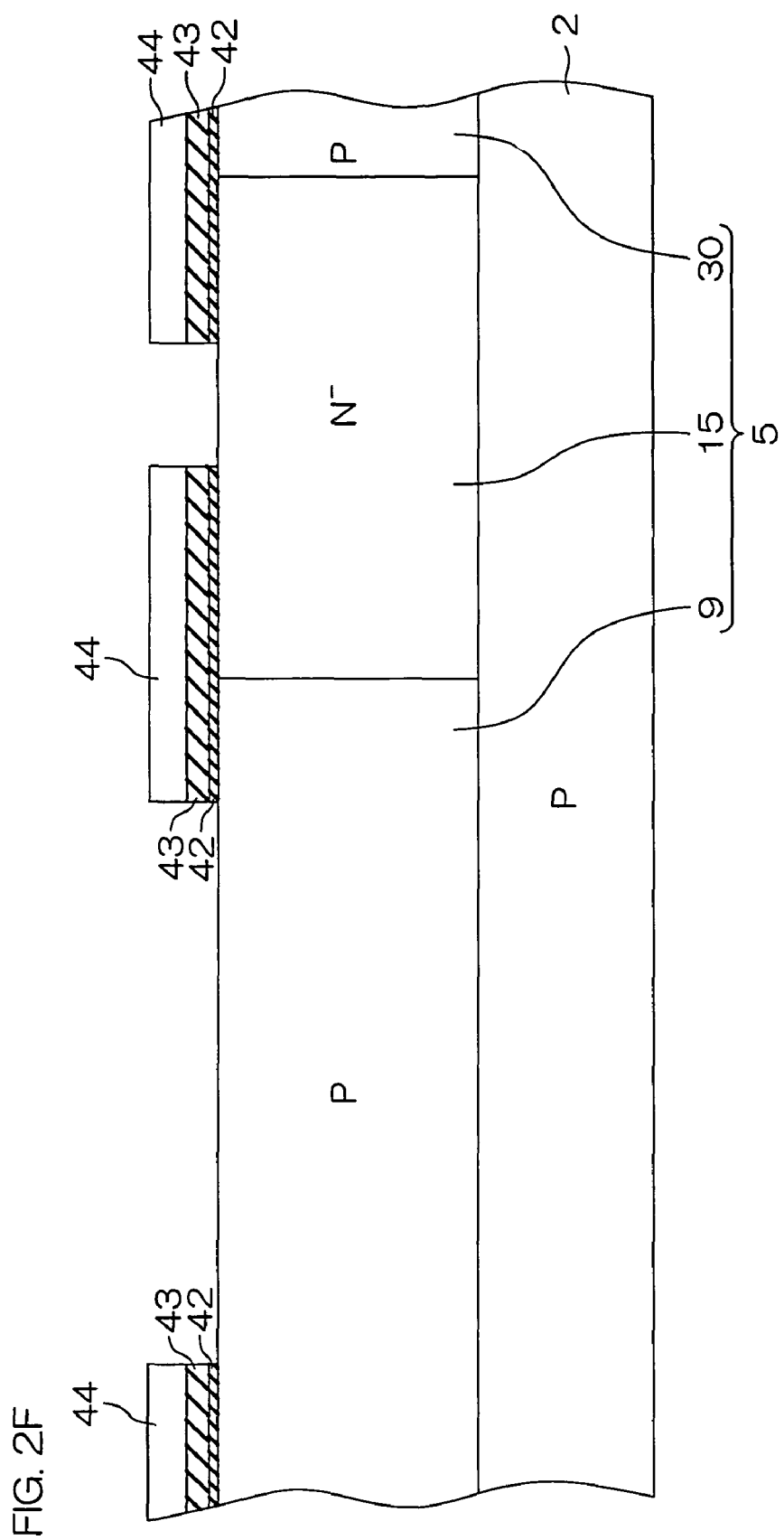
Figure 2G:
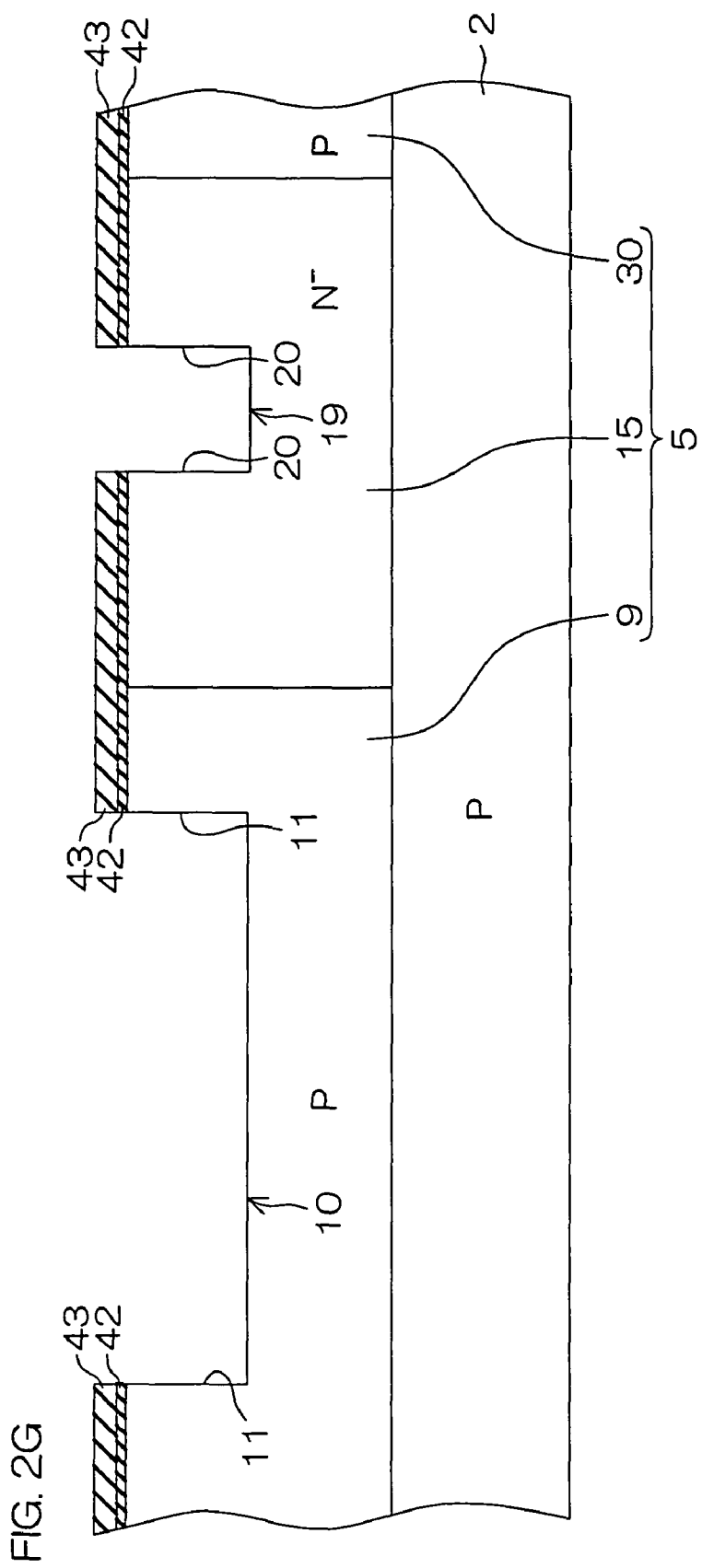
Figure 2H:
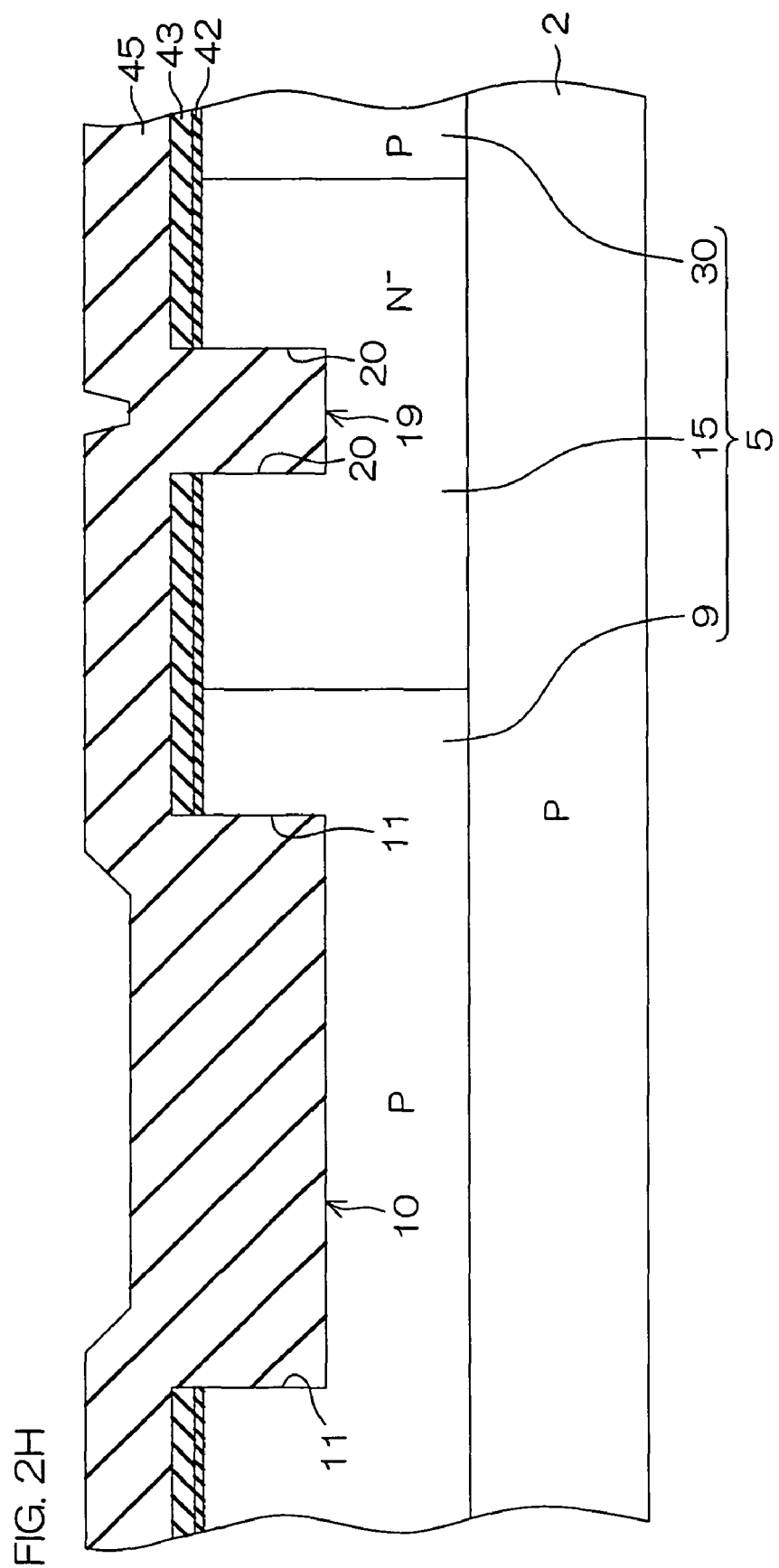
Figure 2K:
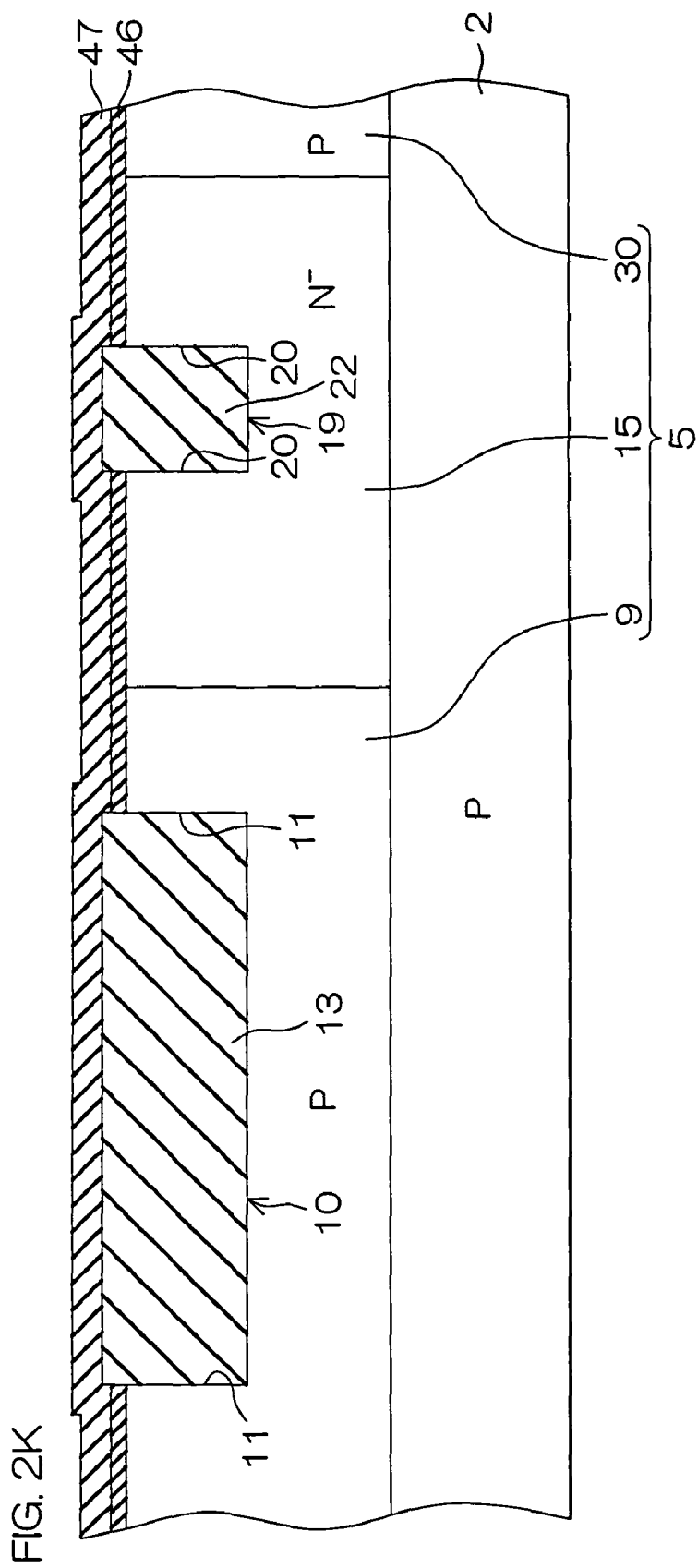
Figure 2L:
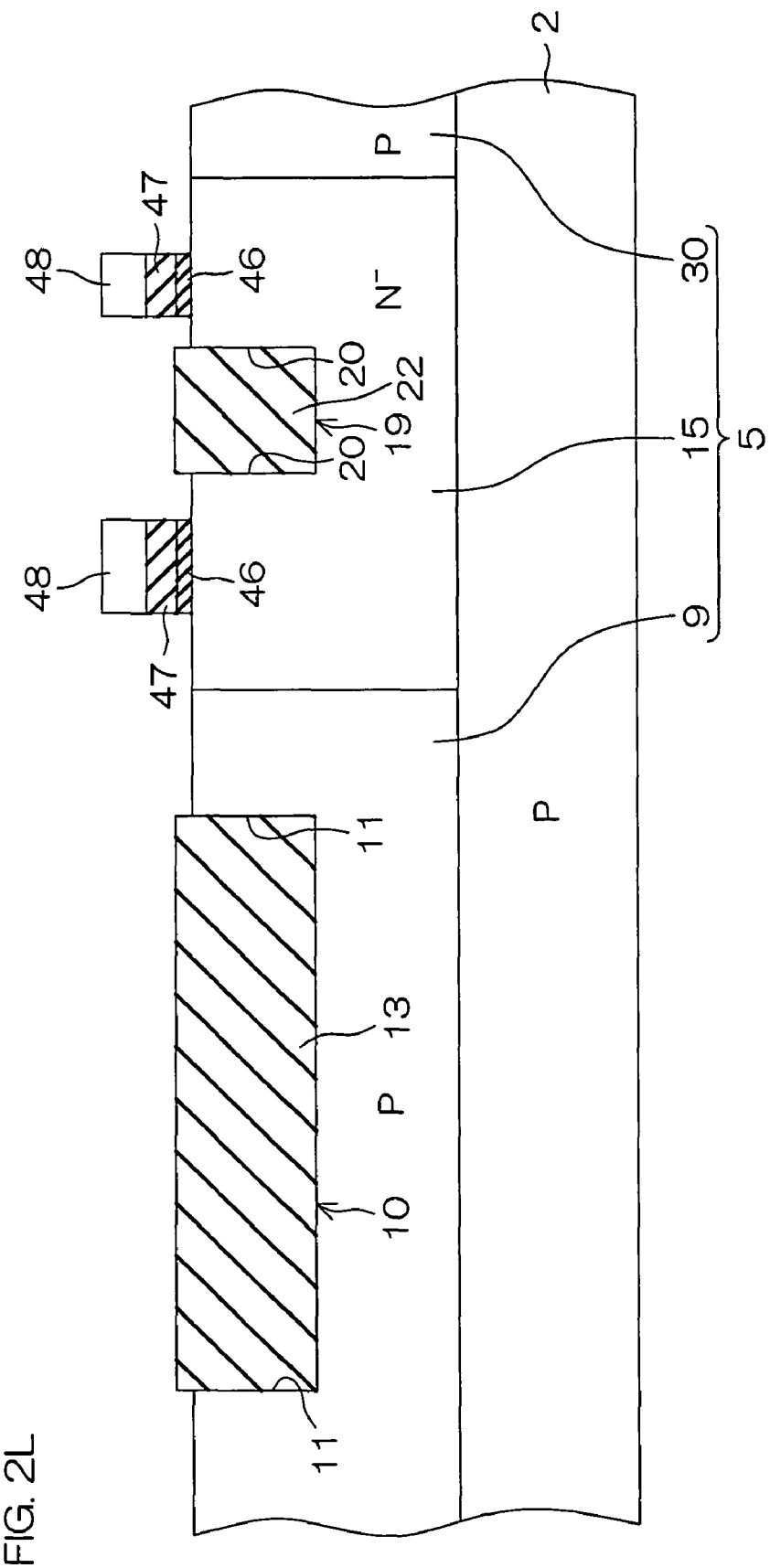
Figure 2M:
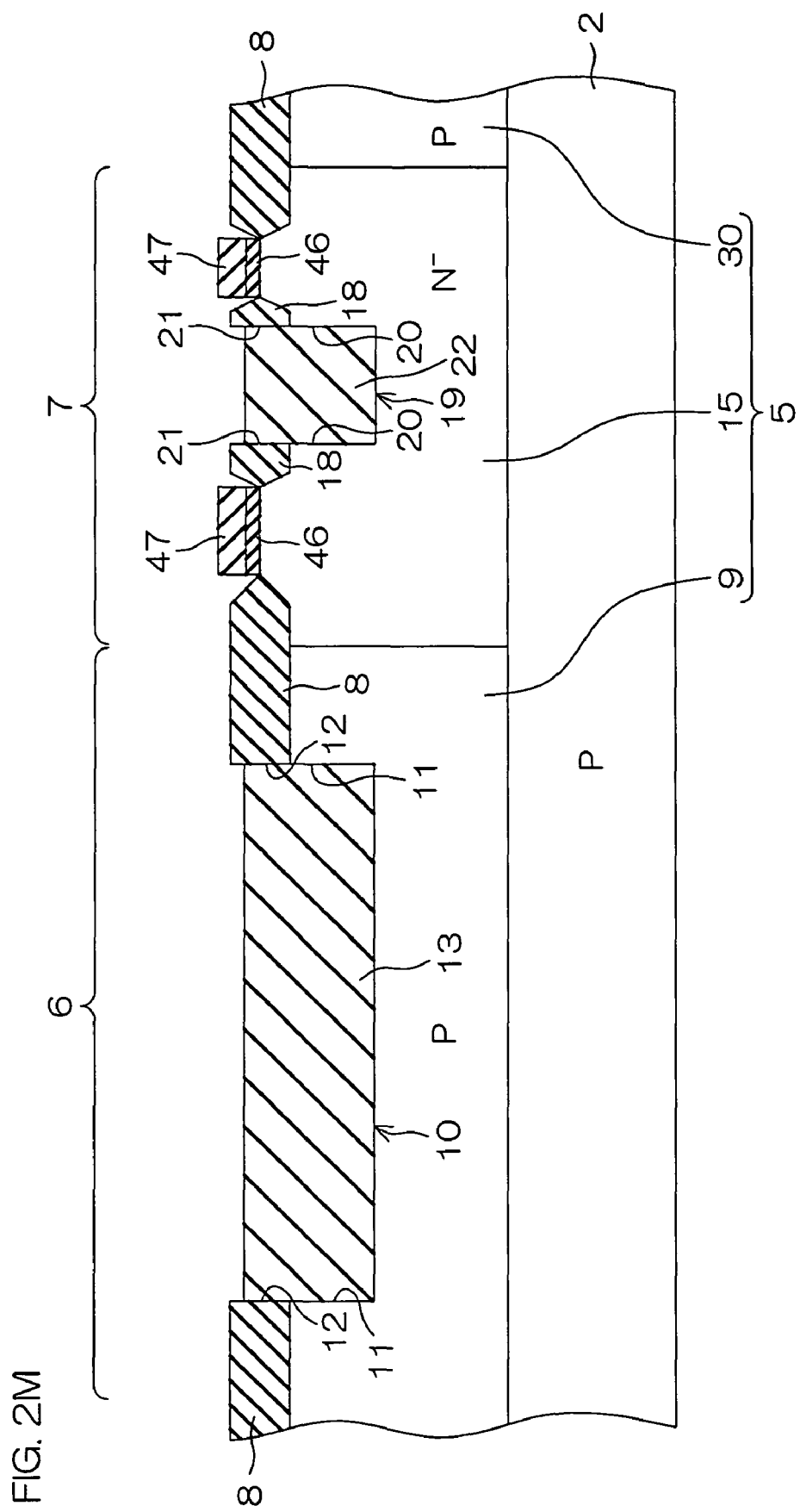
Figure 2N:
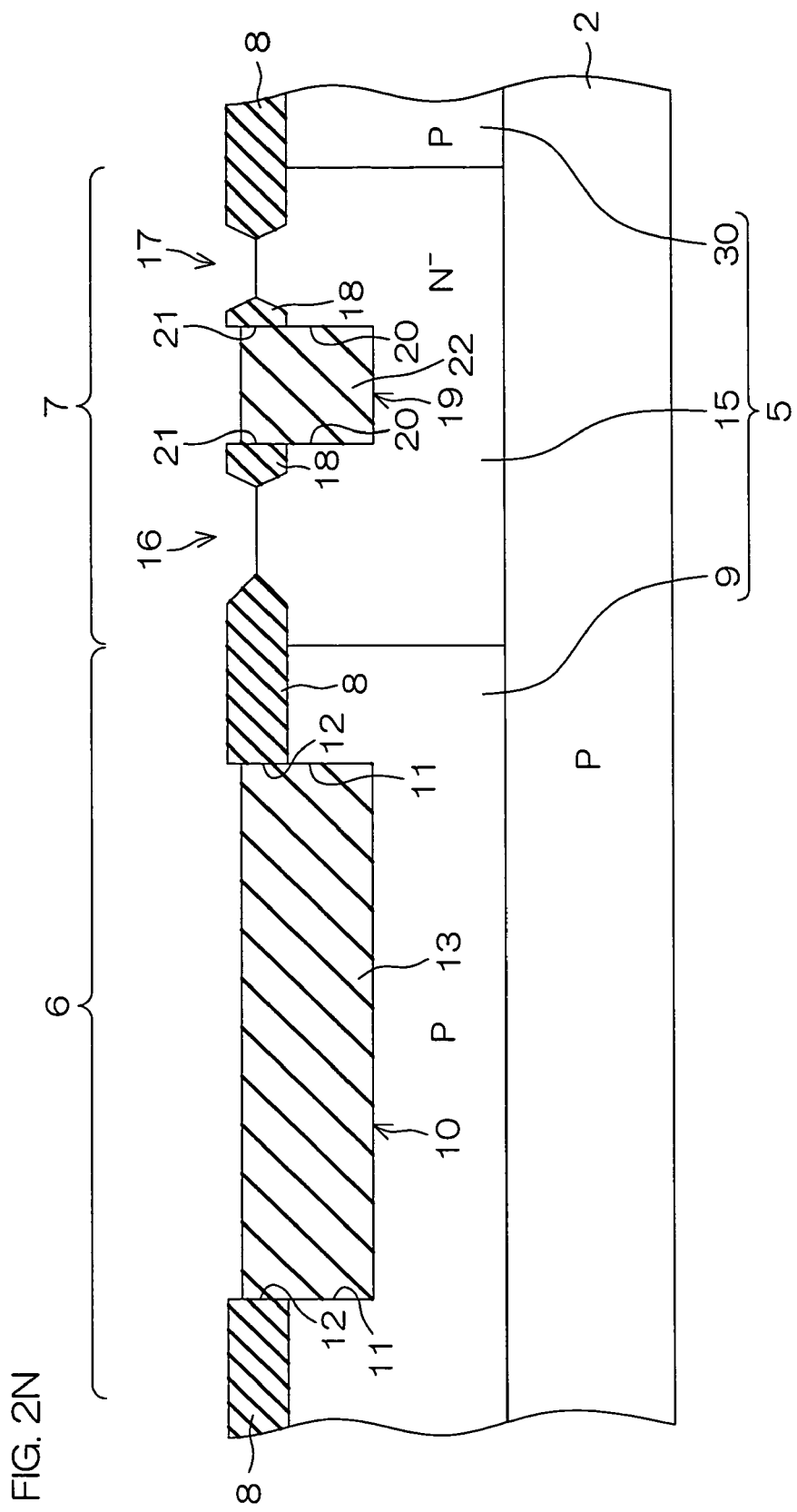
Figure 20:
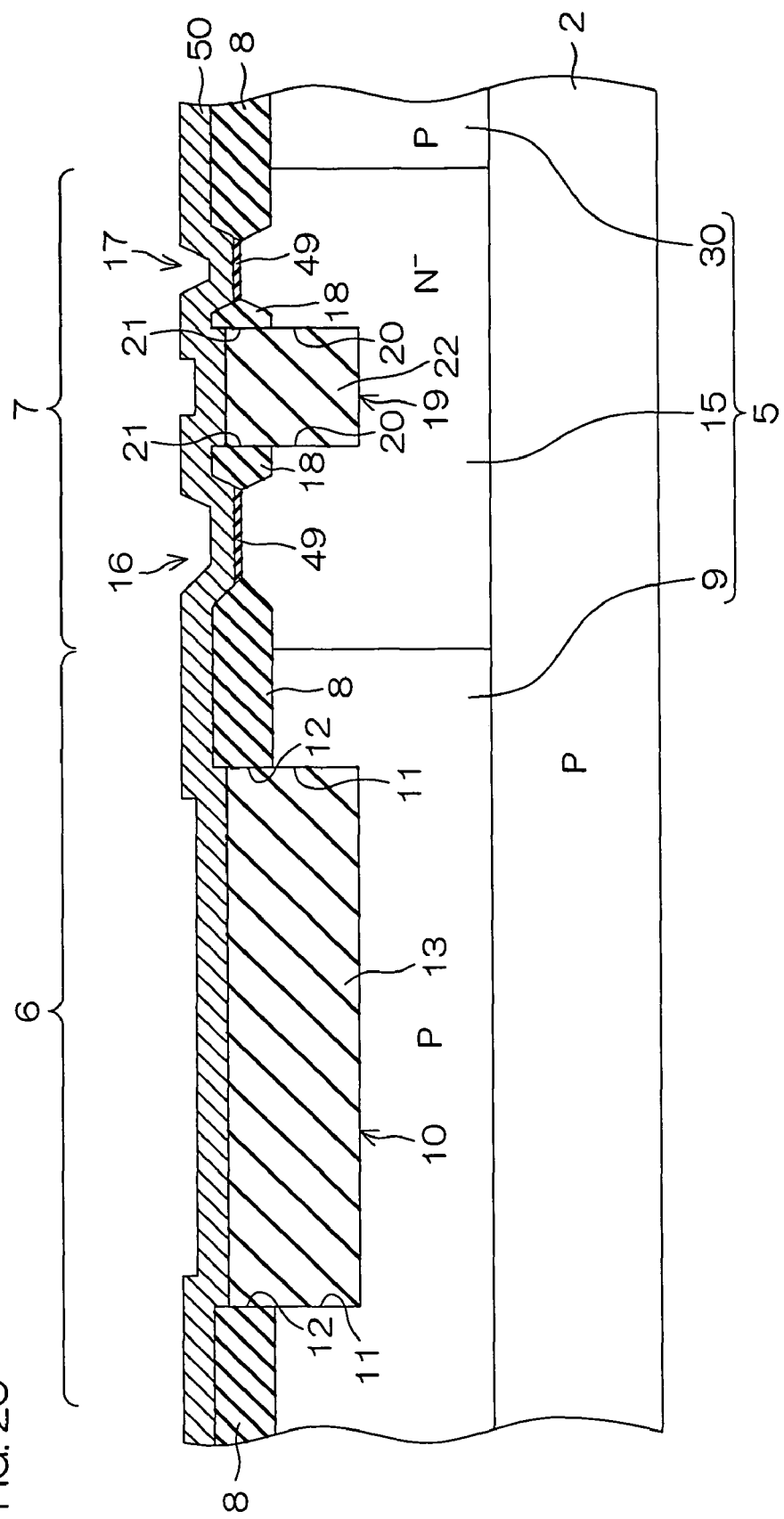
Figure 2R:
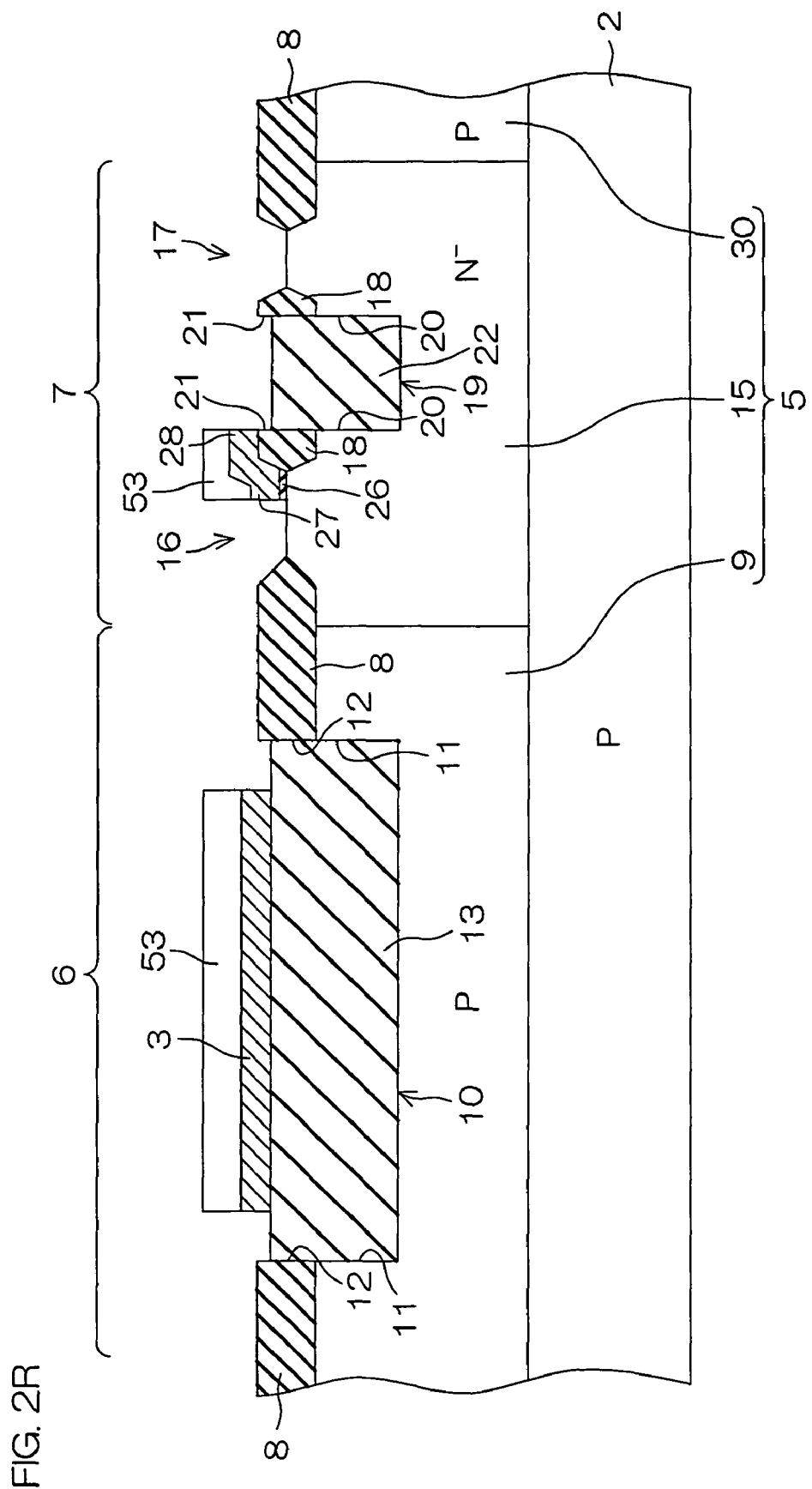
Figure 2S:
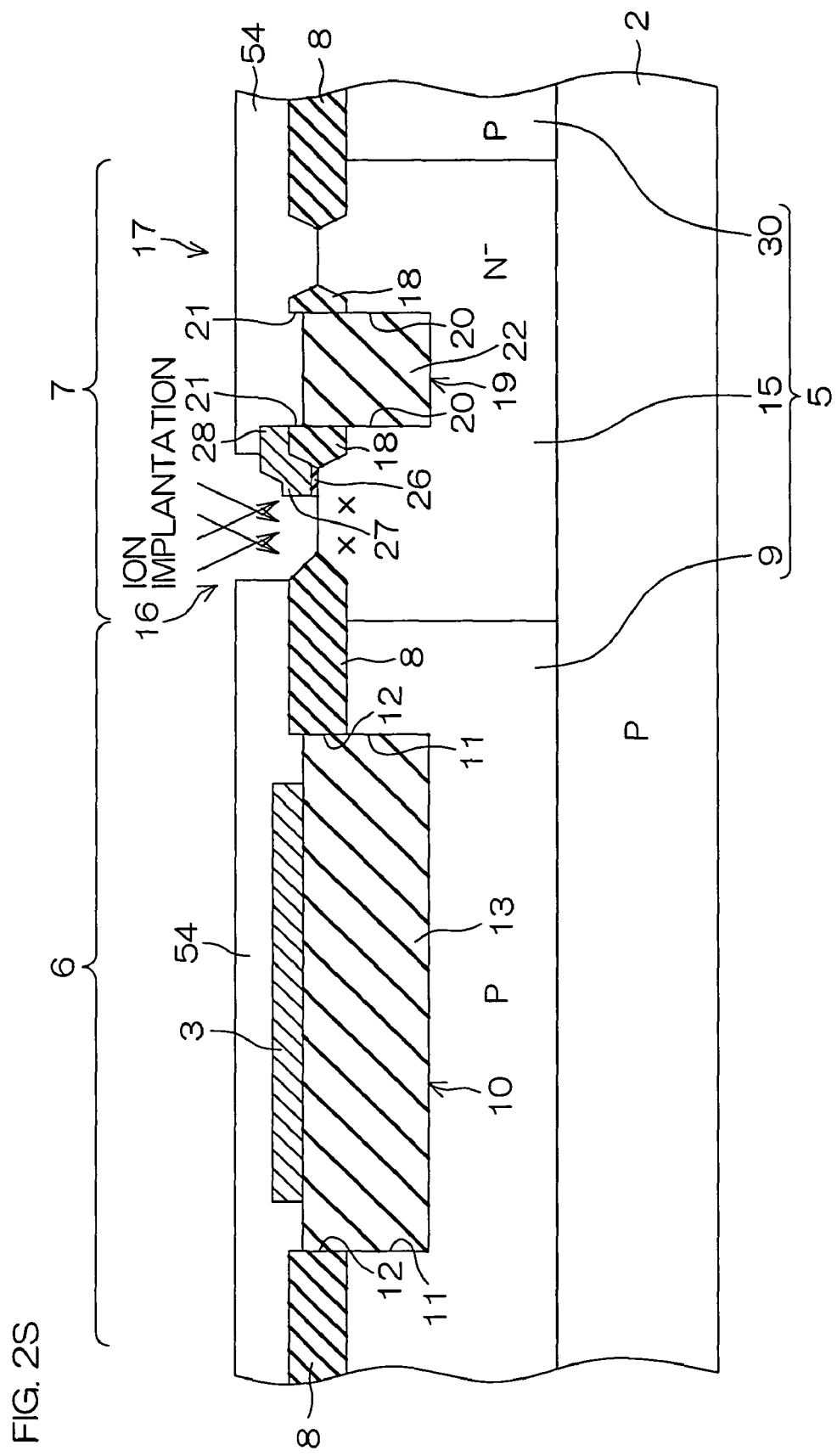
Figure 2T:
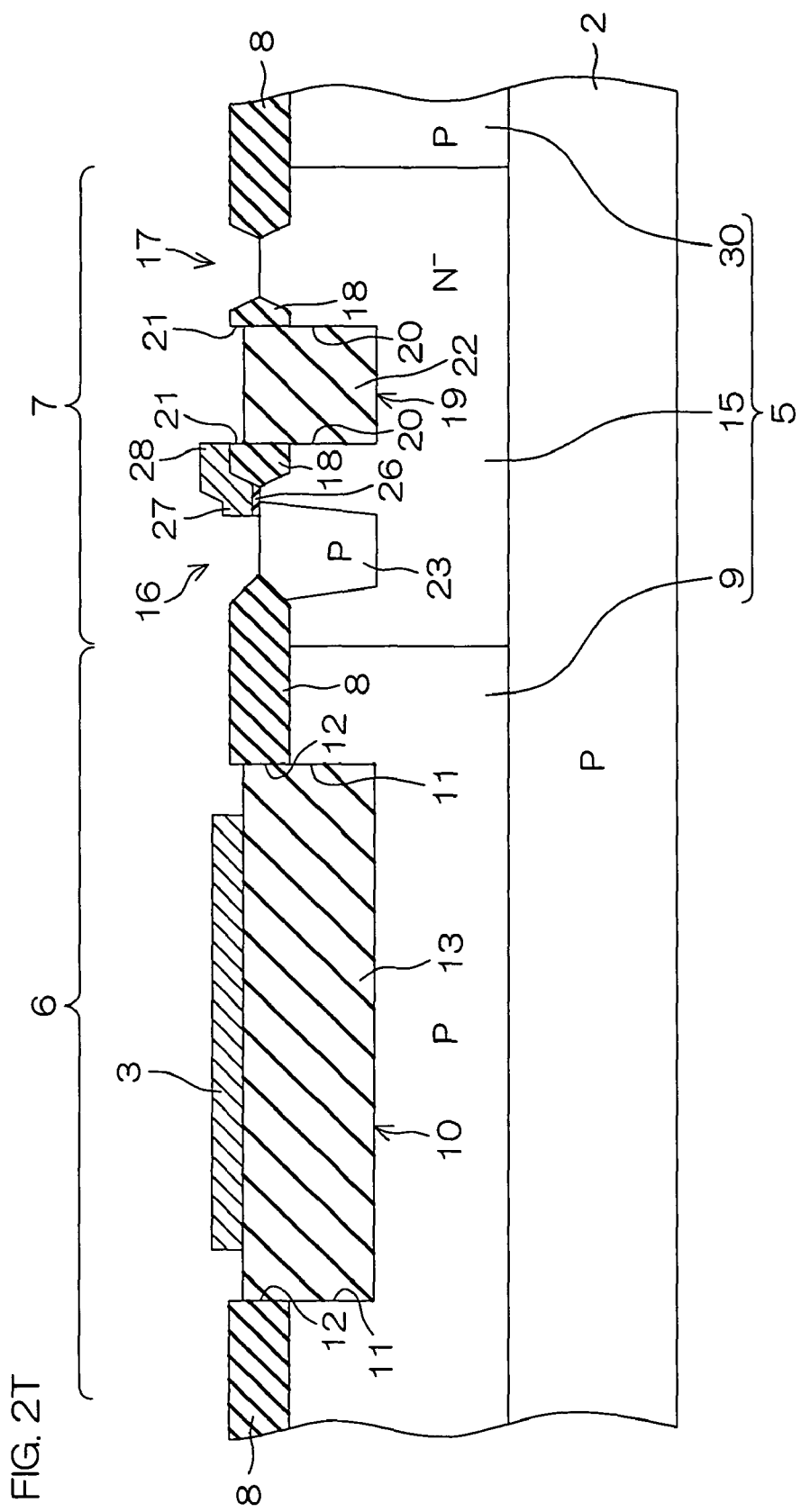
Figure 2V:
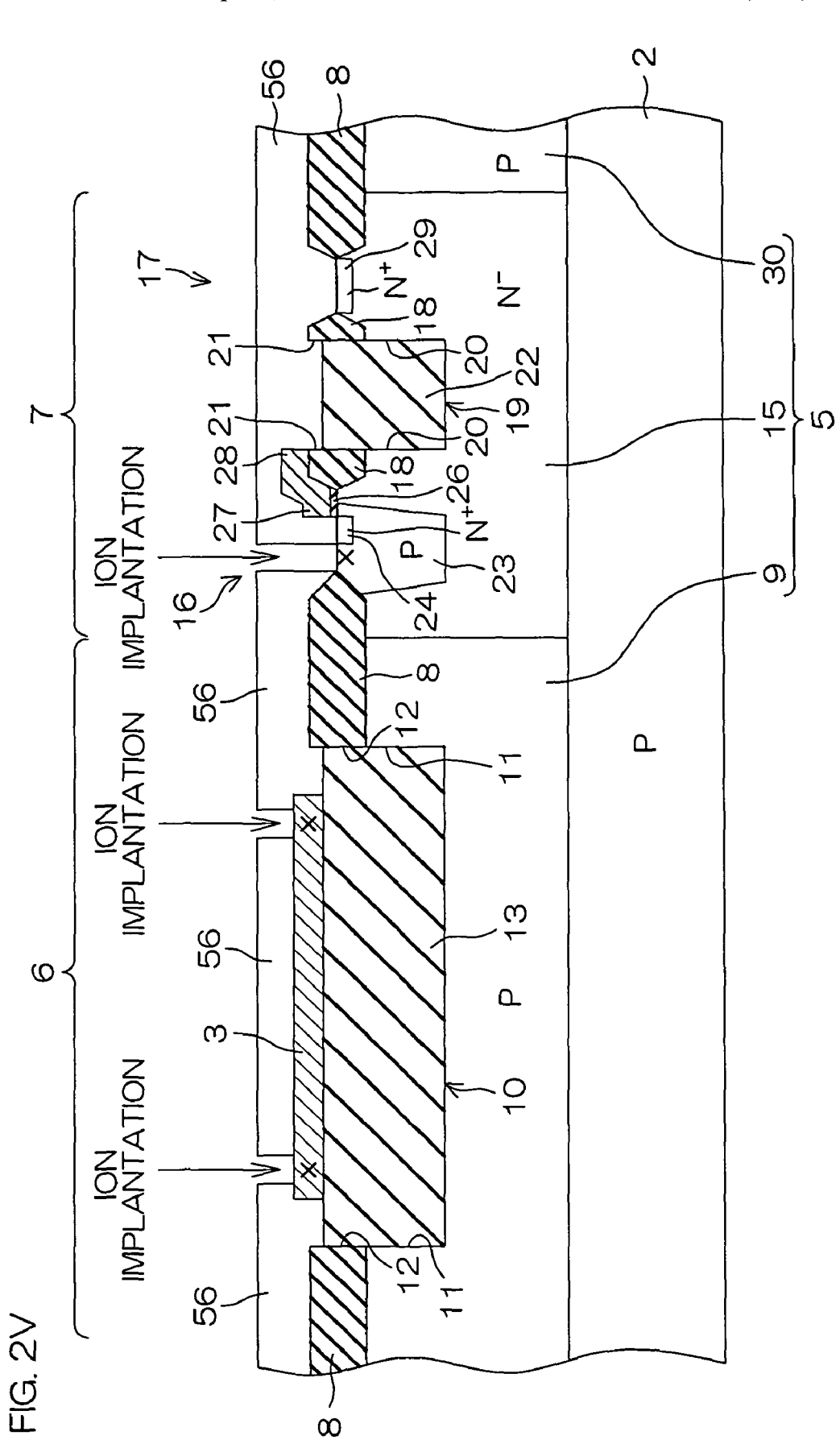
Figure 2W:
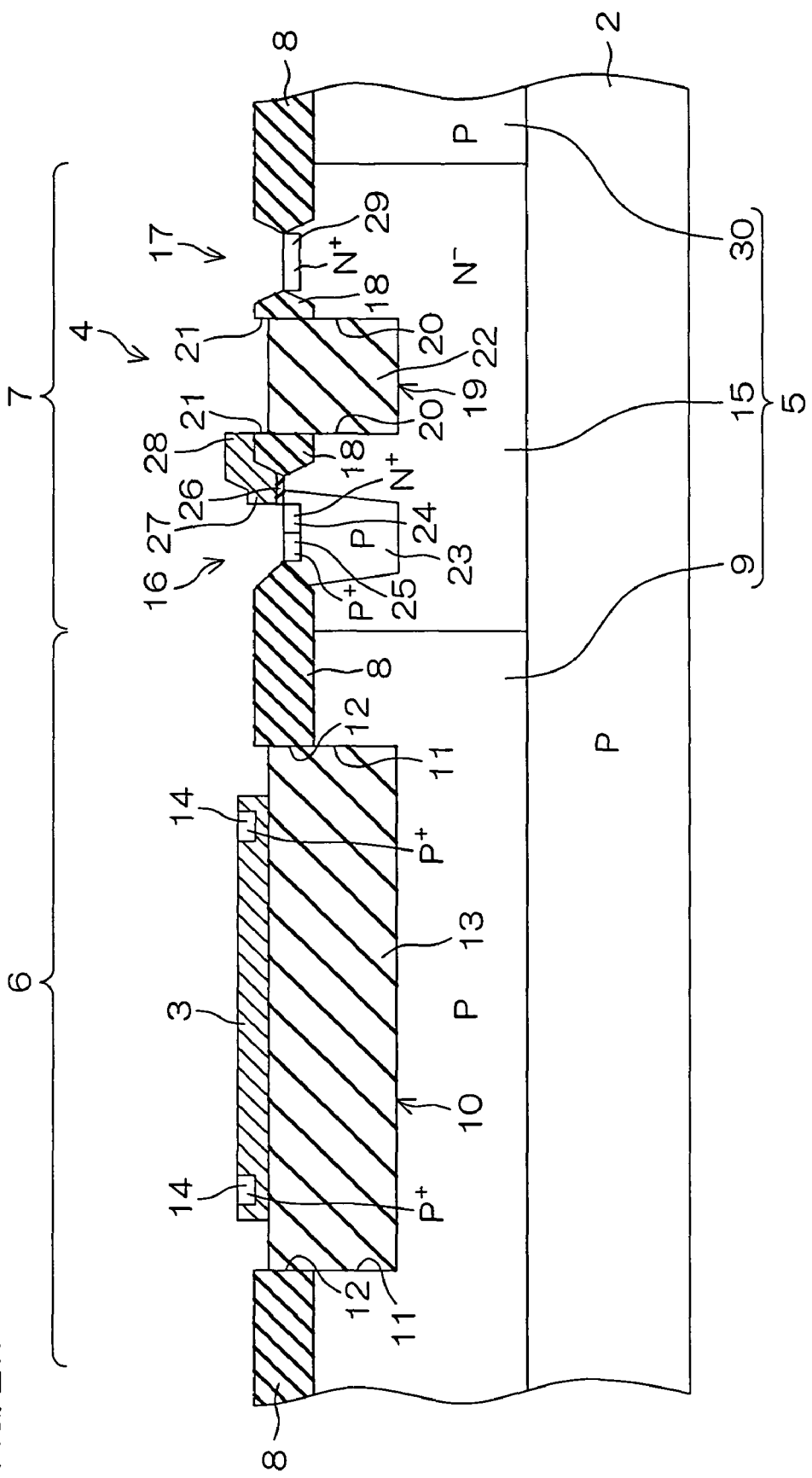
Figure 2X:
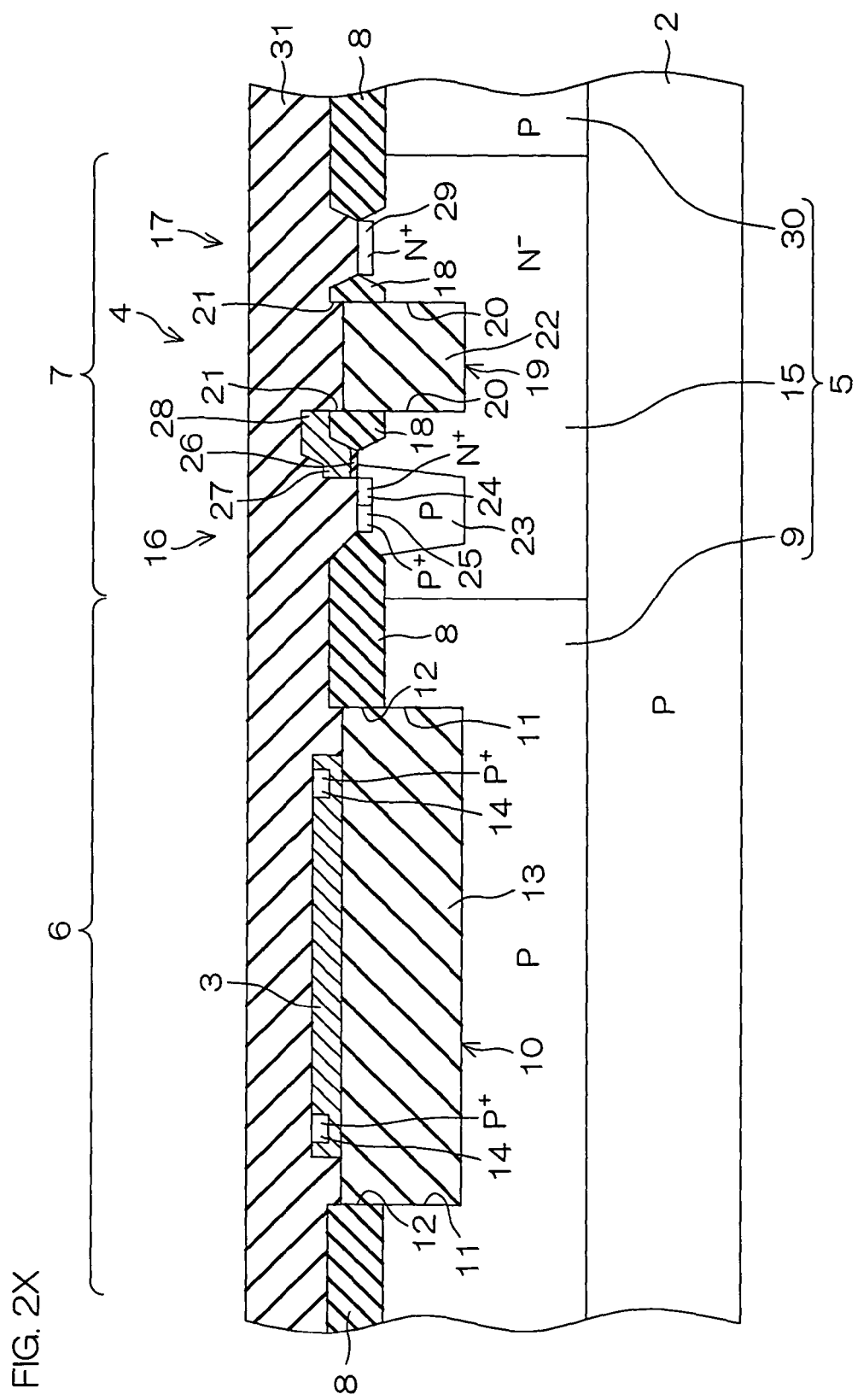
Figure 2Y:
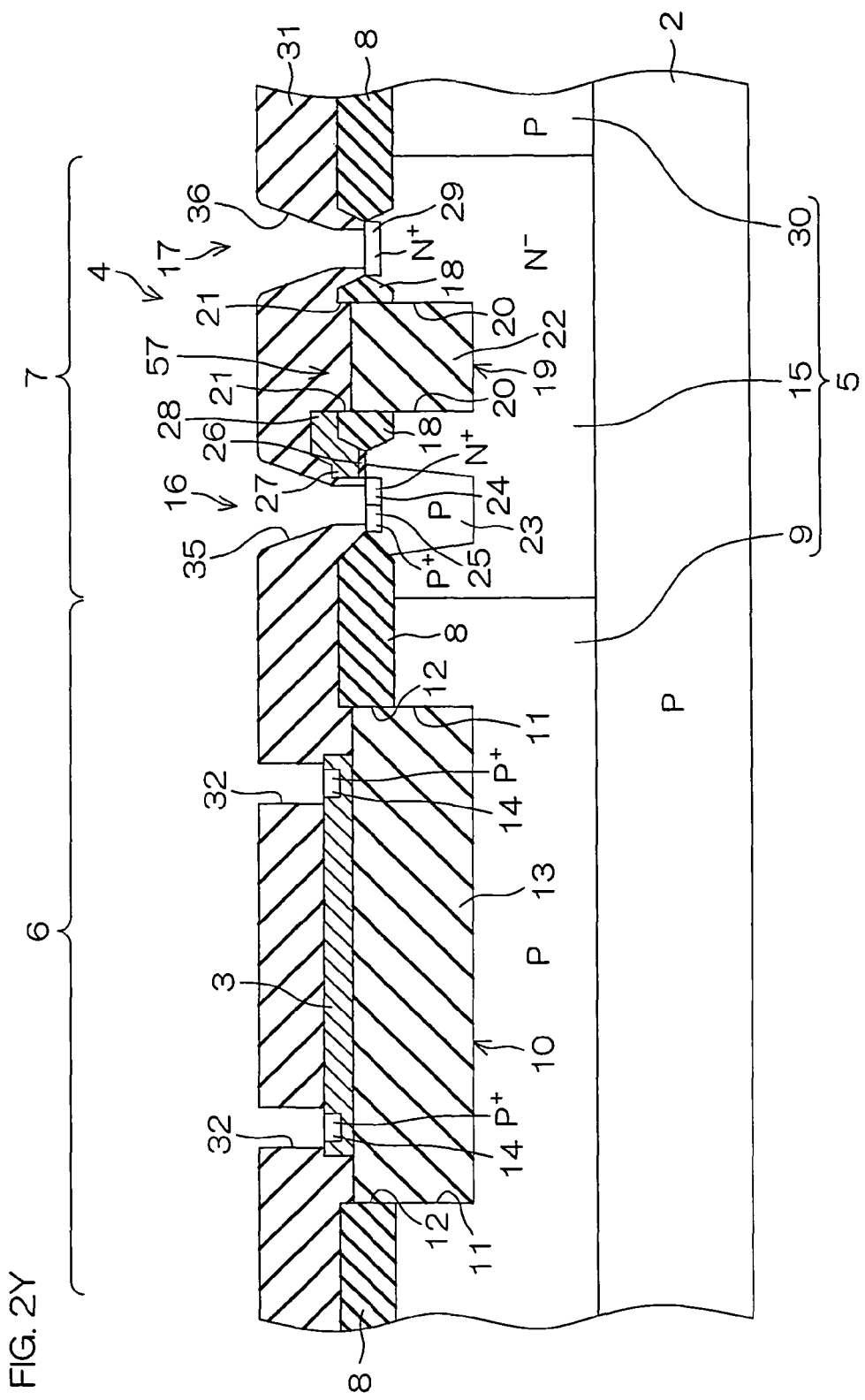
Figure 2Z:
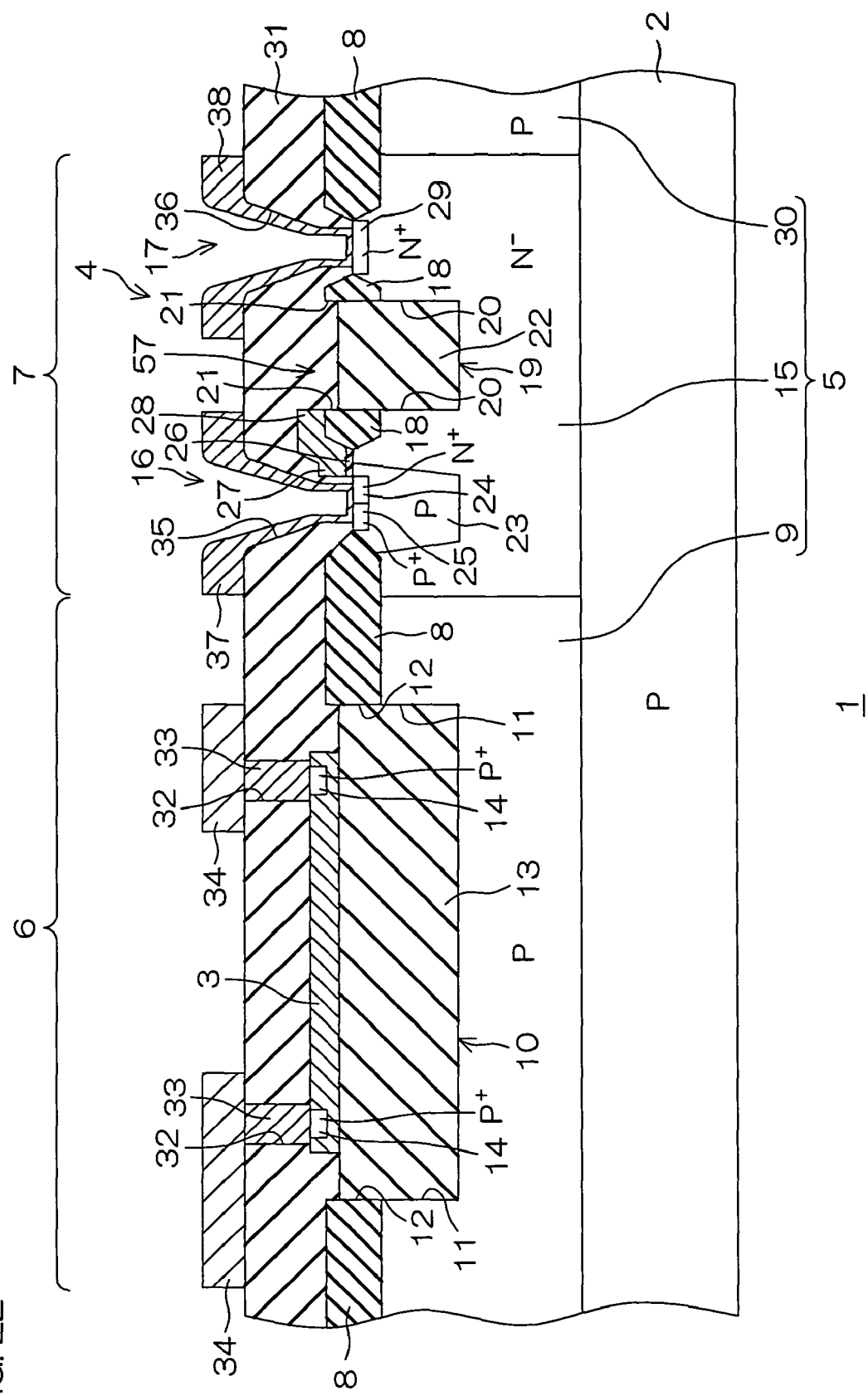

FIGS. 2A to 2Z are schematic sectional views successively showing the steps of a method for producing the semiconductor device shown in FIG. 1.

First, the P-type semiconductor substrate 2 is prepared, as shown in FIG. 2A. Then, the N⁻-type epitaxial layer 5 is laminated on the semiconductor substrate 2 by epitaxy, as shown in FIG. 2B.

Then, a mask 41 having openings opposed to portions for forming the P-type region 9 and the P-type region 30 respectively is formed on the epitaxial layer 5 by photolithography, as shown in FIG. 2C. A P-type impurity is implanted into the epitaxial layer 5 from the surface thereof through the mask 41. At this time, the P-type impurity is implanted in a low P-type dose of $10^{12}$ to $10^{14}$ cm$^{-2}$, for example, set in response to the P-type impurity concentrations in the P-type region 9 and the P-type region 30. The low P-type dose is relatively smaller than a high P-type dose described later.

Then, a heat treatment is performed for diffusing the P-type impurity, whereby the P-type region 9 and the P-type region 30 are formed in the epitaxial layer 5 along with the drift region 15 adjacent thereto, as shown in FIG. 2D.

Then, the surface layer portion of the epitaxial layer 5 is thermally oxidized, whereby a sacrificial oxide film 42 made of $SiO_2$ (silicon oxide) is formed on the epitaxial layer 5, as shown in FIG. 2E. Thereafter a sacrificial nitride film 43 made of SiN (silicon nitride) is laminated on the sacrificial oxide film 42 by P-CVD (Plasma Chemical Vapor Deposition) or LP-CVD (Low Pressure Chemical Vapor Deposition).

Then, a mask 44 having openings opposed to portions for forming the first trench 10 and the second trench 19 respectively is formed on the sacrificial nitride film 43 by photolithography, as shown in FIG. 2F. Portions of the sacrificial nitride film 43 and the sacrificial oxide film 42 exposed in the openings of the mask 44 are removed by etching.

Then, the epitaxial layer 5 is etched through the sacrificial nitride film 43 and the sacrificial oxide film 42 serving as hard masks, whereby the first trench 10 having the side surfaces 11 is formed in the P-type region 9 and the second trench 19 having the side surfaces 20 is formed in the drift region 15, as shown in FIG. 2G.

Thereafter an insulating material 45 of silicon oxide is deposited on the epitaxial layer 5 by HDP-CVD (High Density Plasma Chemical Vapor Deposition) or SA-CVD (Sub Atmospheric Chemical Vapor Deposition) while leaving the sacrificial nitride film 43 and the sacrificial oxide film 42, as shown in FIG. 2H. The insulating material 45 is deposited to fill up the first trench 10 and the second trench 19 and to form a film on the sacrificial nitride film 43.

Then, the insulating material 45 is polished by CMP (Chemical Mechanical Polishing), as shown in FIG. 2I. The polishing is continued until the surface of the insulating material 45 and the sacrificial nitride film 43 are generally flush with each other. Thus, the insulting material 45 is separated into the first insulator 13 charged into the first trench 10 and the second insulator 42 charged into the second trench 19.

After the CMP, the sacrificial nitride film 43 is removed by wet etching with hot phosphoric acid ($H_3PO_4$), for example, as shown in FIG. 2J. After masks are formed on the surfaces of the first insulator 13 and the second insulator 22, the sacrificial oxide film 42 is removed by wet etching with hydrofluoric acid (HF), for example. Thus, the first insulator 13 whose surface is rendered higher by one step than the surface of the P-type region 9 and the second insulator 22 whose surface is rendered higher by one step than the drift region 15 are obtained.

Then, the surface layer portion of the epitaxial layer 5 is thermally oxidized, whereby a sacrificial oxide film 46 made of $SiO_2$ (silicon oxide) is formed on the epitaxial layer 5, as shown in FIG. 2K. Thereafter a sacrificial nitride film 47 is laminated on the epitaxial layer 5 by P-CVD (Plasma Chemical Vapor Deposition) or LP-CVD (Low Pressure Chemical Vapor Deposition).

Then, a mask 48 having openings opposed to portions for forming the LOCOS oxide film 8 and the LOCOS oxide films 18 respectively is formed on the sacrificial nitride film 47 by photolithography, as shown in FIG. 2L. Portions of the sacrificial nitride film 47 and the sacrificial oxide film 46 exposed in the openings of the mask 48 are removed by etching. After the removal of the portions of the sacrificial nitride film 47 and the sacrificial oxide film 46, the mask 48 is removed. Thus, hard masks (the sacrificial oxide film 46 and the sacrificial nitride film 47) exposing the portions of the epitaxial layer 5 for forming the LOCOS oxide film 8 and the LOCOS oxide films 18 and selectively covering a first portion for forming the first forming region 16 and a second portion for forming the second forming region 17 are formed.

Then, the surface layer portions of the epitaxial layer 5 exposed from the hard masks are thermally oxidized, as shown in FIG. 2M. The thermal oxidation is performed under such a condition that the thicknesses of formed oxide films do not exceed the thicknesses of the first insulator 13 and the second insulator 22. Thus, the LOCOS oxide film 8 and the LOCOS oxide films 18 having thicknesses smaller than those of the first insulator 13 and the second insulator 22 are integrally formed on the epitaxial layer 5. Thus, the epitaxial layer 5 is separated into the resistive element forming region 6 having the first insulator 13 and the LDMOSFET forming region 7 having the second insulator 22.

After the formation of the LOCOS oxide films 8 and 18, the sacrificial nitride film 47 is removed by wet etching with hot phosphoric acid ($H_3PO_4$), for example, as shown in FIG. 2N. After masks are formed on the surfaces of the first insulator 13, the second insulator 22 and the LOCOS oxide films 8 and 18, the sacrificial oxide film 46 is removed by wet etching with hydrofluoric acid (HF), for example. Thus, the first forming region 16 and the second forming region 17 surrounded by the LOCOS oxide film 8 and the LOCOS oxide films 18 are formed.

Then, the surface layer portions of the epitaxial layer 5 exposed in the first forming region 16 and the second forming region 17 are thermally oxidized, as shown in FIG. 2O. Thus, thermal oxide films 49 are formed to cover the first forming region 16 and the second forming region 17. Thereafter a polysilicon film 50 as a conductive material film is deposited on the epitaxial layer 5 by LP-CVD.

Then, a mask 51 having an opening opposed to a portion for forming the resistive element 3 is formed on the polysilicon film 50 by photolithography, as shown in FIG. 2P. Then, a P-type impurity is implanted into the polysilicon film 50 from the surface thereof through the mask 51. At this time, the P-type impurity is implanted in a dose of $10^{13}$ to $10^{15}$ cm$^{-2}$, for example, set in response to the resistance of the resistive element 3. After the implantation of the P-type impurity, the mask 51 is removed.

Then, a mask 52 covering the portion for forming the resistive element 3 is formed on the polysilicon film 50 by photolithography, as shown in FIG. 2Q. Then, an N-type impurity is implanted into the polysilicon film 50 from the surface thereof through the mask 52. After the implantation of the N-type impurity, the mask 52 is removed.

Thereafter a mask 53 covering portions for forming the resistive element 3, the gate electrode 27 and the field plate 28 respectively is formed on the polysilicon film 50 by photolithography, as shown in FIG. 2R. Then, unnecessary portions (portions other than those corresponding to the resistive element 3, the gate electrode 27 and the field plate 28) of the polysilicon film 50 are removed by etching portions of the polysilicon film 50 exposed from the mask 53. Thus, the resistive element 3, the gate electrode 27 and the field plate 28 are formed. Further, unnecessary portions (portions other than that corresponding to the gate oxide film 26) of the thermal oxide films 49 are removed through the mask 53, whereby the gate oxide film 26 is formed. Thereafter the mask 53 is removed.

Then, a mask 54 having an opening opposed to the first forming region 16 is formed on the epitaxial layer 5 by photolithography, as shown in FIG. 2S. A P-type impurity is implanted into the drift region 15 from above the first forming region 16through the mask 54. The P-type impurity is obliquely implanted at an angle of inclination (an implantation angle) of 15 to 45°, for example, with respect to the vertical direction orthogonal to the surface of the drift region 15. At this time, the P-type impurity is implanted in a dose, set in response to the P-type impurity concentration in the body region 23, generally identical to the low P-type dose ($10^{12}$ to $10^{14}$ cm$^{-2}$, for example), for example.

Thereafter a heat treatment is performed for diffusing the P-type impurity, whereby the body region 23 is formed in the drift region 15, as shown in FIG. 2T.

Then, a mask 55 having openings opposed to a portion of the first forming region 16 for forming the source region 24 and the overall second forming region 17 respectively is formed on the epitaxial layer 5 by photolithography, as shown in FIG. 2U. An N-type impurity is implanted into the body region 23 and the drift region 15 through the mask 55. At this time, the N-type impurity is implanted in a dose of $10^{15}$ to $10^{16}$ cm$^{-2}$, for example, set in response to the N-type impurity concentrations in the source region 24 and the drift region 15.

Then, the mask 55 is removed, and a mask 56 having openings opposed to a portion of the first forming region 16 for forming the body contact region 25 and a portion of the resistive element 3 for forming the contact region 14 respectively is formed on the epitaxial layer 5 by photolithography, as shown in FIG. 2V. A P-type impurity is implanted into the body region 23 and the resistive element 3 through the mask 56. At this time, the P-type impurity is implanted in the high P-type dose of $10^{15}$ to $10^{16}$ cm$^{-2}$, for example, relatively larger than the low P-type dose.

Thereafter the mask 56 is removed, and a heat treatment is performed for activating the implanted impurities, whereby the contact region 14, the body contact region 25, the source region 24 and the drain region 29 are formed, as shown in FIG. 2W. Thus, the LDMOSFET 4 is formed in the LDMOSFET forming region 7.

Then, the interlayer dielectric film 31 is laminated on the epitaxial layer 5 by CVD, as shown in FIG. 2X.

After the formation of the interlayer dielectric film 31, a mask (not shown) having openings opposed to portions for forming the contact holes 32, the source contact hole 35 and the drain contact hole 36 respectively is formed on the interlayer dielectric film 31 by photolithography, as shown in FIG. 2Y. The contact holes 32, the source contact hole 35 and the drain contact hole 36 are formed in the interlayer dielectric film 31 by etching through the mask. After the formation of the contact holes, the mask is removed from the interlayer dielectric film 31.

Then, a conductive material is bonded onto the interlayer dielectric film 31 by sputtering. The conductive material is bonded (deposited) to fill up the contact holes 32 and to form thin films on the inner surfaces of the source contact hole 35 and the drain contact hole 36 and on the interlayer dielectric film 31. The thin film of the conductive material formed on the interlayer dielectric film 31 is patterned by photolithography and etching. Thus, the contact plugs 33 and the wire 34 as well as the source wire 37 and the drain wire 38 are formed, as shown in FIG. 2Z. The semiconductor device 1 shown in FIG. 1 is obtained through the aforementioned steps.

In the aforementioned steps for producing the semiconductor device 1, the first trench 10 and the second trench 19 are formed in the same step (see FIG. 2G). Further, the first insulator 13 is embedded in the first trench 10 and the second insulator 22 is embedded in the second trench 19 in the same step (see FIGS. 2H and 2I). The trenches can be formed through a single step and the insulators can be embedded through a single step, whereby the number of the steps for producing the semiconductor device 1 can be reduced. Consequently, the production efficiency for the semiconductor device 1 can be improved.

In other words, a semiconductor device excellent in withstand voltage and compact as a whole can be efficiently produced through the aforementioned steps.

Figure 3:
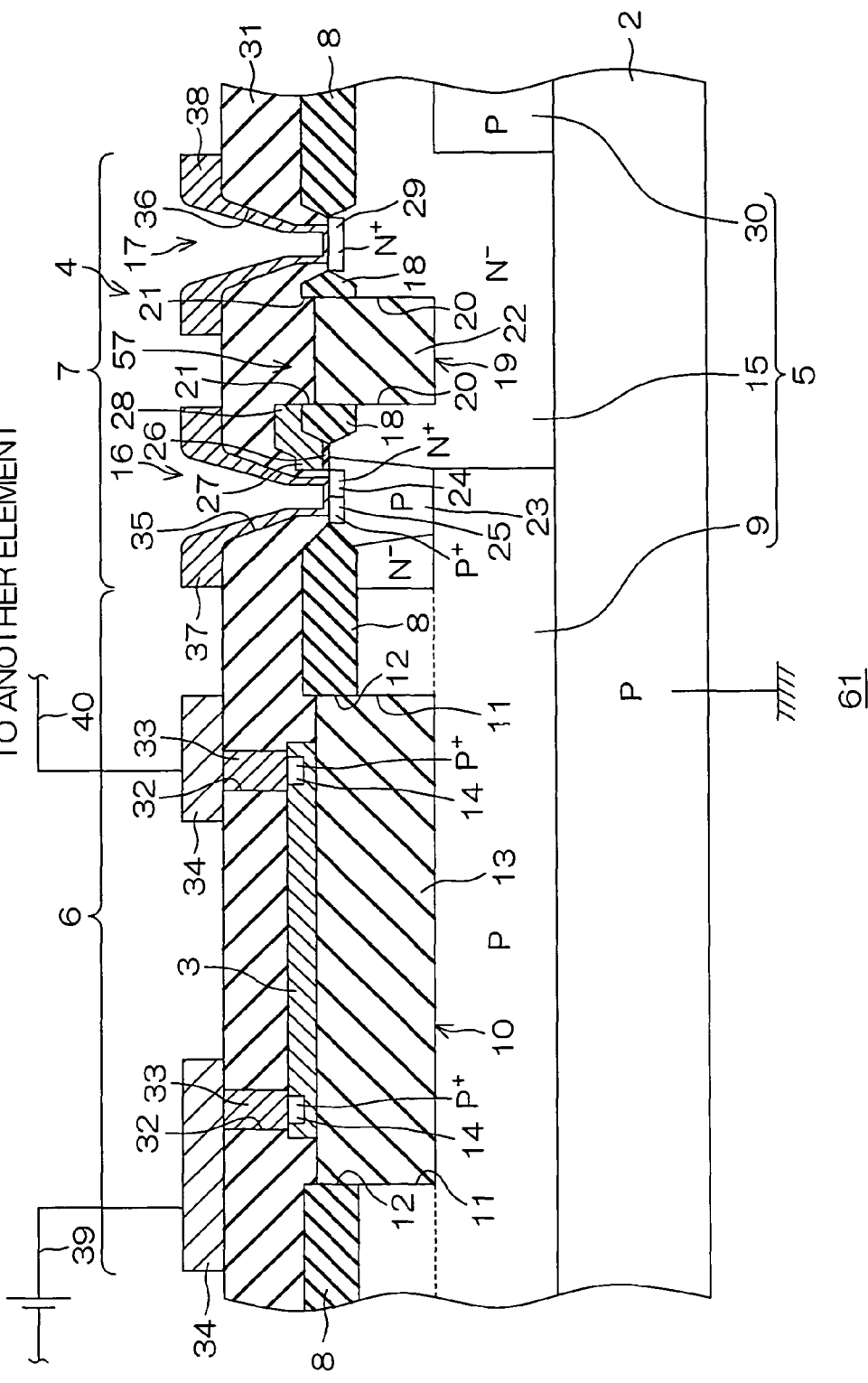
FIG. 3 is a schematic sectional view of a semiconductor device according to a second embodiment of the present invention.

FIG. 3 is a schematic sectional view of a semiconductor device according to a second embodiment of the present invention. Referring to FIG. 3, portions corresponding to those shown in FIG. 1 are denoted by reference numerals identical to those of the portions shown in FIG. 1. In the following, redundant description is omitted as to the portions denoted by the same reference numerals.

In a semiconductor device 61, a P-type region 9 of a resistive element forming region 6 extends toward an LDMOS- FET forming region 7, to be in contact with a body region 23 on the upper surface thereof and in contact with a semiconductor substrate 2 on the lower surface thereof. Thus, the body region 23 and the semiconductor substrate 2 are electrically connected with each other through the P-type region 9.

A drift region 15 of the LDMOSFET forming region 7 extends toward an adjacent element forming region. Thus, an epitaxial layer 5 partially forms an N-type region integrated with the drift region 15.

The remaining structure and operations of the semiconductor device 61 are similar to those of the semiconductor device 1 according to the first embodiment.

FIGS. 4A to 4D are schematic sectional views successively showing the steps of a method for producing the semiconductor device 61 shown in FIG. 3.

First, the P-type semiconductor substrate 2 is prepared, as shown in FIG. 4A. Then, a mask 62 covering a portion for forming the drift region 15 is formed on the semiconductor substrate 2 by photolithography. A P-type impurity is implanted into the surface layer portion of the semiconductor substrate 2 through the mask 62. At this time, the P-type impurity is implanted in a dose of $10^{12}$ to $10^{14}$ cm$^{-2}$, for example, allowing growth of a P-type semiconductor from the semiconductor substrate 2.

Figure 4B:
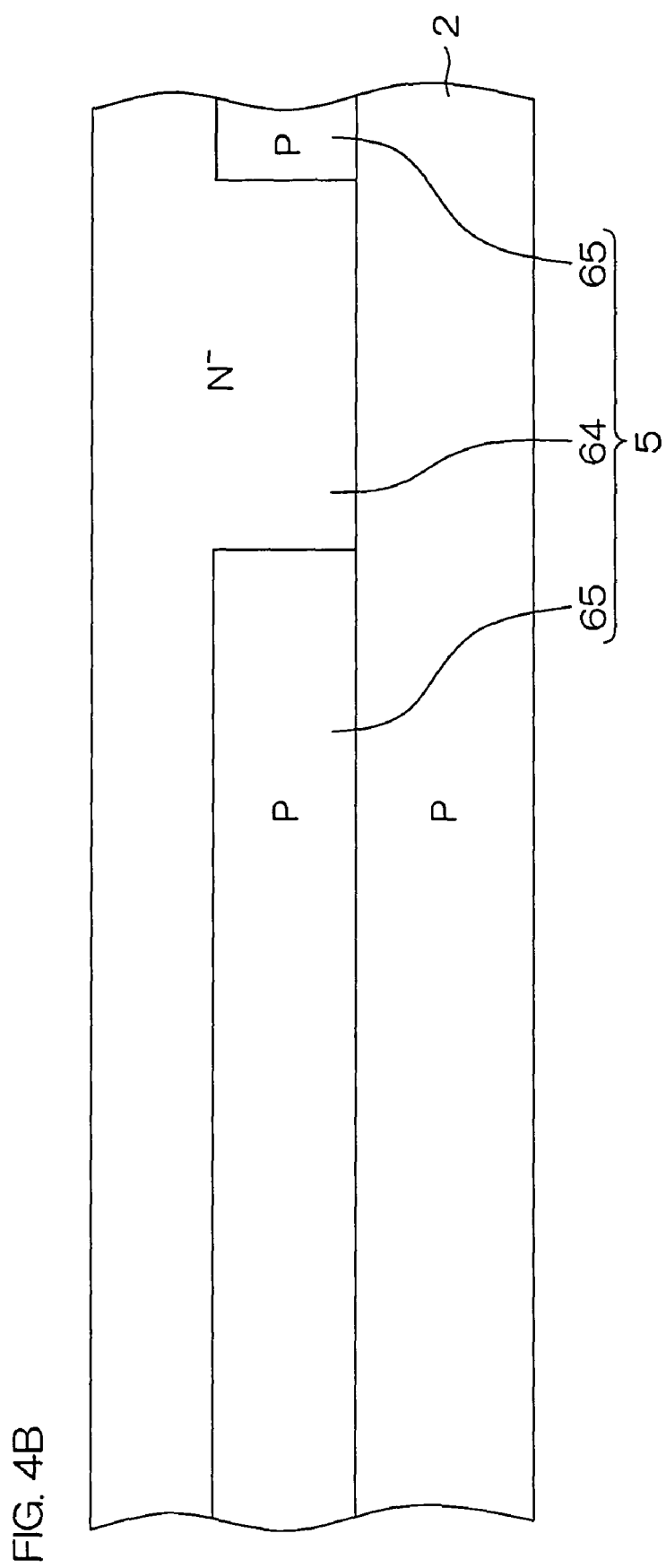

Then, the mask 62 is removed, and the epitaxial layer 5 is laminated by epitaxy, as shown in FIG. 4B. The epitaxy is performed under such a growth condition that an N-type semiconductor is grown at a higher rate than a P-type semiconductor. Thus, the N-type semiconductor can be vertically grown from a portion (into which the P-type impurity has not been implanted) having been covered with the mask 62, and can also be laterally grown to extend onto the P-type semiconductor. Thus, the epitaxial layer 5 having an N--type region 64 and a P-type region 65 is formed.

Figure 4C:
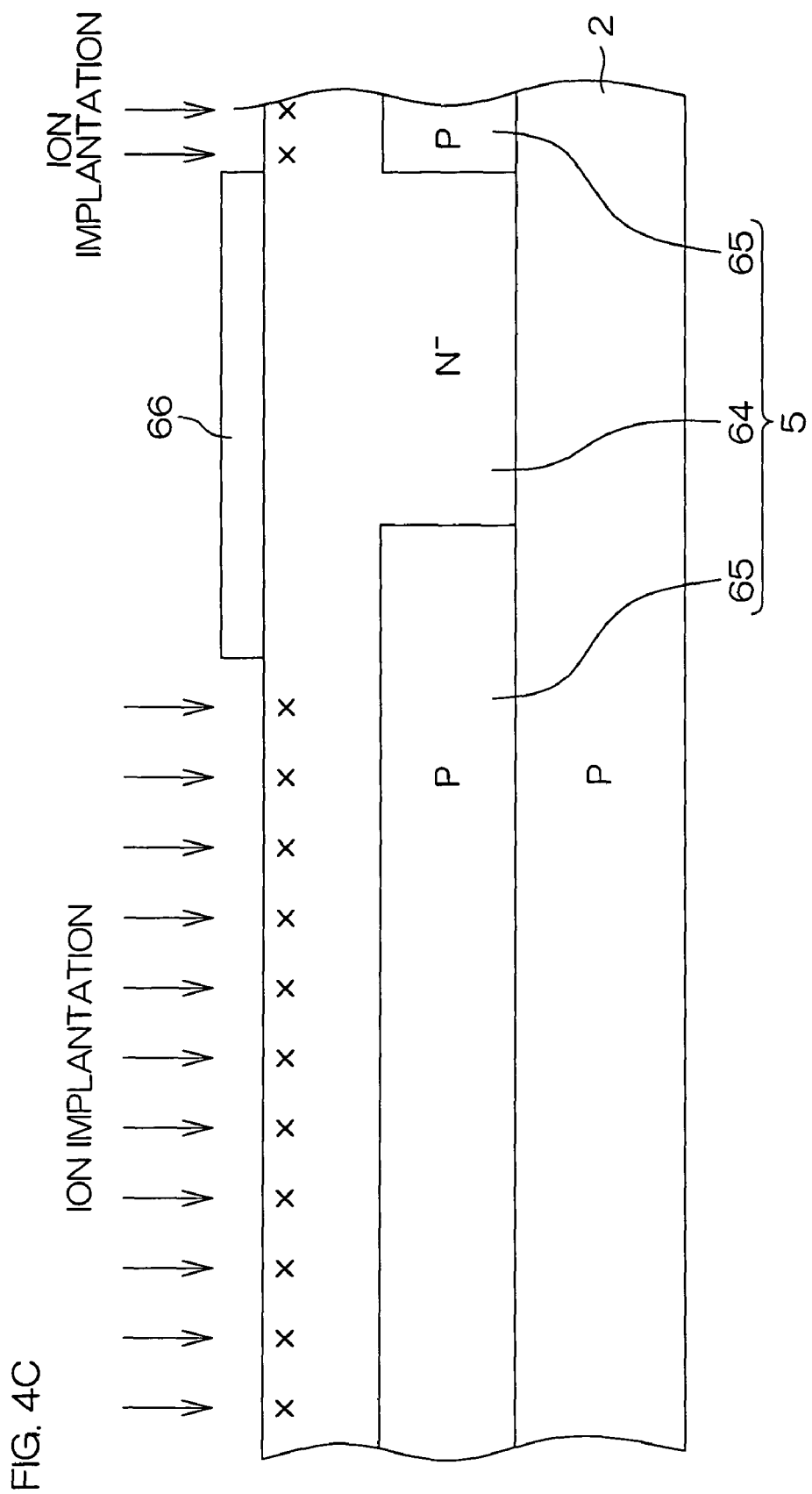

Then, a mask 66 covering a region for forming the drift region 15 is formed on the epitaxial layer 5 by photolithography, as shown in FIG. 4C. A P-type impurity is implanted into the epitaxial layer 5 through the mask 66. At this time, the P-type impurity is implanted in a dose generally identical to the low P-type dose ($10^{12}$ to $10^{14}$ cm$^{-2}$, for example).

Figure 4D:
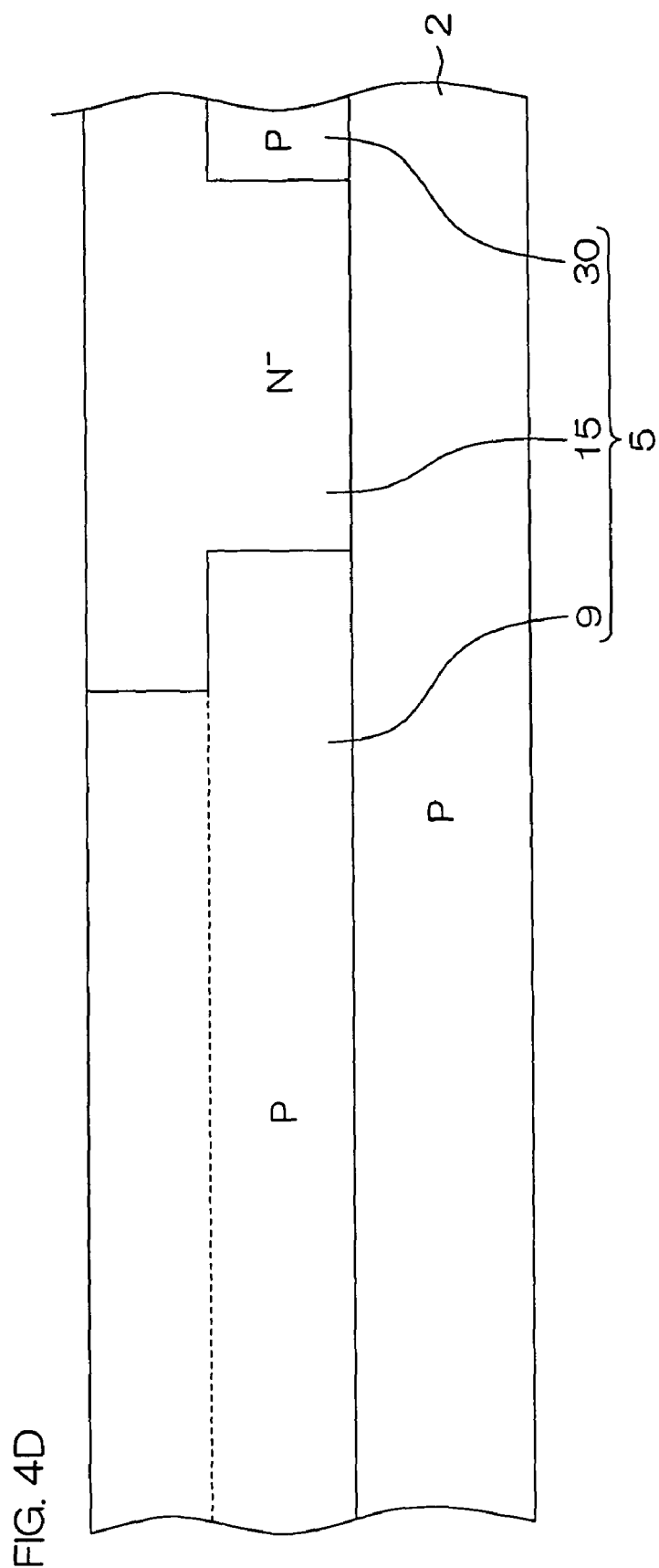

Then, a heat treatment is performed for diffusing the P-type impurity, whereby a P-type region 9 and a P-type region 30 are formed in the epitaxial layer 5 along with the drift region 15 adjacent thereto, as shown in FIG. 4D.

Thereafter steps similar to those described with reference to FIGS. 2E to 2Z are carried out.

The semiconductor device 61 shown in FIG. 3 is obtained through the aforementioned steps.

Figure 5:
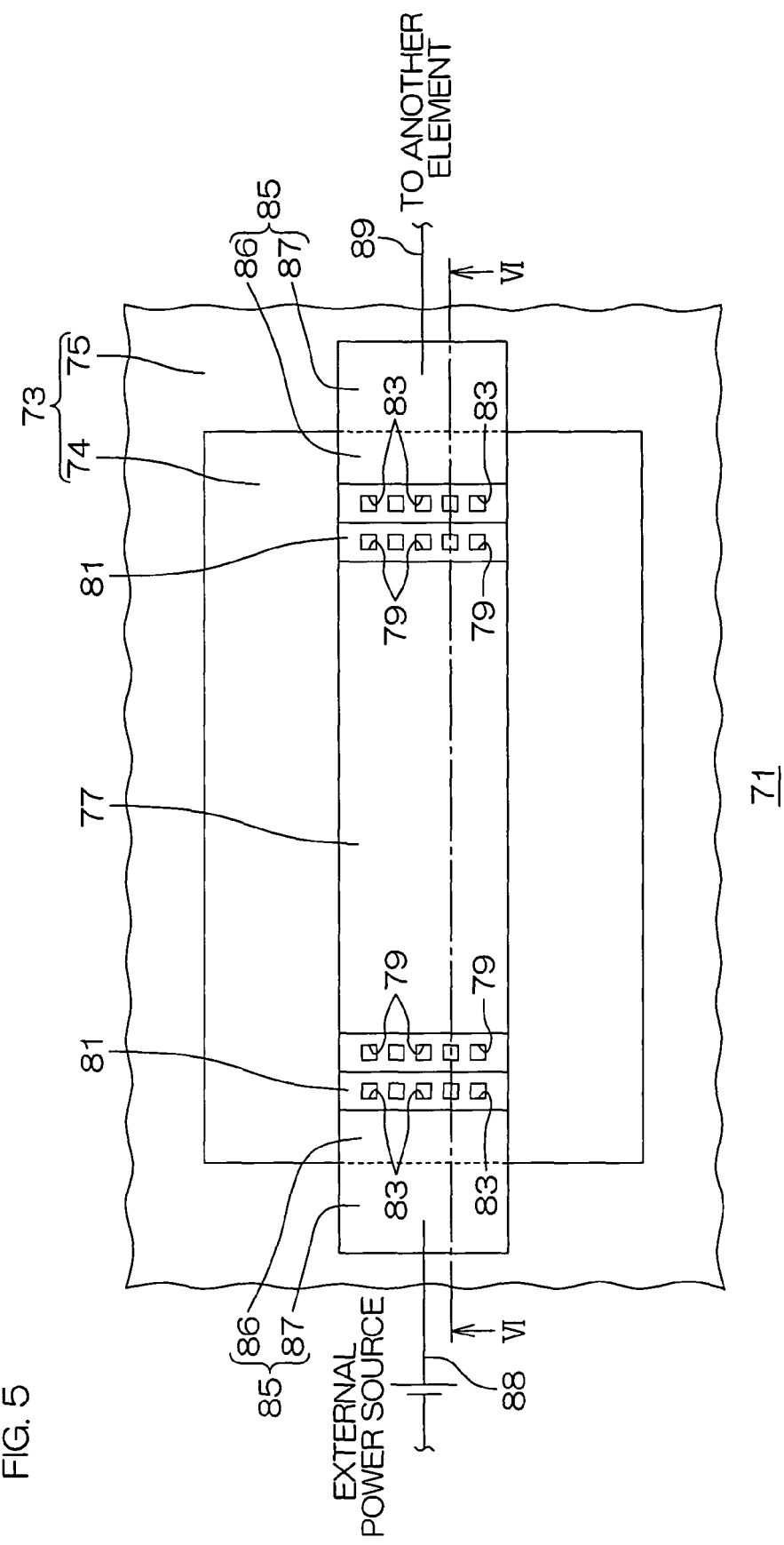
FIG. 5 is a plan view enlargedly showing a region provided with a resistive element and the vicinity thereof in a semiconductor device according to a third embodiment of the present invention.

FIG. 5 is a plan view enlargedly showing a region provided with a resistive element and the vicinity thereof in a semiconductor device according to a third embodiment of the present invention. FIG. 6 is a sectional view taken along a line VI-VI in FIG. 5.

A semi conductor device 71 is a high withstand voltage semiconductor device employed in the field of power electronics, for example.

The semiconductor device 71 includes a P-type substrate 72 forming a base thereof.

An N-type epitaxial layer 73 as a semiconductor layer is laminated on the P-type substrate 72. A large number of active elements (transistors, diodes and the like; not shown) are provided on the surface layer portion of the epitaxial layer 73.

An N-type region 74 as a floating region kept in a state after epitaxy is formed in the epitaxial layer 73. The N-type region 74 is a region generally rectangular in plan view, extending from the lower surface of the epitaxial layer 73 in contact with the P-type substrate 72 up to the surface thereof in sectional view.

In the epitaxial layer 73, a region around the N-type region 74 forms a P-type region 75 as an isolation region surrounding the N-type region 74. The P-type region 75 is a region having an annular inner peripheral surface extending from the lower surface of the epitaxial layer 73 up to the surface thereof in sectional view to be in contact with the outer peripheral surface of the N-type region 74.

Therefore, the N-type region 74 electrically floats (is isolated) from the periphery thereof due to the P-type substrate 72 and the P-type region 75 of the reverse conductivity type in contact with the lower surface and the overall outer peripheral surface thereof respectively.

An element isolation film 76 (omitted in FIG. 5) as an insulating film made of silicon oxide, for example, is formed on the surface of the epitaxial layer 73. The element isolation film 76 is a film partitioning regions (active regions) of the epitaxial layer 73 for forming elements. The element isolation film 76 covers the overall surface of the N-type region 74, and is formed over the N-type region 74 and the surface of the P-type region 75.

A resistive element 77 made of polysilicon is formed on the element isolation film 76. The resistive element 77 is an element partially forming an internal circuit of the semiconductor device 71 and performing current limitation and voltage division in the internal circuit, for example. The resistive element 77 is generally rectangular (oblong) in plan view. The resistive element 77 is arranged to be entirely opposed to the N-type region 74 through the element isolation film 76. More specifically, the resistive element 77 is arranged on a portion of the element isolation film 76 in contact with the N-type region 74, so that the distances between the corners of the portion and those of the N-type region 74 are generally constant.

A first interlayer dielectric film 78 (omitted in FIG. 5) made of silicon oxide, for example, is laminated on the epitaxial layer 73. The first interlayer dielectric film 78 covers the element isolation film 76 and the resistive element 77.

A plurality of contact holes 79, generally rectangular in plan view, passing through the interlayer dielectric film 78 in the thickness direction are formed in the first interlayer dielectric film 78. Five pairs of contact holes 79 are provided on both end portions, opposed to each other, of the resistive element 77 in the longitudinal direction (the right-and-left direction in FIG. 5) respectively. The pairs of contact holes 79 are arranged to be opposed to one another in the longitudinal direction of the resistive element 77.

Contact plugs 80 made of a conductive material are embedded in the contact holes 79 respectively. The contact plugs 80 are in contact with the resistive element 77 on the surfaces of the end portions of the resistive element 77 respectively. Thus, the contact plugs 80 are electrically connected to the resistive element 77.

A pair of first wires 81 are formed on the first interlayer dielectric film 78. The first wires 81 are generally rectangularly patterned in plan view, to be inside the N-type region 74 in plan view. In other words, the first wires 81 do not overlap with the P-type region 75 in plan view. About halves of the first wires 81 in the width direction parallel to the longitudinal direction of the resistive element 77 overlap with the end portions of the resistive element 77 in the longitudinal direction respectively, and the overlapping portions collectively cover the contact plugs 80. Thus, the first wires 81 are electrically connected to the contact plugs 80 respectively.

A second interlayer dielectric film 82 (omitted in FIG. 5) made of silicon oxide, for example, is laminated on the first interlayer dielectric film 78. The second interlayer dielectric film 82 covers the first wires 81.

A plurality of contact holes 83 generally rectangular in plan view are formed in the second interlayer dielectric film 82 to pass through the second interlayer dielectric film 82 in the thickness direction. Five pairs of contact holes 83 are provided outside the contact holes 79 in the longitudinal direction of the resistive element 77 on portions opposed to the pair of first wires 81 respectively. The pairs of contact holes 83 are arranged to be opposed to one another in the longitudinal direction of the resistive element 77.

Contact plugs 84 made of a conductive material are embedded in the contact holes 83 respectively. The contact plugs 84 are in contact with the corresponding first wires 81 on the surfaces thereof respectively. Thus, the contact plugs 84 are electrically connected to the first wires 81.

A pair of second wires 85 are formed on the second interlayer dielectric film 82. The second wires 85 are generally rectangularly patterned in plan view, to extend over the inside and outside of the N-type region 74 in plan view. Inother words, the second wires 85 integrally have first portions 86 overlapping with the N-type region 74 in plan view and second portions 87 overlapping not with the N-type region 74 but with the P-type region 75 along the longitudinal direction of the resistive element 77. The first portions 86 of the second wires 85 collectively cover the contact plugs 84. Thus, the second wires 85 are electrically connected to the contact plugs 84. One of the second wires 85 is electrically connected to an external power source through a wire 88, while the other second wire 85 is electrically connected to another element (an active element) through a wire 89.

In the semiconductor device 71, a high voltage of several 100 V is applied to the resistive element 77 from the external power source through the wire 88. On the other hand, the P-type substrate 72 is set to the ground potential (0 V).

In the semiconductor device 71, the P-type substrate 72 is provided under the N-type region 74, and the P-type region 75 is formed on the side portions thereof. The N-type region 74 electrically floats from the periphery thereof due to the P-type substrate 72 and the P-type region 75 of the reverse conductivity type in contact with the lower surface and the overall outer peripheral surface thereof respectively. The resistive element 77 is arranged to be entirely opposed to the N-type region 74 through the element isolation film 76 in plan view. Therefore, the resistive element 77 is opposed to a depletion layer 90 spreading in the P-type substrate 72, the N-type region 74 and the P-type region 75 through the element isolation film 76.

Thus, a voltage applied between the P-type substrate 72 and the resistive element 77 is dispersed to the depletion layer 90. Therefore, a voltage applied to the element isolation film 76 following voltage application to the resistive element 77 can be reduced. Even if a high voltage is applied to the resistive element 77, the high voltage can be partially dispersed to the depletion layer 90, whereby dielectric breakdown of the element isolation film 76 can be suppressed. Consequently, the withstand voltage against dielectric breakdown of the element isolation film 76 can be improved without increasing the thickness of the element isolation film 76. Further, the thickness of the element isolation film 76 may not be increased, whereby the degree of integration of active elements and other passive elements provided along with the resistive element 77 can also be increased by properly designing the thickness of the element isolation film 76.

Further, the plurality of interlayer dielectric films (the first interlayer dielectric film 78 and the second interlayer dielectric film 82) are interposed between the wires opposed to the P-type region 75 in plan view, i.e., the second portions 87 of the second wires 85 and the P-type region 75.

In a high withstand voltage semiconductor device to which a high voltage is applied, the conductivity type of a semiconductor layer provided under an internal wire is easily reversed when a high voltage is applied to the internal wire, due to an influence exerted by an electric field resulting from the voltage. When the conductivity type of the semiconductor layer is reversed, a leakage current or the like is disadvantageously generated.

When the plurality of interlayer dielectric films (the first interlayer dielectric film 78 and the second interlayer dielectric film 82) are interposed between the second portions 87 and the P-type region 75 as in the semiconductor device 71, the distance between the second portions 87 and the P-type region 75 can be increased. Even if a high voltage is applied to the second wires 85, therefore, an influence exerted on the P-type region 75 by an electric field can be reduced. Consequently, reversal of the conductivity type of the P-type region 75 can be suppressed.

FIGS. 7A to 7K are schematic sectional views successively showing the steps of a method for producing the semiconductor device 71 shown in FIG. 5.

Figure 7A:
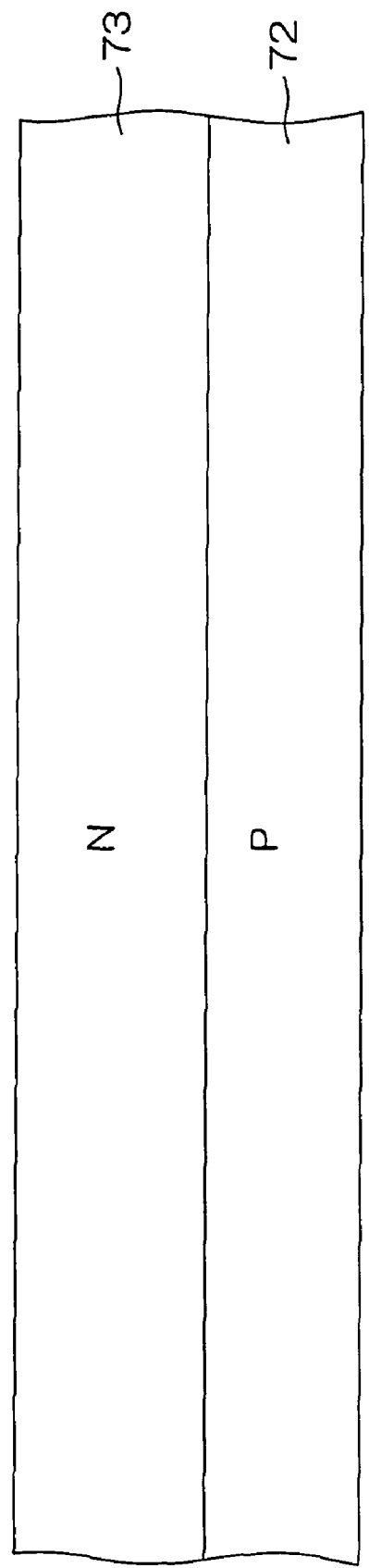

First, the epitaxial layer 73 is formed on the P-type substrate 72 by epitaxy, as shown in FIG. 7A.

Figure 7B:
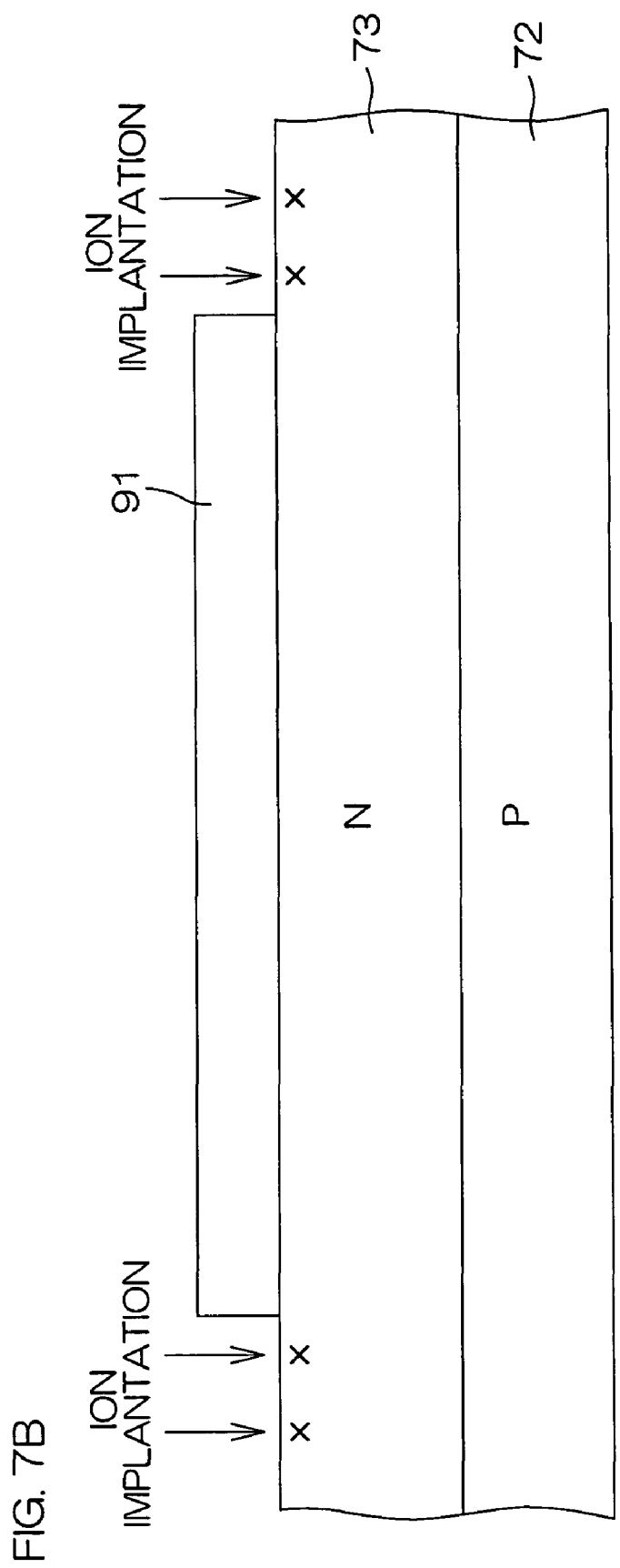
Figure 7C:
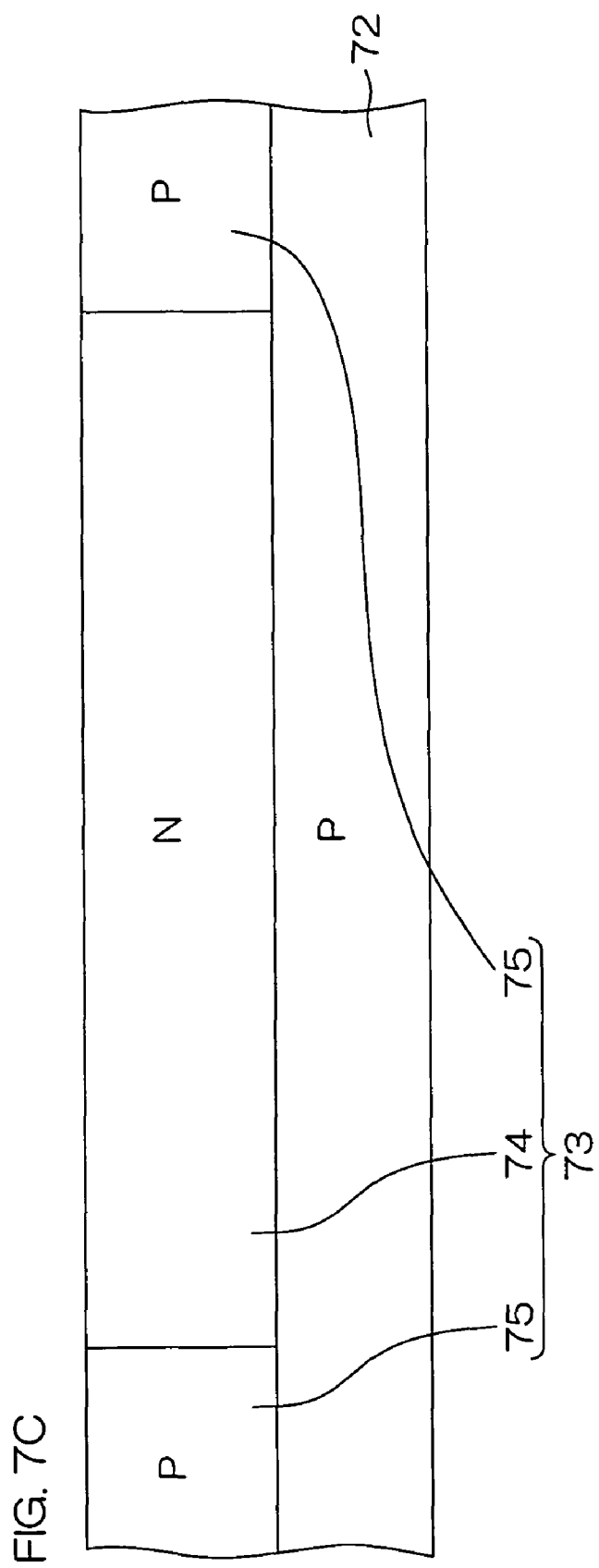

Then, a mask 91 having an opening opposed to a portion for forming the P-type region 75 is formed on the epitaxial layer 73 by photolithography, as shown in FIG. 7B. A P-type impurity is implanted into the epitaxial layer 73 from the surface thereof through the mask 91. A heat treatment is performed for diffusing the P-type impurity, whereby the P-type region 75 is formed in the epitaxial layer 73 and the N-type region 74 is formed inside the P-type region 75, as shown in FIG. 7C.

Figure 7D:
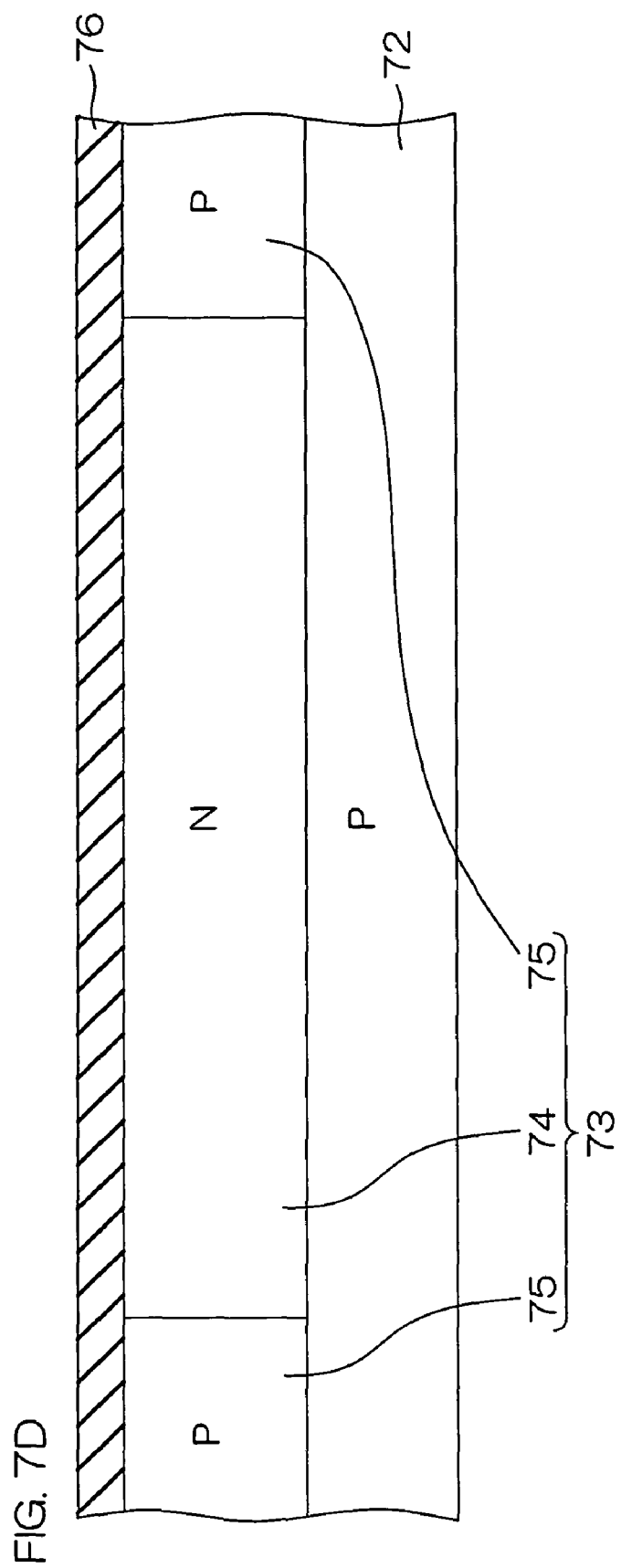

Then, a sacrificial oxide film (not shown) made of $SiO_2$ (silicon oxide) is formed on the surface of the epitaxial layer 73 by thermal oxidation. Thereafter a hard mask (not shown) having an opening in a portion opposed to a portion for forming the element isolation film 76 is formed by forming a sacrificial nitride film made of SiN (silicon nitride) on the sacrificial oxide film by P-CVD (Plasma Chemical Vapor Deposition) or LP-CVD (Low Pressure Chemical Vapor Deposition) and patterning the sacrificial nitride film. Then, a portion of the epitaxial layer 73 exposed from the opening is thermally oxidized, whereby the element isolation film 76 is formed on the surface of the epitaxial layer 73, as shown in FIG. 7D. After the formation of the element isolation film 76, the hard mask is removed from the epitaxial layer 73.

Then, a polysilicon film 92 is deposited on the epitaxial layer 73 by LP-CVD, as shown in FIG. 7E. The element isolation film 76 is covered with the polysilicon film 92.

After the formation of the polysilicon film 92, a mask 93 having an opening opposed to a portion for forming the resistive element 77 is formed on the polysilicon film 92 by photolithography, as shown in FIG. 7F. Then, a P-type impurity is implanted into the polysilicon film 92 from the surface thereof through the mask 93. After the implantation of the P-type impurity, the mask 93 is removed.

Then, a mask 94 having openings in regions different from that opposed to the portion for forming the resistive element 77 is formed by photolithography, as shown in FIG. 7G. Unnecessary portions (portions other than that corresponding to the resistive element 77) of the polysilicon film 92 are removed by etching the portions of the polysilicon film 92 exposed from the openings of the mask 94. Thus, the resistive element 77 is formed. After the formation of the resistive element 77, the mask 94 is removed.

Figure 7H:
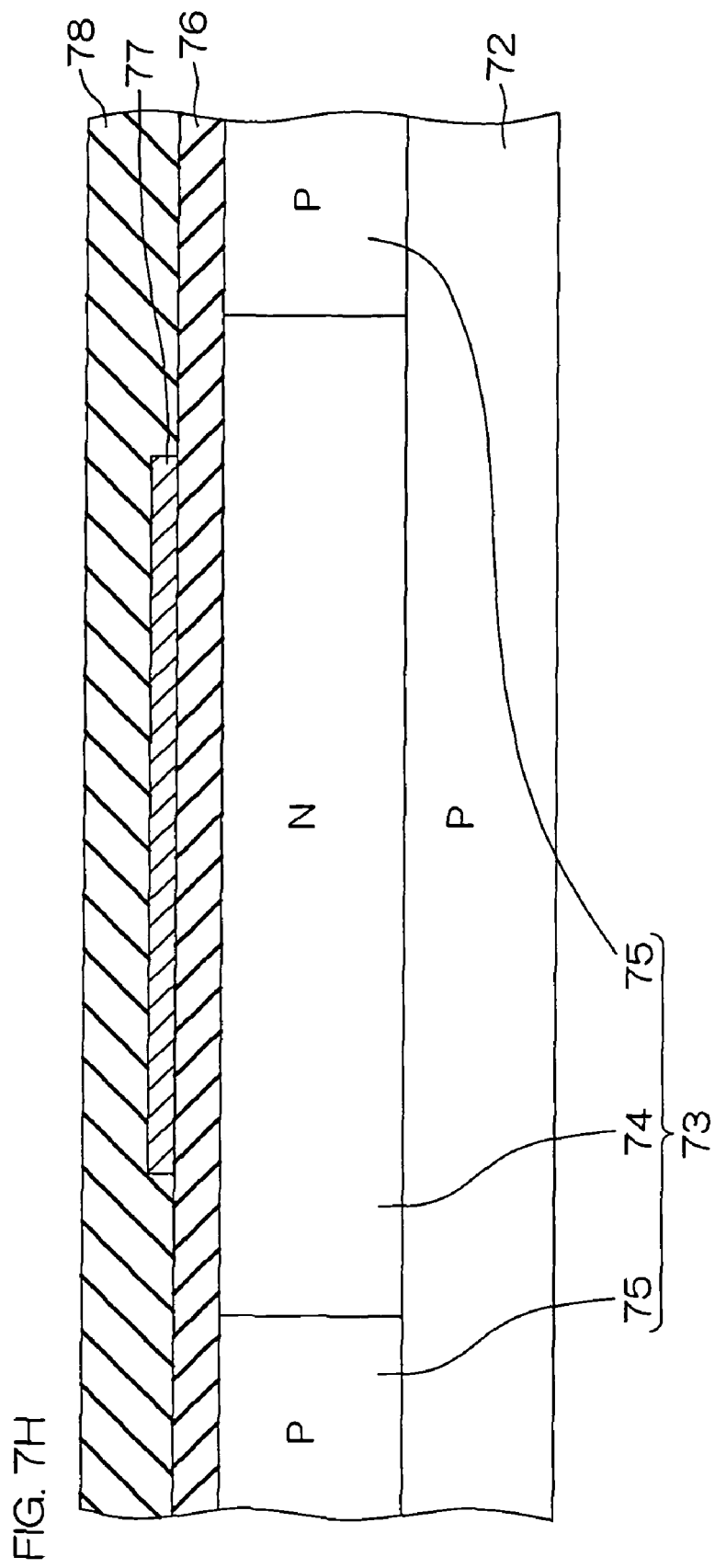

Thereafter the first interlayer dielectric film 78 is laminated on the epitaxial layer 73 by CVD, as shown in FIG. 7H. The resistive element 77 and the element isolation film 76 are covered with the first interlayer dielectric film 78.

Figure 7I:
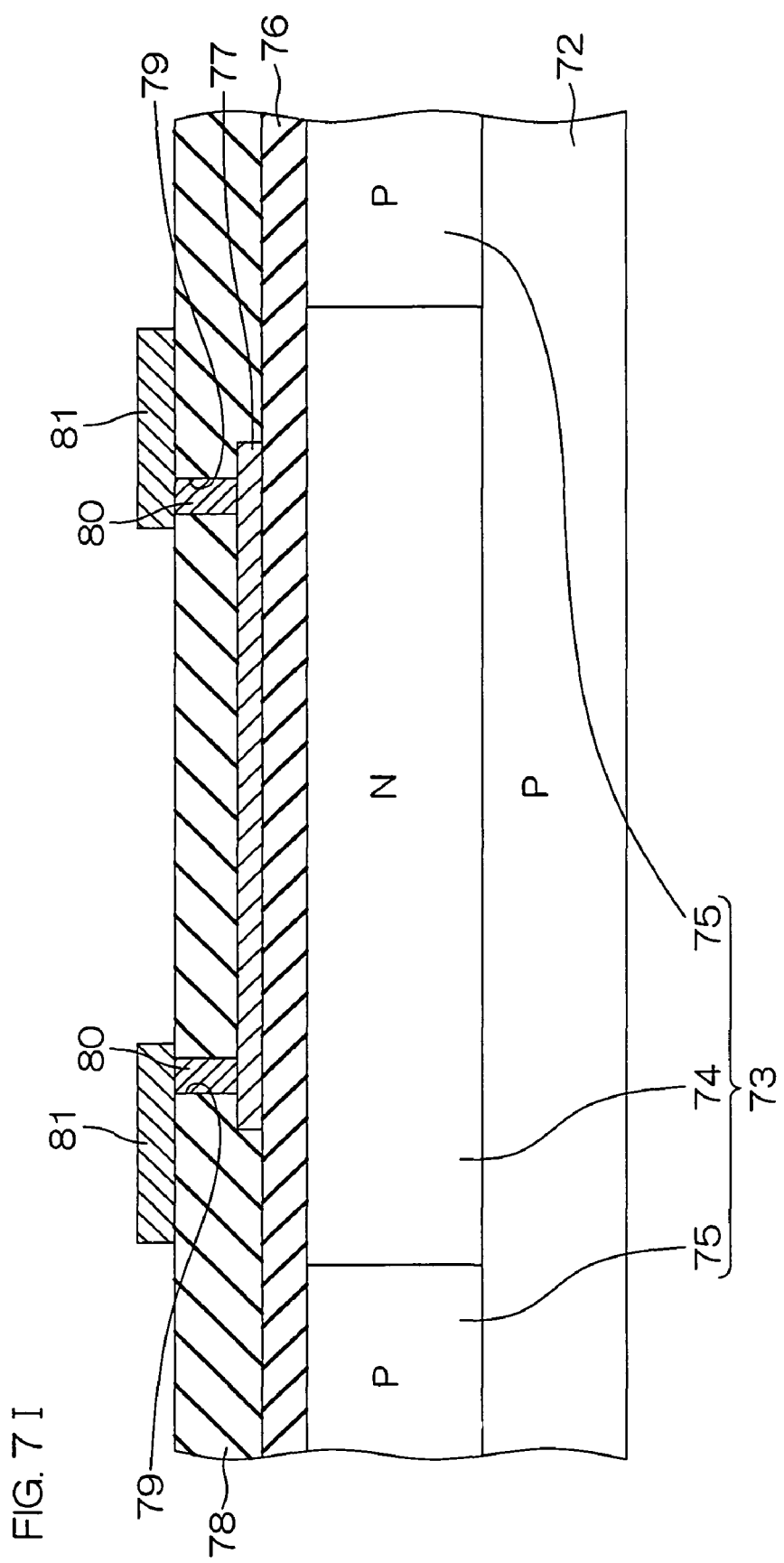

Then, a mask (not shown) having openings opposed to portions for forming the contact holes 79 respectively is formed on the first interlayer dielectric film 78 by photolithography. Then, the contact holes 79 are formed in the first interlayer dielectric film 78 by etching through the mask, as shown in FIG. 7I. After the formation of the contact holes 79, the mask is removed from the first interlayer dielectric film 78.

Then, a conductive material is bonded onto the first interlayer dielectric film 78 by sputtering. The conductive material is bonded (deposited) to fill up the contact holes 79 and to form a thin film on the first interlayer dielectric film 78. The thin film of the conductive material formed on the first interlayer dielectric film 78 is patterned by photolithography and etching. Thus, the contact plugs 80 and the first wires 81 are formed, as shown in FIG. 7I.

Figure 7J:
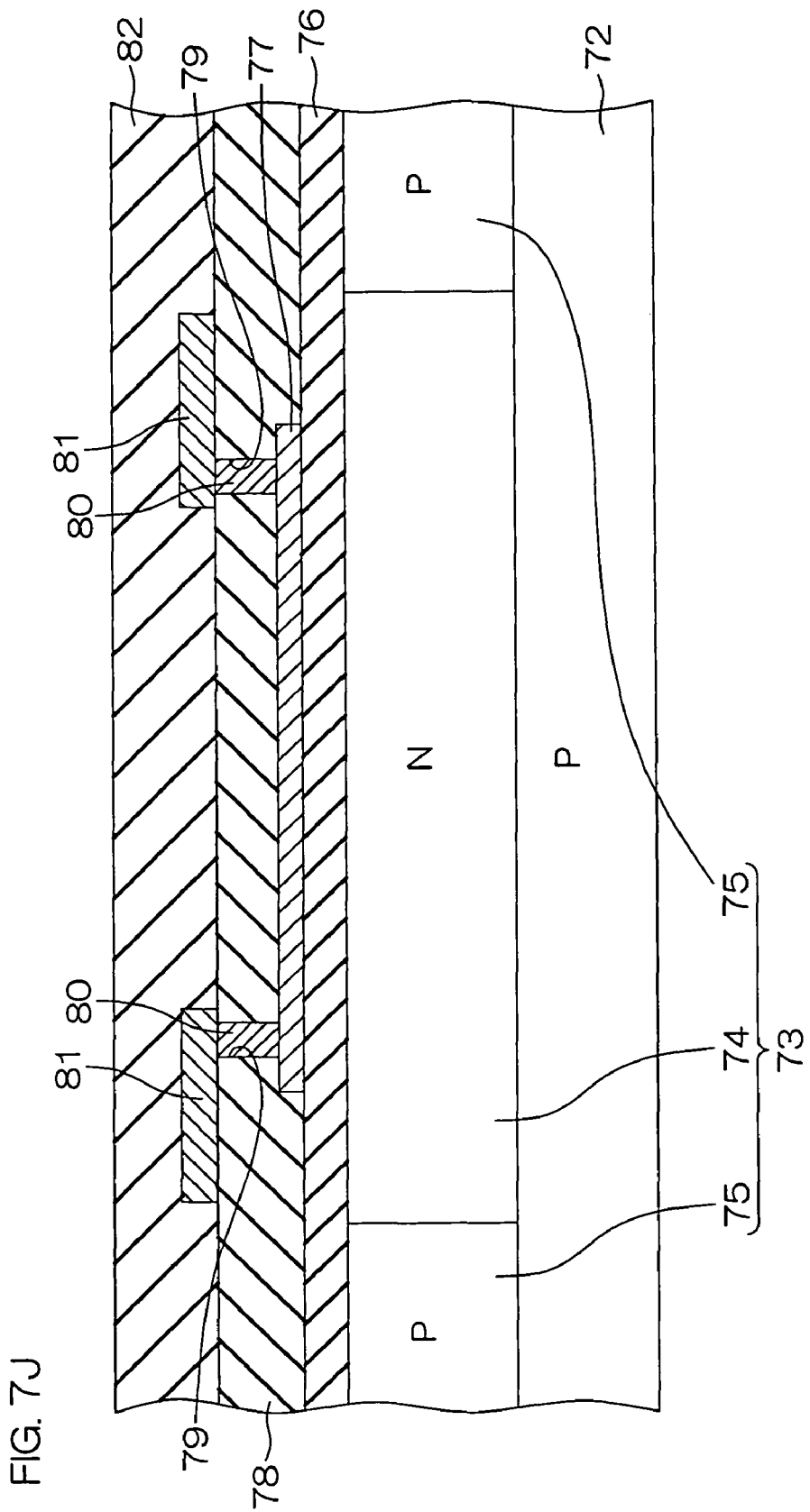

Thereafter the second interlayer dielectric film 82 is laminated on the first interlayer dielectric film 78 by CVD, as shown in FIG. 7J. The first wires 81 are covered with the second interlayer dielectric film 82.

Figure 7K:
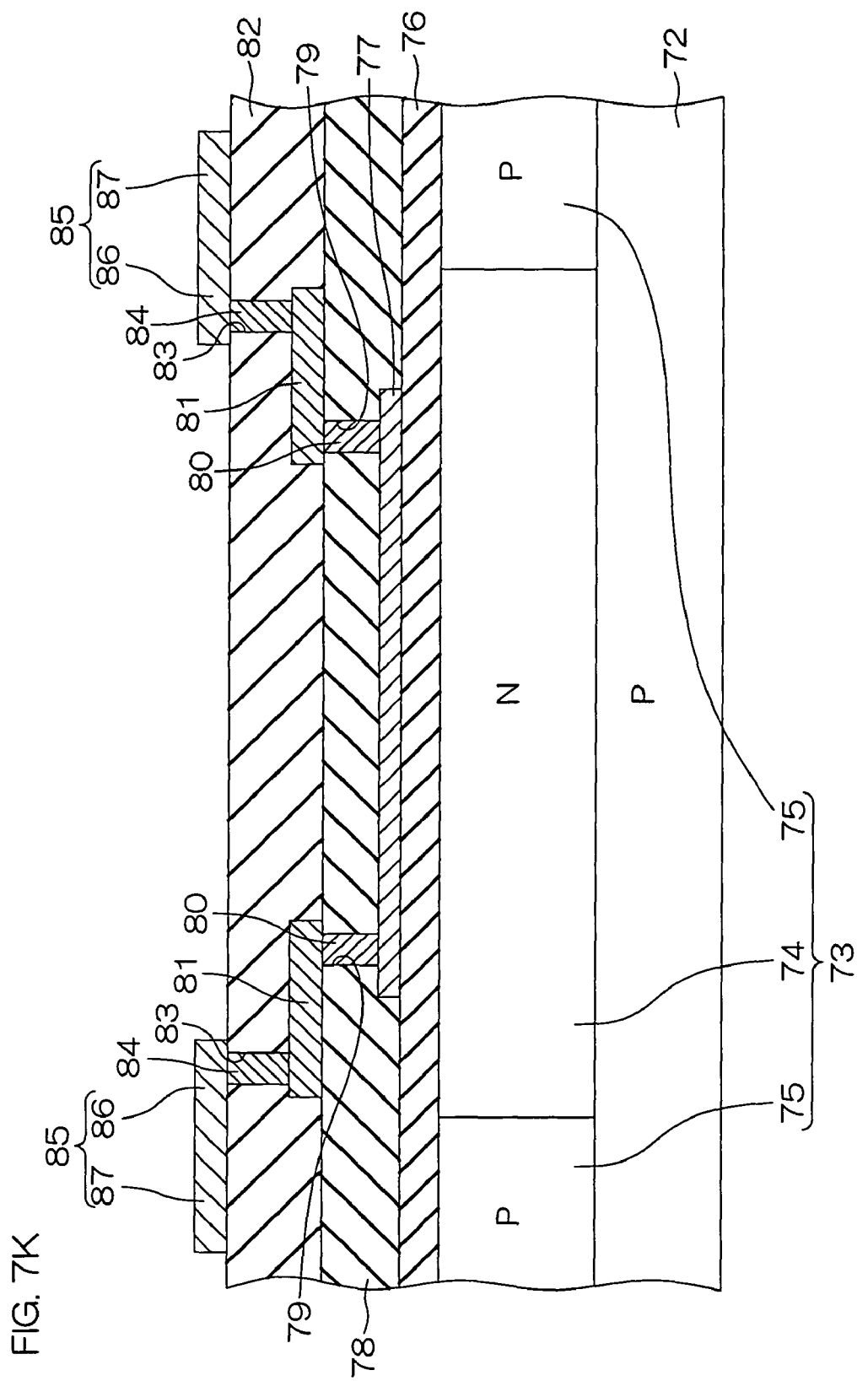

Then, a mask (not shown) having openings opposed to portions for forming the contact holes 83 respectively is formed on the second interlayer dielectric film 82 by photolithography. Then, the contact holes 83 are formed in the second interlayer dielectric film 82 by etching through the mask, as shown in FIG. 7K. After the formation of the contact holes 83, the mask is removed from the second interlayer dielectric film 82.

Then, a conductive material is bonded onto the second interlayer dielectric film 82 by sputtering. The conductive material is bonded (deposited) to fill up the contact holes 83 and to form a thin film on the second interlayer dielectric film 82. The thin film of the conductive material formed on the second interlayer dielectric film 82 is patterned by photolithography and etching. Thus, the contact plugs 84 and the second wires 85 having the first portions 86 and the second portions 87 are formed, as shown in FIG. 7K. The semiconductor device 71 shown in FIG. 5 is obtained through the aforementioned steps.

Figure 8:
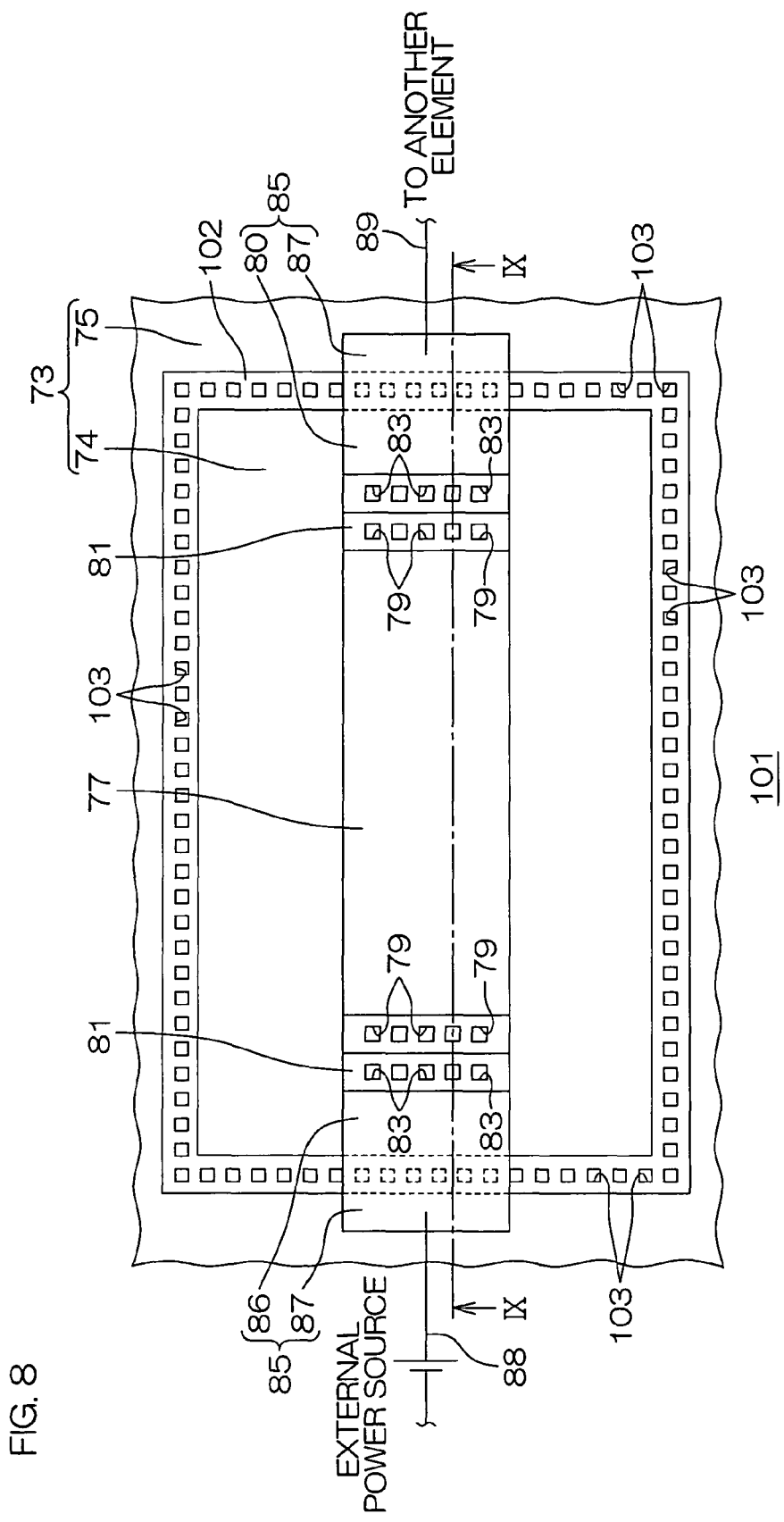
FIG. 8 is a plan view enlargedly showing a region provided with a resistive element and the vicinity thereof in a semiconductor device according to a fourth embodiment of the present invention.
Figure 9:
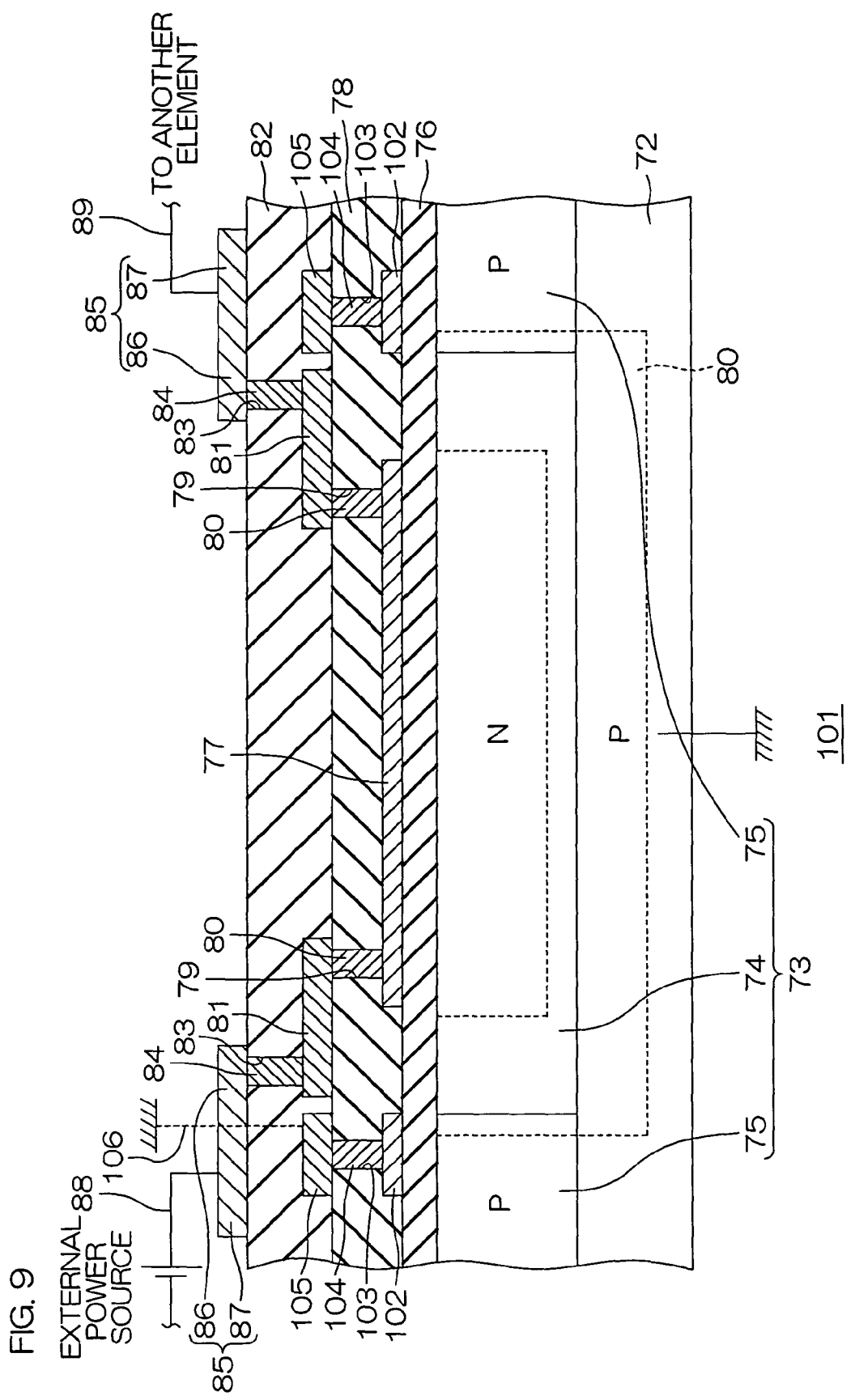
FIG. 9 is a sectional view taken along a line IX-IX in FIG. 8.

FIG. 8 is a plan view enlargedly showing a region provided with a resistive element and the vicinity thereof in a semiconductor device according to a fourth embodiment of the present invention. FIG. 9 is a sectional view taken along a line IX-IX in FIG. 8. Referring to FIGS. 8 and 9, portions corresponding to those shown in FIG. 5 or 6 are denoted by reference numerals identical to those of the portions. In the following, redundant description is omitted as to the portions denoted by the same reference numerals.

In a semiconductor device 101, a first guard ring 102 corresponding to a P-type region 75 is formed on an element isolation film 76. In other words, the first guard ring 102 is shaped into a rectangular ring surrounding a resistive element 77 in plan view along the outer periphery of an N-type region 74. Thus, the first guard ring 102 is opposed to the P-type region 75 through the element isolation film 76. The first guard ring 12 is made of a material (polysilicon) identical to that for the resistive element 77.

A large number of bridging holes 103 generally rectangular in plan view are formed in the first interlayer dielectric film 78 to pass through the first interlayer dielectric film 78 in the thickness direction. The large number of bridging holes 103 are provided in portions opposed to the first guard ring 102. The bridging holes 103 are alignedly arranged in the form of a rectangular ring correspondingly to the shape of the first guard ring 102.

Bridge plugs 104 made of a conductive material are embedded in the bridging holes 103 respectively. The bridge plugs 104 for bridging the first guard ring 102 and a ground guard ring 105 described later are in contact with the first guard ring 102 on the surface of the first guard ring 102. Thus, the bridge plugs 104 are electrically connected to the first guard ring 102.

The ground guard ring 105 for setting the first guard ring 102 to the ground potential (0 V) is formed on the first interlayer dielectric film 78. The ground guard ring 105 is shaped into a rectangular ring in plan view, generally identically to the first guard ring 102. The ground guard ring 105 is arranged to generally match with the first guard ring 102 in plan view, and collectively covers the bridge plugs 104. Thus, the ground guard ring 105 is electrically connected to the bridge plugs 104. The ground guard ring 105 is electrically connected to a grounded ground wire 106, to be set to the ground potential. When the ground wire 106 is connected to the ground guard ring 105, the first guard ring 102 electrically connected to the ground guard ring 105 through the bridge plugs 104 is also set to the ground potential.

The remaining structure and operations of the semiconductor device 101 are similar to those of the semiconductor device 71 according to the third embodiment.

In the semiconductor device 101, the first guard ring 102 is formed on a portion of the element isolation film 76 opposed to the P-type region 75. The first guard ring 102 is set to the ground potential following grounding of the ground guard ring 105.

Even if a high voltage is applied to second wires 85, therefore, an influence exerted on the P-type region 75 by an electric field can be further reduced. Consequently, reversal of the conductivity type of the P-type region 75 can be further suppressed.

The first guard ring 102 is formed on the element isolation film 76 by the same material (polysilicon) as that for the resistive element 77. In the steps for producing the semiconductor device 101 described later, therefore, the resistive element 77 and the first guard ring 102 can be prepared in the same steps (see FIGS. 10F and 10G). Consequently, no additional step may be separately provided for preparing the first guard ring 102, whereby the steps for producing the semiconductor device 101 can be simplified.

FIGS. 10A to 10K are schematic sectional views successively showing the steps of a method for producing the semiconductor device 101 shown in FIG. 8.

First, an epitaxial layer 73 is formed on a P-type substrate 72 by epitaxy, as shown in FIG. 10A.

Figure 10B:
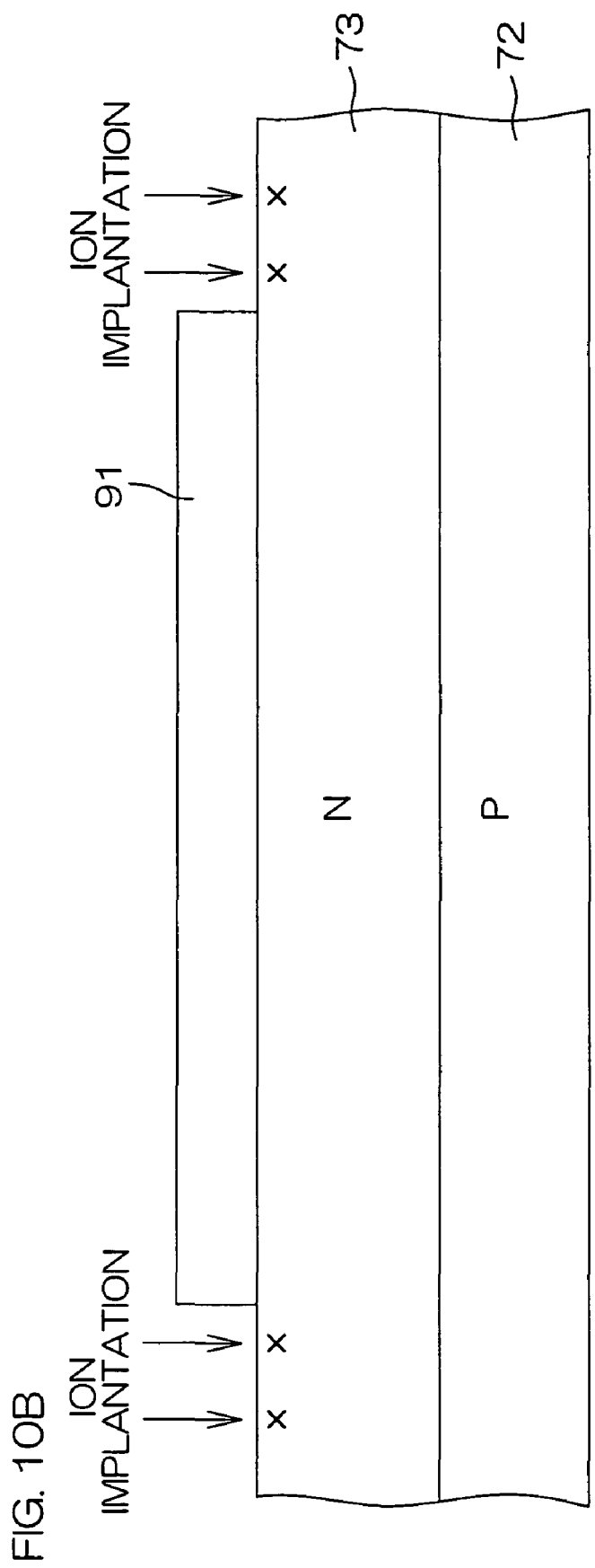
FIGS. 10A to 10K are schematic sectional views successively showing the steps of a method for producing the semiconductor device shown in FIG. 8.
Figure 10C:
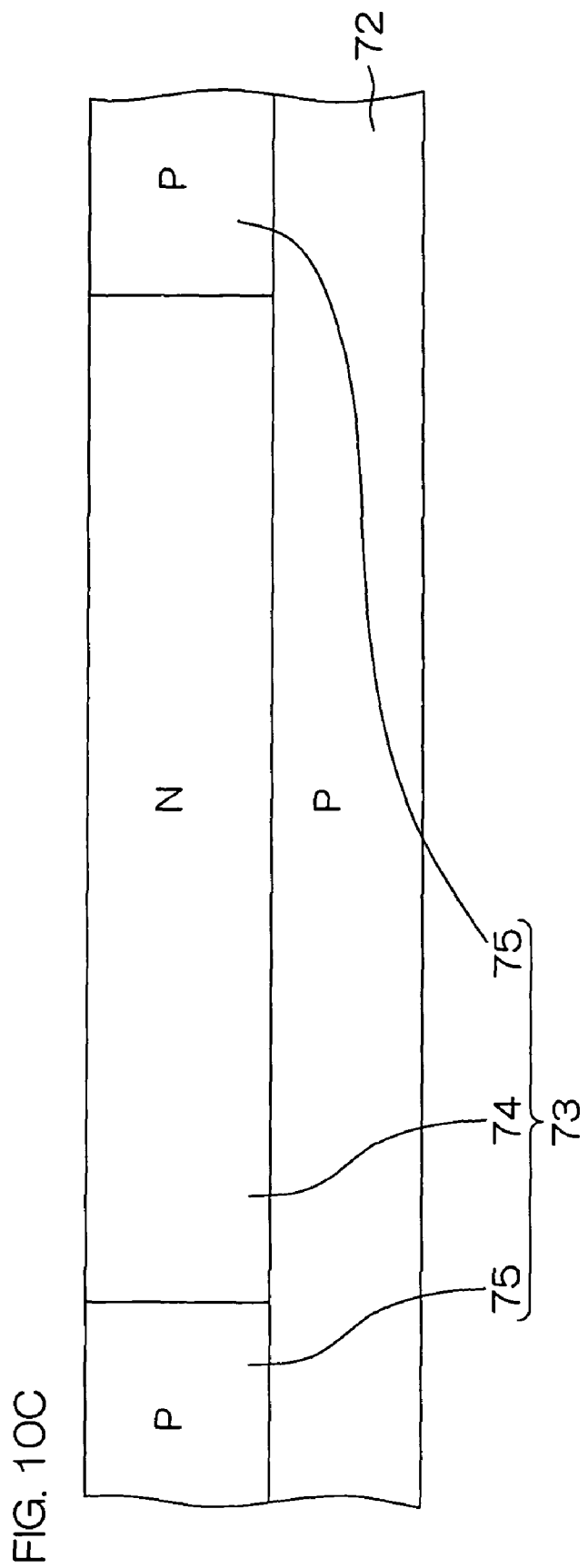

Then, a mask 91 having an opening opposed to a portion for forming the P-type region 75 is formed on the epitaxial layer 73 by photolithography, as shown in FIG. 10B. A P-type impurity is implanted into the epitaxial layer 73 from the surface thereof through the mask 91. A heat treatment is performed for diffusing the P-type impurity, whereby the P-type region 75 is formed in the epitaxial layer 73 and the N-type region 74 is formed inside the P-type region 75, as shown in FIG. 10C.

Figure 10D:
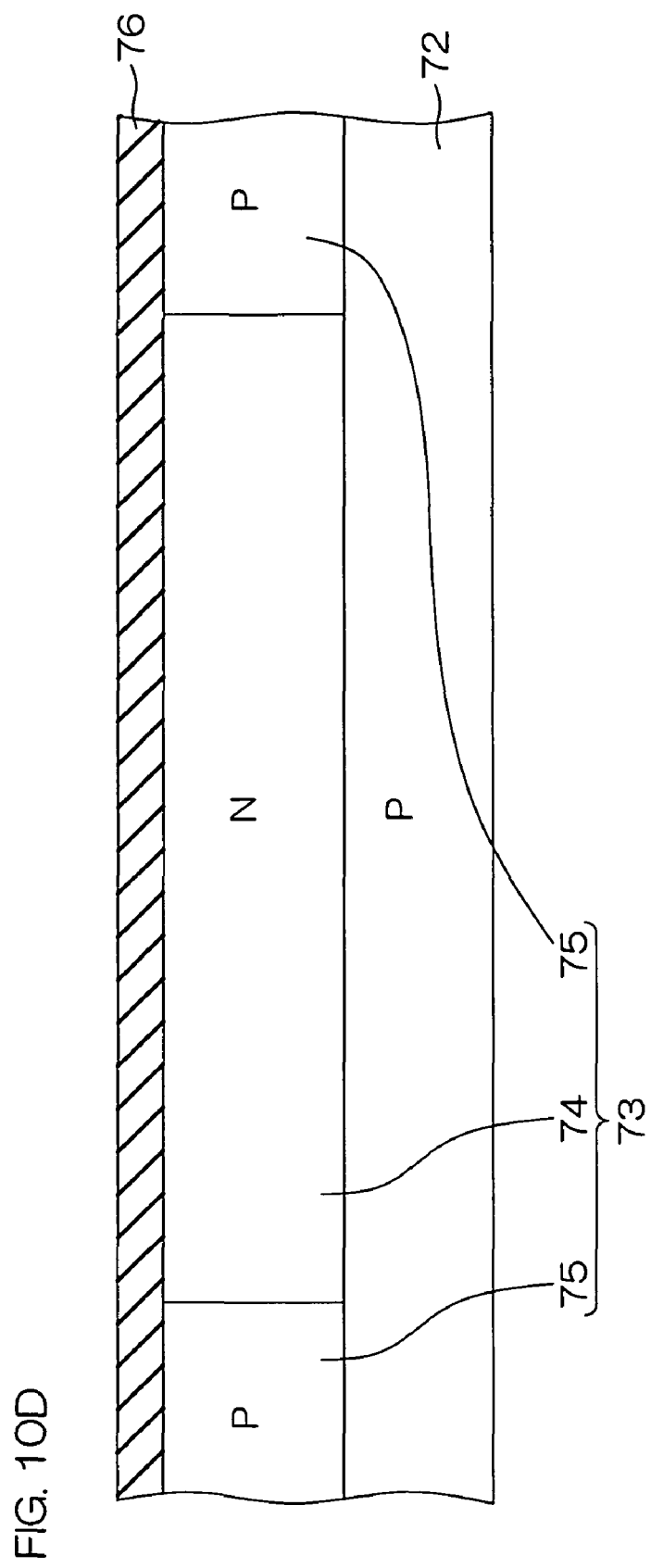

Then, a sacrificial oxide film (not shown) made of $SiO_2$ (silicon oxide) is formed on the surface of the epitaxial layer 73 by thermal oxidation. Thereafter a hard mask (not shown) having an opening in a portion opposed to a portion for forming the element isolation film 76 is formed by forming a sacrificial nitride film made of SiN (silicon nitride) on the sacrificial oxide film by P-CVD (Plasma Chemical Vapor Deposition) or LP-CVD (Low Pressure Chemical Vapor Deposition) and patterning the sacrificial nitride film. Then, a portion of the epitaxial layer 73 exposed from the opening is thermally oxidized, whereby the element isolation film 76 is formed on the surface of the epitaxial layer 73, as shown in FIG. 10D. After the formation of the element isolation film 76, the hard mask is removed from the epitaxial layer 73.

Then, a polysilicon film 92 is deposited on the epitaxial layer 73 by LP-CVD, as shown in FIG. 10E. The element isolation film 76 is covered with the polysilicon film 92.

After the formation of the polysilicon film 92, a mask 107 having openings opposed to portions for forming the resistive element 77 and the first guard ring 102 respectively is formed on the polysilicon film 92 by photolithography, as shown in FIG. 10F. A P-type impurity is implanted into the polysilicon film 92 from the surface thereof through the mask 107. After the implantation of the P-type impurity, the mask 107 is removed.

Then, a mask 108 having openings in regions different from those opposed to the portions for forming the resistive element 77 and the first guard ring 102 is formed by photolithography, as shown in FIG. 10G. Then, unnecessary portions (portions other than those corresponding to the resistive element 77 and the first guard ring 102) of the polysilicon film 92 are removed by etching portions of the polysilicon film 92 exposed from the openings of the mask 108. Thus, the resistive element 77 and the first guard ring 102 are formed. After the formation of the resistive element 77 and the first guard ring 102, the mask 108 is removed.

Figure 10H:
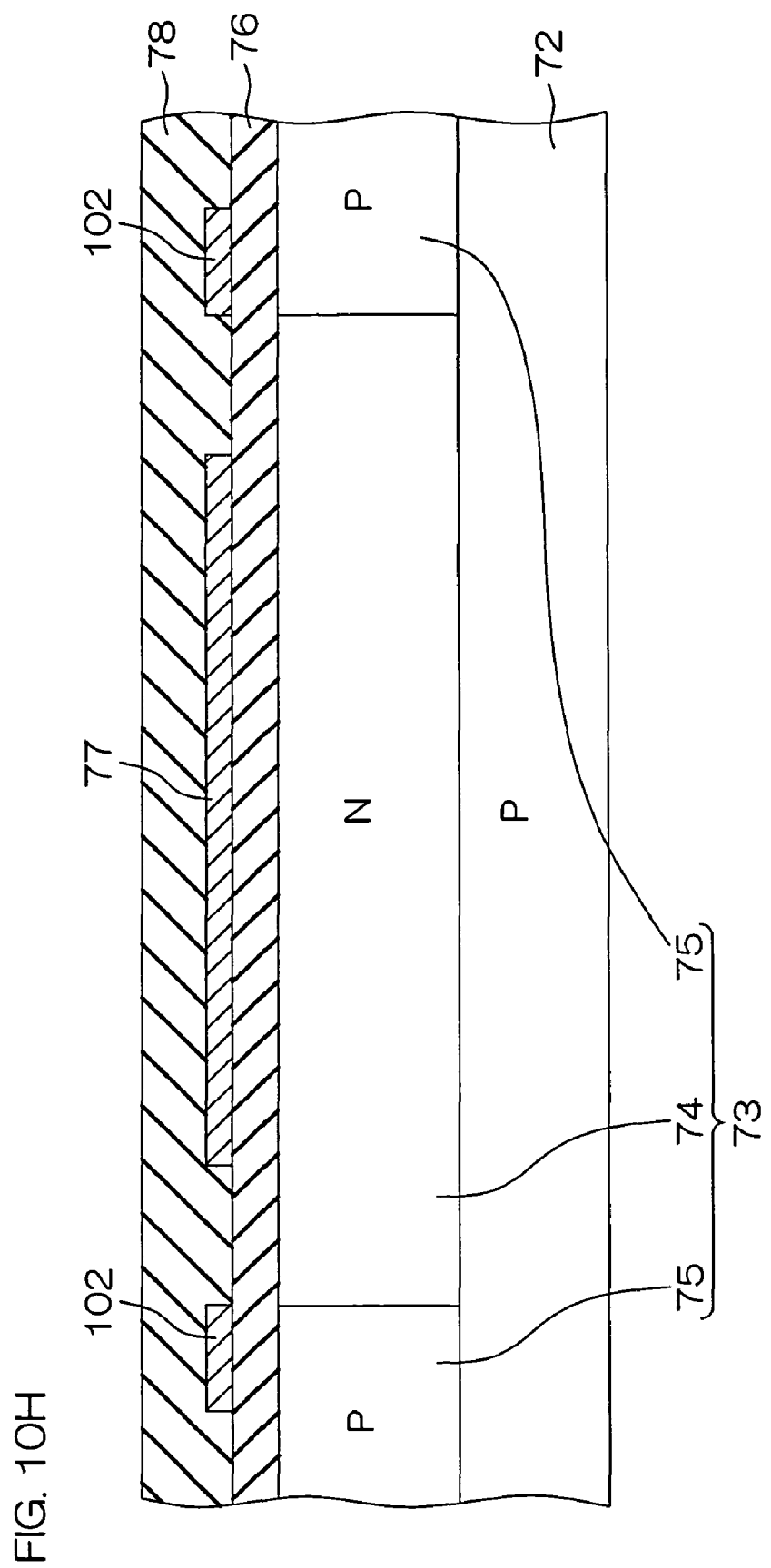

Thereafter the first interlayer dielectric film 78 is laminated on the epitaxial layer 73 by CVD, as shown in FIG. 10H. The resistive element 77, the first guard ring 102 and the element isolation film 76 are covered with the first interlayer dielectric film 78.

Figure 10:
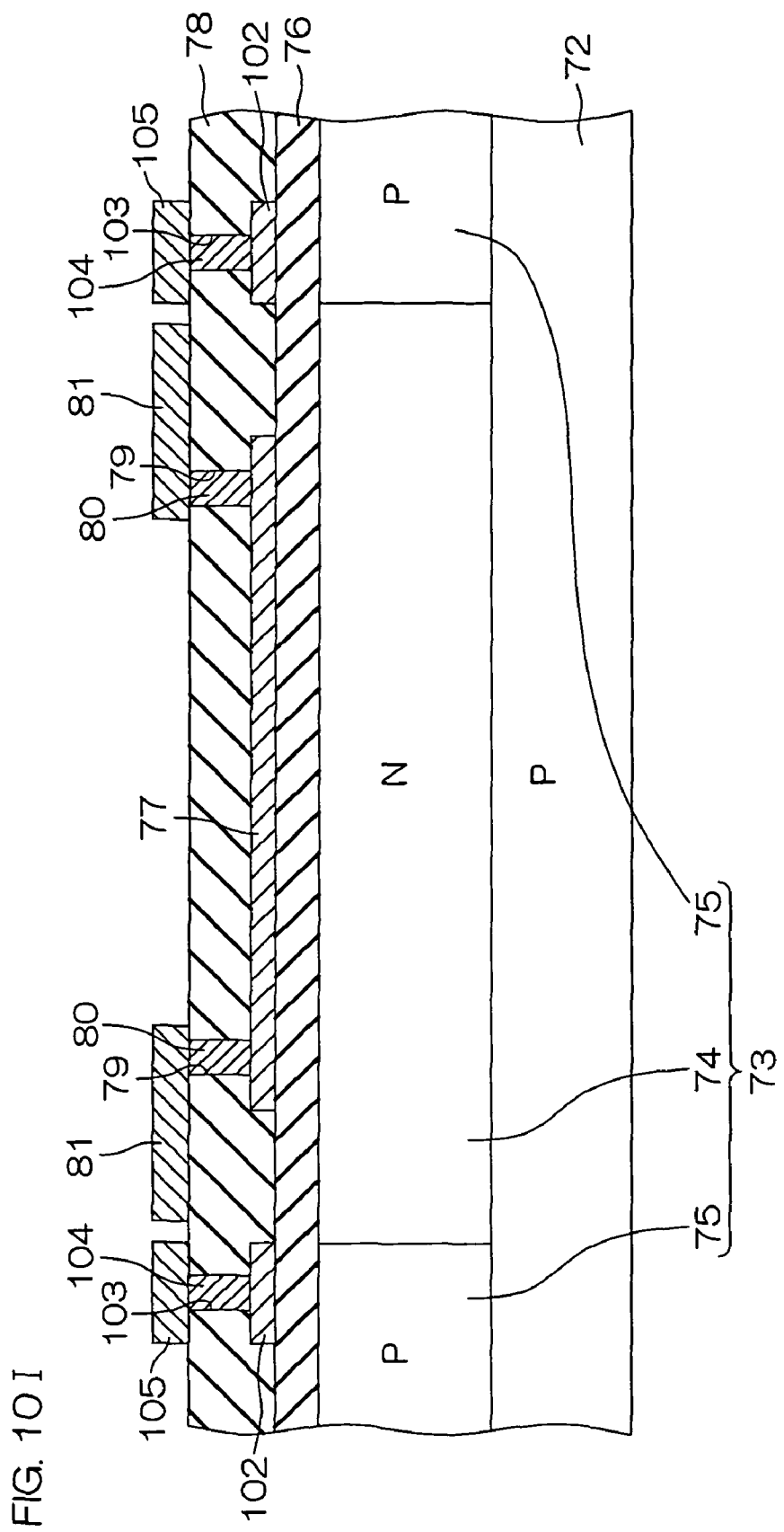

Then, a mask (not shown) having openings opposed to portions for forming the contact holes 79 and the bridging holes 103 respectively is formed on the first interlayer dielectric film 78 by photolithography. Then, the contact holes 79 and the bridging holes 103 are formed in the first interlayer dielectric film 78 by etching through the mask, as shown in FIG. 10. After the formation of the contact holes 79 and the bridging holes 103, the mask is removed from the first interlayer dielectric film 78.

Then, a conductive material is bonded onto the first interlayer dielectric film 78 by sputtering. The conductive material is bonded (deposited) to fill up the contact holes 79 and the bridging holes 103 and to form a thin film on the first interlayer dielectric film 78. The thin film of the conductive material formed on the first interlayer dielectric film 78 is patterned by photolithography and etching. Thus, contact plugs 80 and first wires 81 as well as the bridging plugs 104 and the ground guard ring 105 are formed, as shown in FIG. 10I.

Figure 10J:
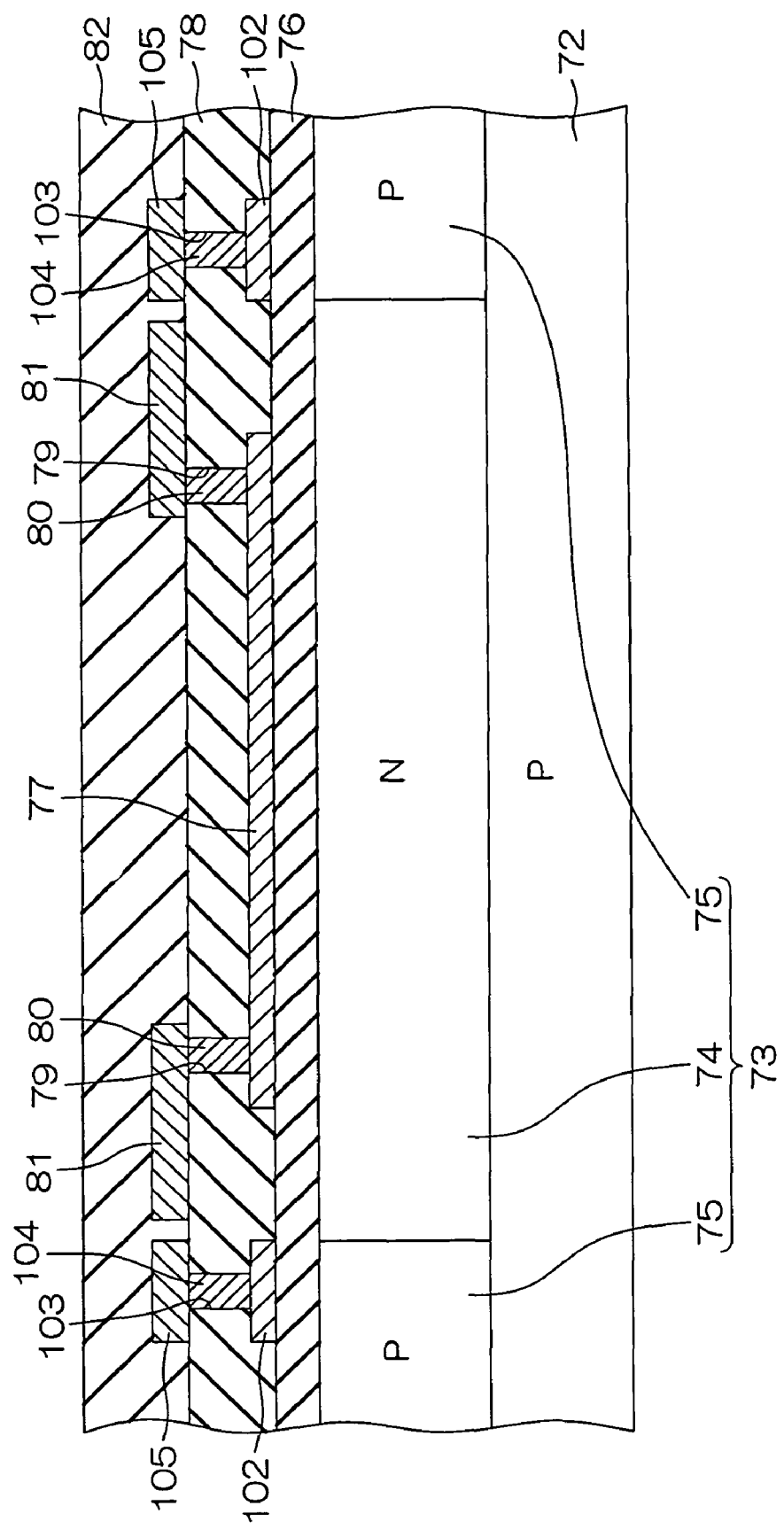

Thereafter a second interlayer dielectric film 82 is laminated on the first interlayer dielectric film 78 by CVD, as shown in FIG. 10J. The first wires 81 and the ground guard ring 105 are covered with the second interlayer dielectric film 82.

Then, a mask (not shown) having openings opposed to portions for forming contact holes 83 respectively is formed on the second interlayer dielectric film 82 by photolithography. The contact holes 83 are formed in the second interlayer dielectric film 82 by etching through the mask, as shown in FIG. 10K. After the formation of the contact holes 83, the mask is removed from the second interlayer dielectric film 82.

Then, a conductive material is bonded onto the second interlayer dielectric film 82 by sputtering. The conductive material is bonded (deposited) to fill up the contact holes 83 and to form a thin film on the second interlayer dielectric film 82. Then, the thin film of the conductive material formed on the second interlayer dielectric film 82 is patterned by photolithography and etching. Thus, contact plugs 84 and the second wires 85 having first portions 86 and second portions 87 are formed, as shown in FIG. 10K. The semiconductor device 101 shown in FIG. 8 is obtained through the aforementioned steps.

Figure 11:
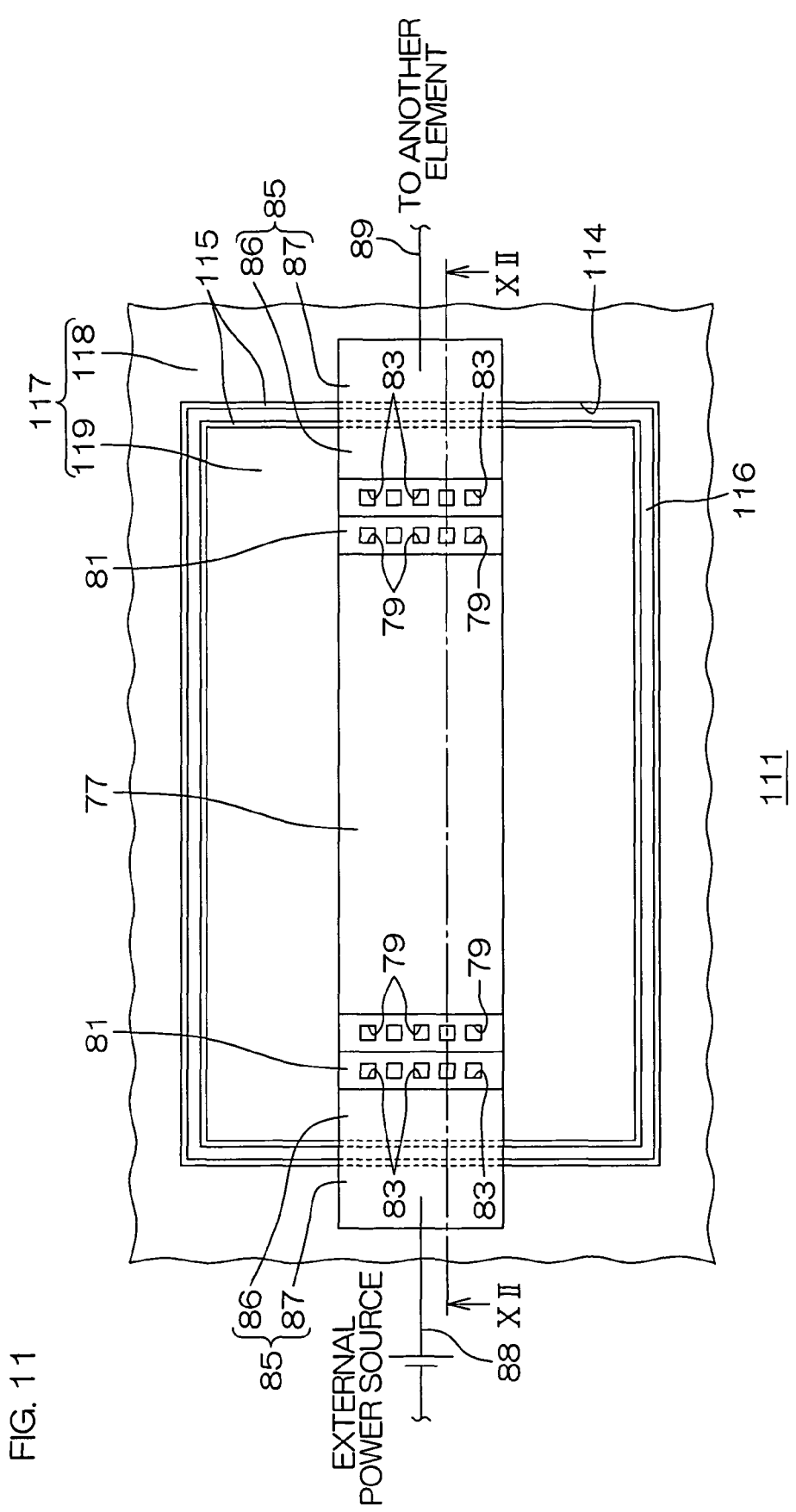
FIG. 11 is a plan view enlargedly showing a region provided with a resistive element and the vicinity thereof in a semiconductor device according to a fifth embodiment of the present invention.

FIG. 11 is a plan view enlargedly showing a region provided with a resistive element and the vicinity thereof in a semiconductor device according to a fifth embodiment of the present invention. FIG. 12 is a sectional view taken along a line XII-XII in FIG. 11. Referring to FIGS. 11 and 12, portions corresponding to those shown in FIG. 5 or 6 are denoted by reference numerals identical to those of the portions. In the following, redundant description is omitted as to the portions denoted by the same reference numerals.

A semiconductor device 111 includes a thick-film SOI substrate 112. The thick-film SOI substrate 112 has a structure obtained by laminating an N-type SOI layer 117 made of Si on a P-type substrate 121 as a semiconductor substrate through a BOX layer 113 made of $SiO_2$ as an insulating layer. In other words, the thick-film SOI substrate 112 has a multilayer structure having the BOX layer 113 provided under the SOI layer 117 and the P-type substrate 121 provided under the BOX layer 113.

A large number of active elements (transistors, diodes and the like; not shown) are provided on the surface layer portion of the SOI layer 117 as a semiconductor layer. A deep trench 114 in the form of a rectangular ring in plan view is formed in the SOI layer 117 to pass through the SOI layer 117 in the thickness direction. In other words, the SOI layer 117 is provided with the deep trench 114 in the form of a rectangular ring having a depth, reaching the BOX layer 113 from the surface thereof. Inner side surfaces of the deep trench 114 opposed to each other are covered with trench oxide films 115.

The inner sides of the trench oxide films 115 are filled up with an embedded body 116.

In the SOI layer 117, a regioen outside the deep trench 114 forms an N-type region 118 kept in the conductivity type of the thick-film SOI substrate 112. On the other hand, a region inside the deep trench 114 (a region surrounded by the deep trench 114) forms an N-type region 119 electrically floating (isolated) from the periphery thereof due to the BOX layer 113 and the deep trench 114 as a trench isolation region.

A LOCOS (LOcal Oxidation of Silicon) oxide film 124 as an insulating film is formed on the surface of the SOI layer 117. The LOCOS oxide film 124 covers the overall surface of the SOI layer 117.

A resistive element 77 made of polysilicon is formed on the LOCOS oxide film 124. The resistive element 77 is arranged to be entirely opposed to the N-type region 119 through the LOCOS oxide film 124. More specifically, the resistive element 77 is arranged on the LOCOS oxide film 124 so that the distances between the corners thereof and those of the N-type region 119 are generally constant.

A first interlayer dielectric film 125 made of silicon oxide, for example, is laminated on the SOI layer 117. The first interlayer dielectric film 125 covers the LOCOS oxide film 124 and the resistive element 77.

The remaining structure and operations of the semiconductor device 111 are similar to those of the semiconductor device 71 according to the third embodiment.

In the semiconductor device 111, the BOX layer 113 is provided under the N-type region 119, and the P-type substrate 121 is provided under the BOX layer 113. The deep trench 114 is formed on the side portions thereof, and the inner side surfaces of the deep trench 114 are covered with the trench oxide films 115. Thus, the N-type region 119 electrically floats (is isolated) from the periphery thereof. The resistive element 77 is arranged to be entirely opposed to the N-type region 119 through the LOCOS oxide film 124 in plan view. Therefore, the resistive element 77 is opposed to a depletion layer 120 spreading in the N-type region 119 and the BOX layer 113 through the LOCOS oxide film 124.

Thus, a voltage applied between the P-type substrate 121 and the resistive element 77 is dispersed to the depletion layer 120 and the BOX layer 113. Therefore, a voltage applied to the LOCOS oxide film 124 following voltage application to the resistive element 77 can be reduced. Even if a high voltage is applied to the resistive element 77, the high voltage can be partially dispersed to the depletion layer 120 and the BOX layer 113, whereby dielectric breakdown of the LOCOS oxide film 124 can be suppressed. Consequently, the withstand voltage against dielectric breakdown of the LOCOS oxide film 124 can be improved without increasing the thickness of the LOCOS oxide film 124. Further, the thickness of the LOCOS oxide film 124 may not be increased, whereby the degree of integration of the active elements and other passive elements provided along with the resistive element 77 can also be increased by properly designing the thickness of the LOCOS oxide film 124.

FIGS. 13A to 13K are schematic sectional views successively showing the steps of a method for producing the semiconductor device 111 shown in FIG. 11.

Figure 13A:
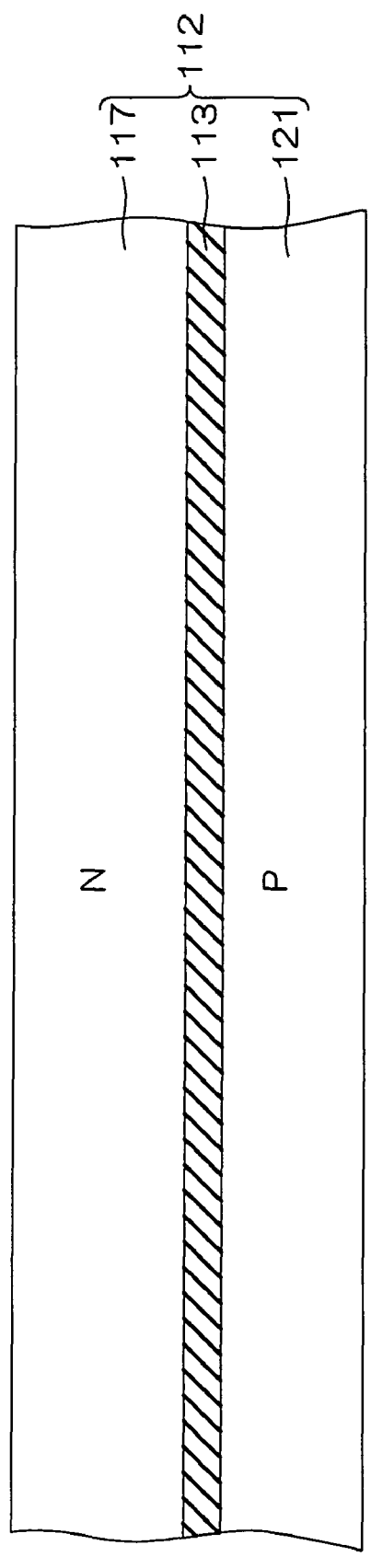
FIGS. 13A to 13K are schematic sectional views successively showing the steps of a method for producing the semiconductor device shown in FIG. 11.

First, a P-type silicon substrate, for example, is thermally oxidized, and an N-type silicon substrate is bonded onto an oxide film formed by the thermal oxidation. Thus, the thick-film SOI substrate 112 having the P-type substrate 121, the BOX layer 113 and the SOI layer 117 is prepared, as shown in FIG. 13A.

Figure 13B:
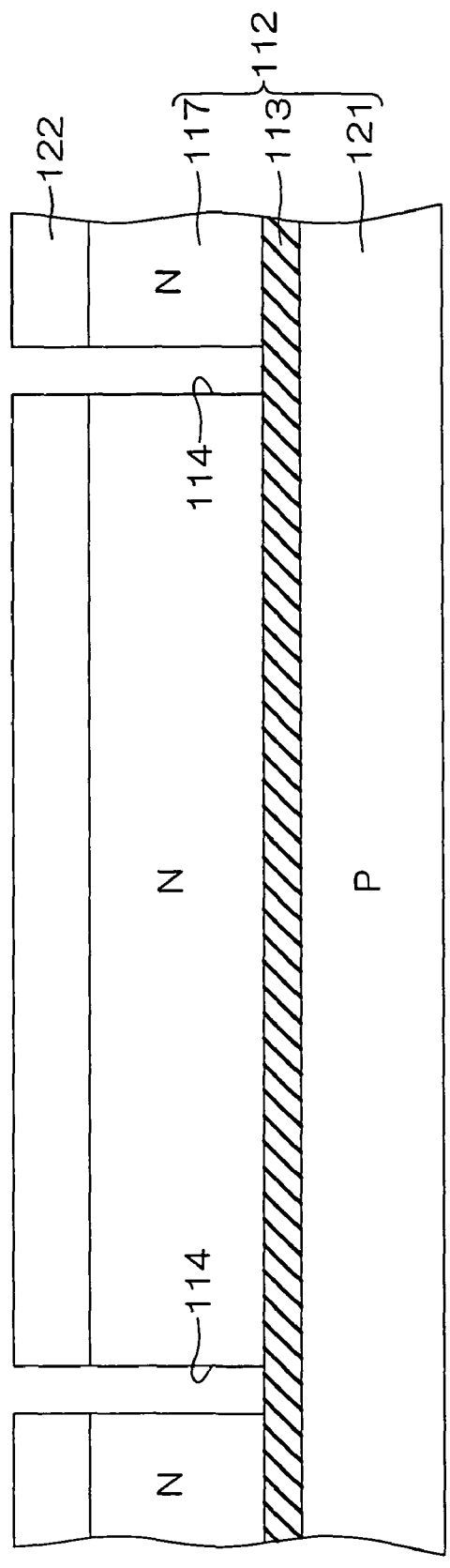

Then, a mask 122 having an opening opposed to a portion for forming the deep trench 114 is formed on the SOI layer 117 by photolithography, as shown in FIG. 13B. Then, the deep trench 114 is formed by etching a portion of the SOI layer 117 exposed from the opening of the mask 122.

Figure 13C:
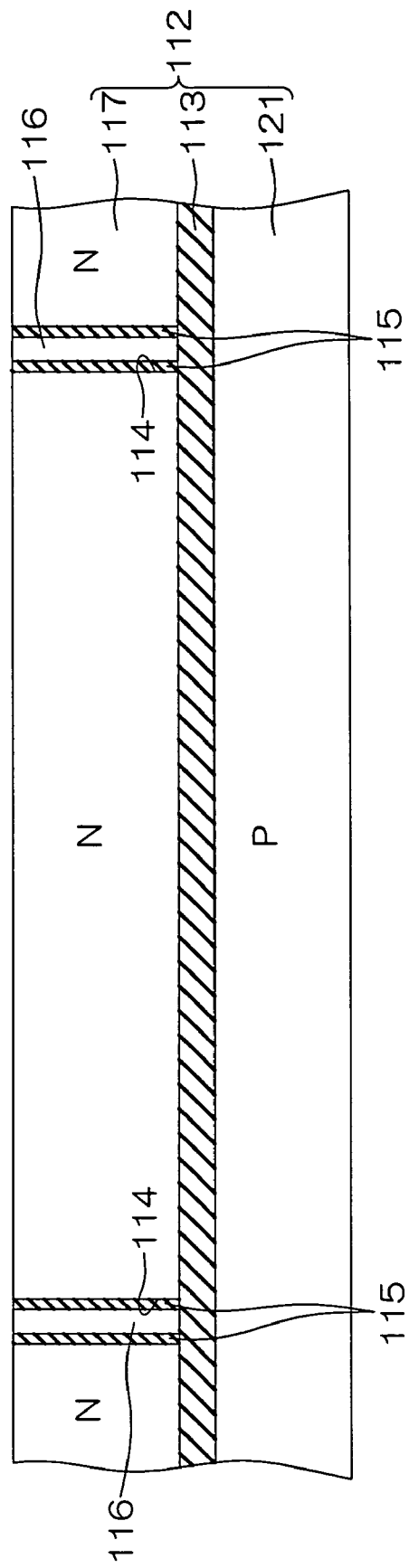

Then, the inner side surfaces of the deep trench 114 are thermally oxidized while leaving the mask 122. Thus, the trench oxide films 115 are formed on the inner side surfaces of the deep trench 114, as shown in FIG. 13C. Then, a polysilicon film (not shown) is deposited on the SOI layer 117 by LP-CVD. The polysilicon film is bonded (deposited) to fill up the deep trench 114 and to form a thin film on the mask 122. Then, unnecessary portions (portions other than that corresponding to the embedded body 116) of the polysilicon film and the mask 122 are removed. Thus, the embedded body 116 is formed, as shown in FIG. 13C.

Figure 13D:
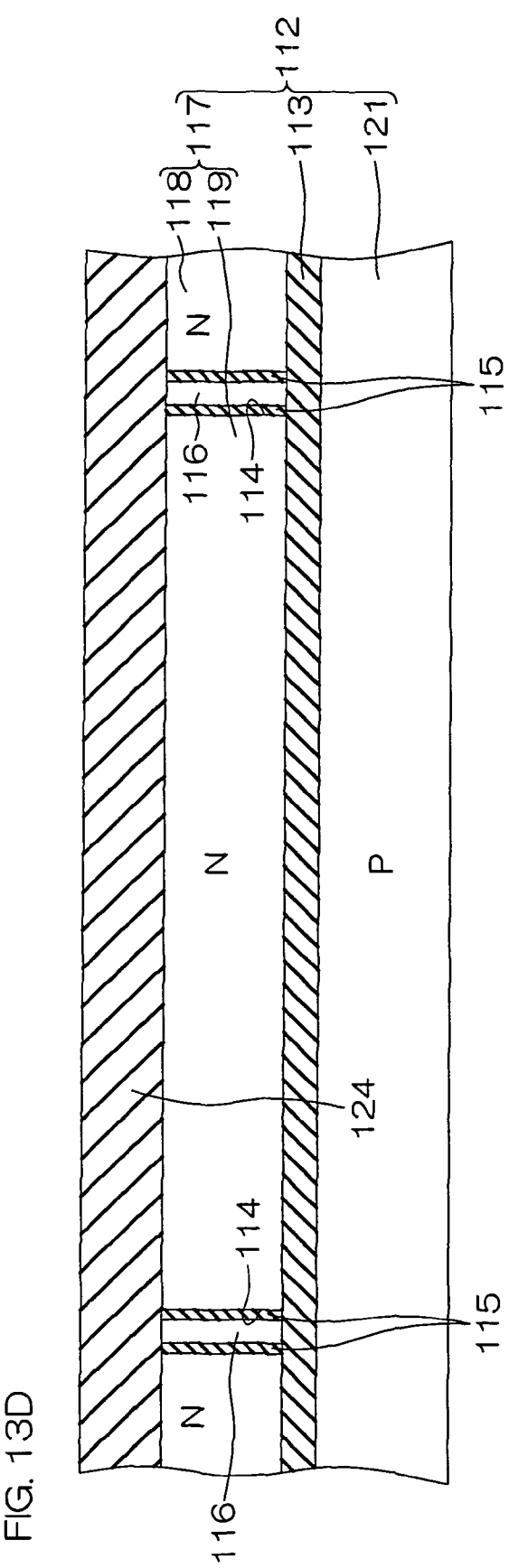

Then, the SOI layer 117 is thermally oxidized, whereby the LOCOS oxide film 1124 is formed on the surface of the SOI layer 117, as shown in FIG. 13D.

Figure 13E:
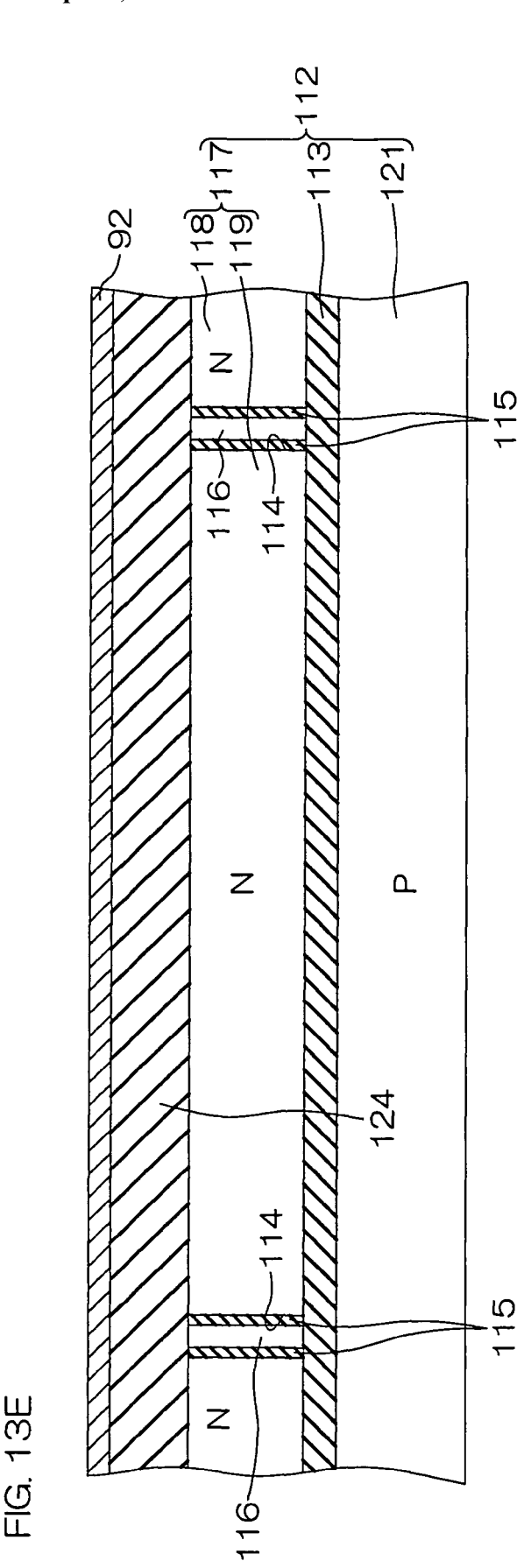

Then, a polysilicon film 92 is deposited on the SOI layer 117 by LP-CVD, as shown in FIG. 13E. The LOCOS oxide film 124 is covered with the polysilicon film 92.

Figure 13F:
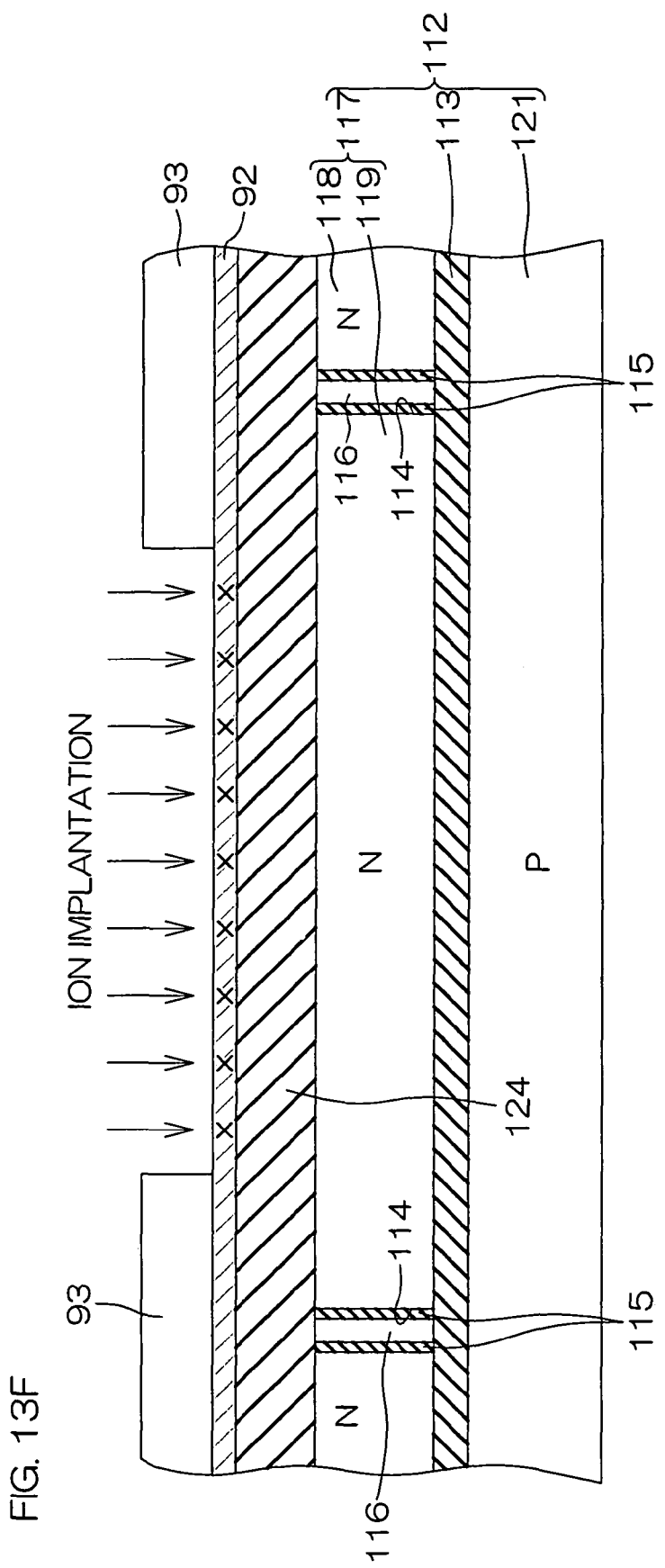

After the formation of the polysilicon film 92, a mask 93 having an opening opposed to a portion for forming the resistive element 77 is formed on the polysilicon film 92 by photolithography, as shown in FIG. 13F. A P-type impurity is implanted into the polysilicon film 92 from the surface thereof through the mask 93. After the implantation of the P-type impurity, the mask 93 is removed.

Figure 13G:
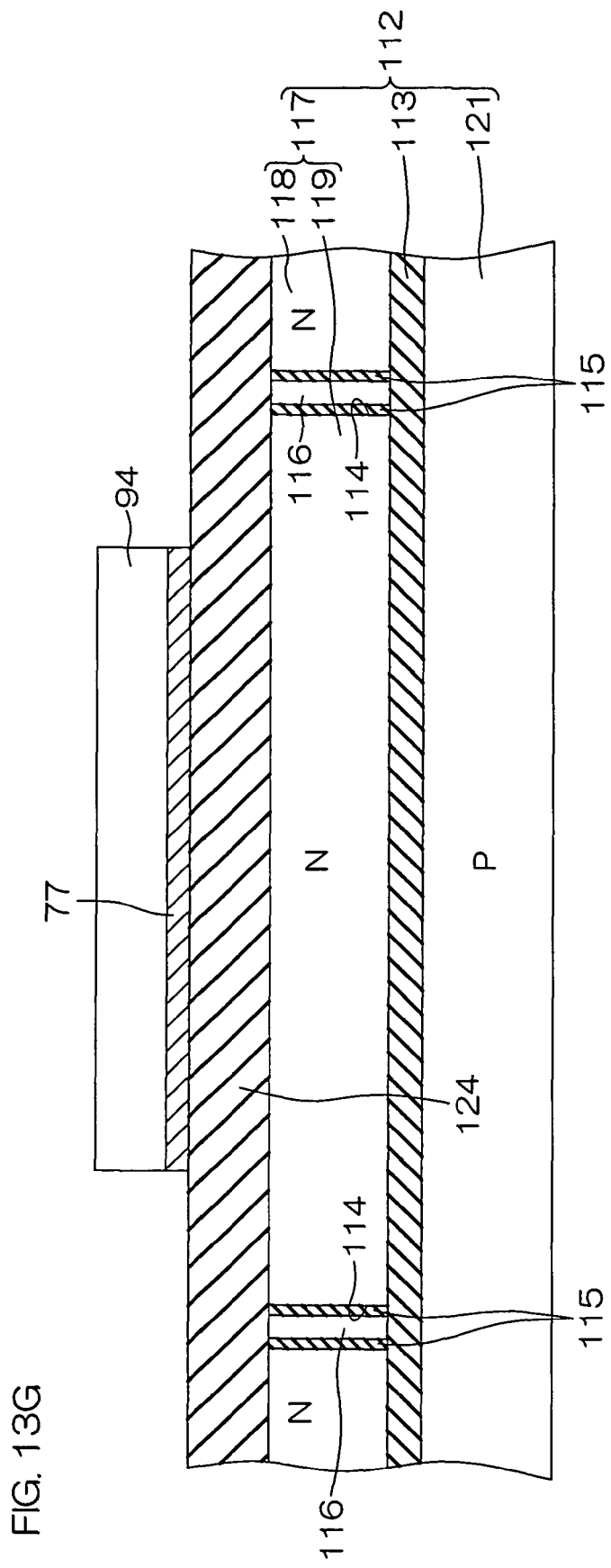

Then, a mask 94 having openings in regions different from that opposed to the portion for forming the resistive element 77 is formed by photolithography, as shown in FIG. 13G. Unnecessary portions (portions other than that corresponding to the resistive element 77) of the polysilicon film 92 are removed by etching portions of the polysilicon film 92 exposed from the openings of the mask 94. Thus, the resistive element 77 is formed. After the formation of the resistive element 77, the mask 94 is removed.

Figure 13H:
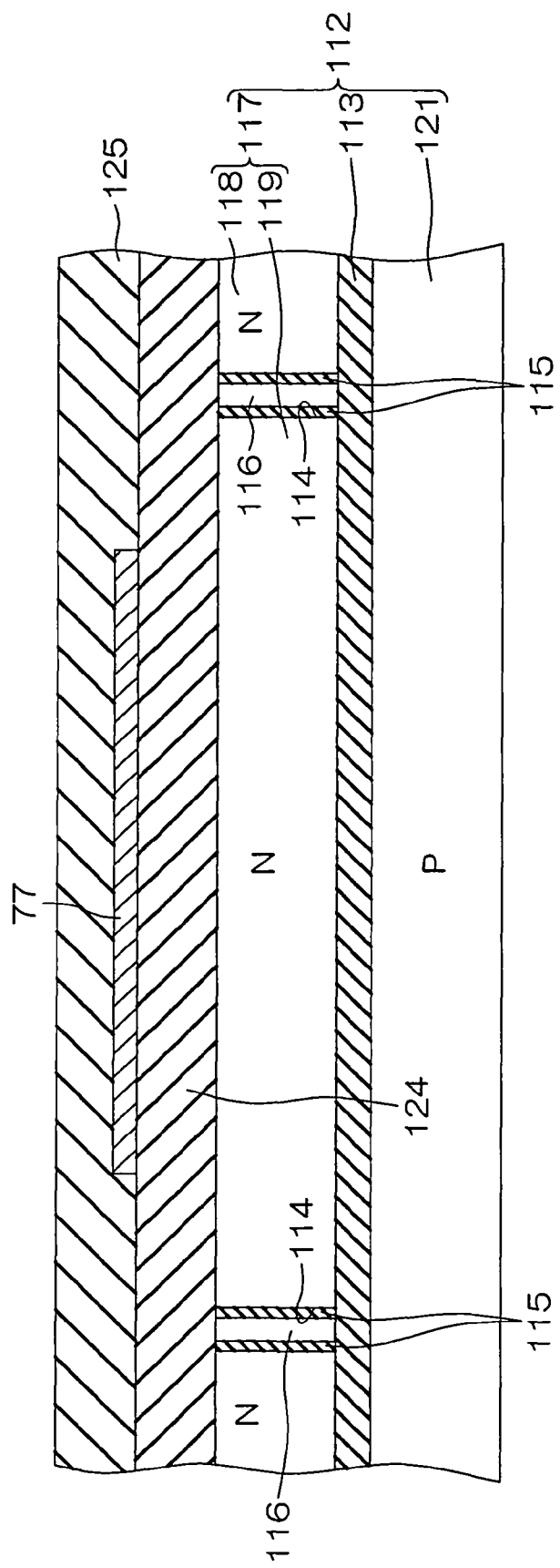
Figure 13:
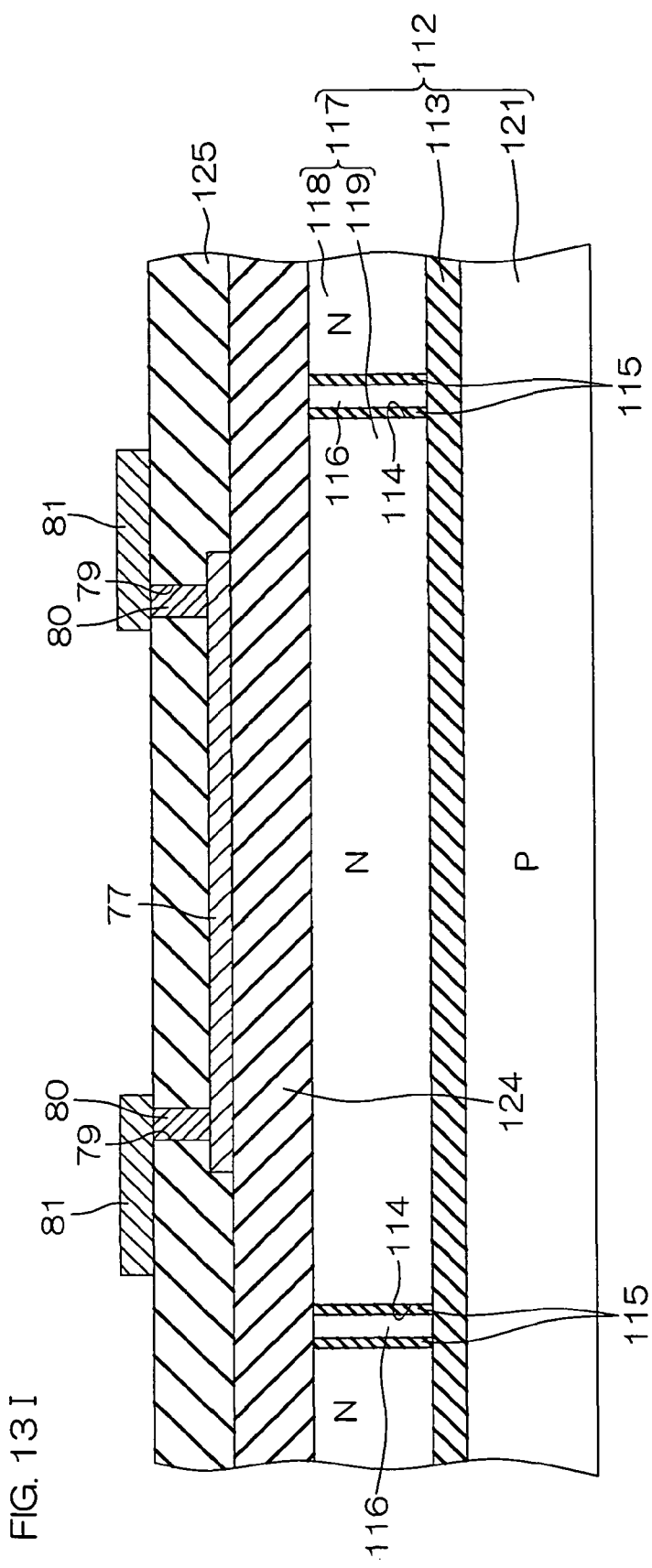

Thereafter the first interlayer dielectric film 125 is laminated on the SOI layer 117 by CVD, as shown in FIG. 13H. The resistive element 77 and the LOCOS oxide film 124 are covered with the first interlayer dielectric film 125.

*Then, a mask (not shown) having openings opposed to portions for forming contact holes 79 respectively is formed on the first interlayer dielectric film 125 by photolithography. Then, the contact holes 79 are formed in the first interlayer dielectric film 125 by etching through the mask, as shown in FIG. 13I. After the formation of the contact holes 79, the mask is removed from the first interlayer dielectric film 125.

Then, a conductive material is bonded onto the first interlayer dielectric film 125 by sputtering. The conductive material is bonded (deposited) to fill up the contact holes 79 and to form a thin film on the first interlayer dielectric film 125. The thin film of the conductive material formed on the first interlayer dielectric film 125 is patterned by photolithography and etching. Thus, contact plugs 80 and first wires 81 are formed, as shown in FIG. 13I.

Figure 13J:
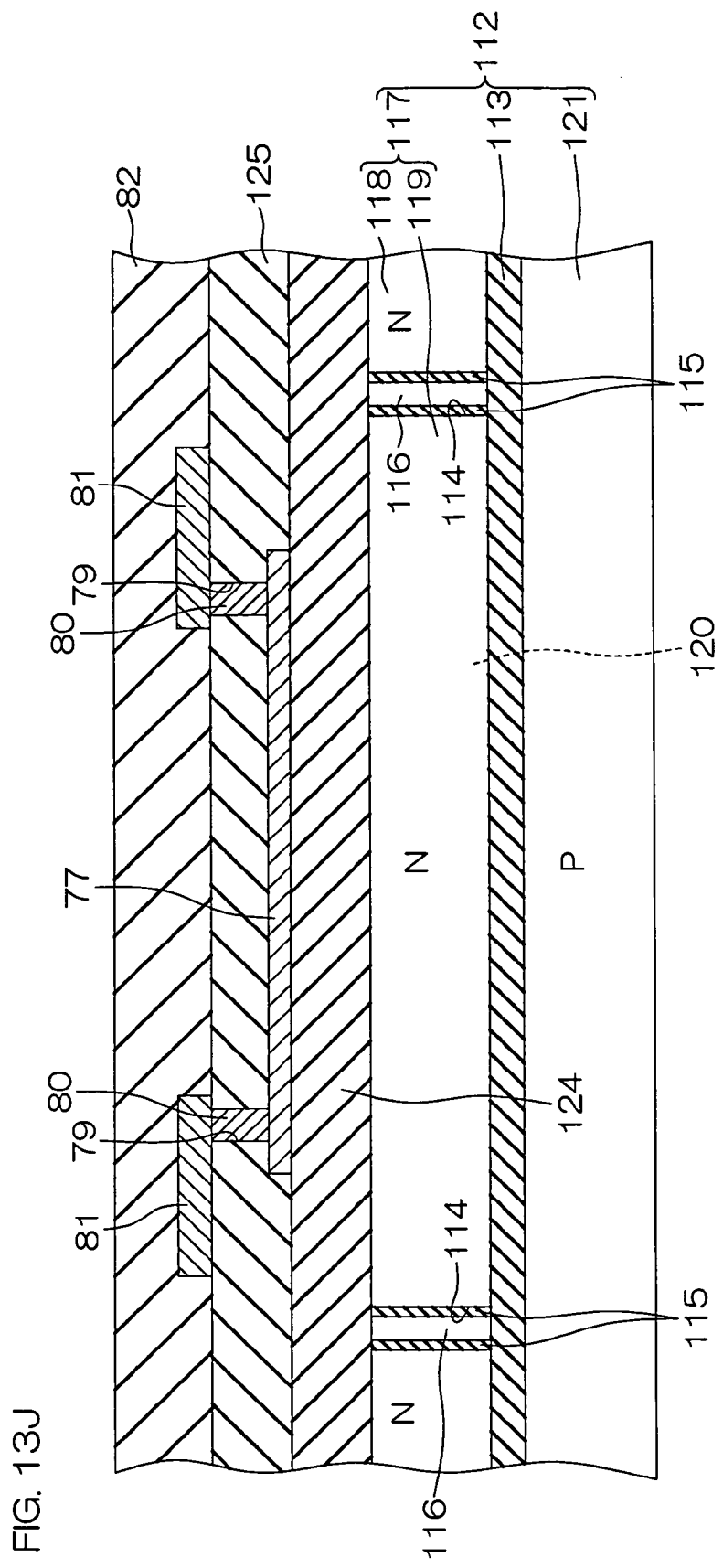

Thereafter a second interlayer dielectric film 82 is laminated on the first interlayer dielectric film 125 by CVD, as shown in FIG. 13J. The first wires 81 are covered with the second interlayer dielectric film 82.

Figure 13K:
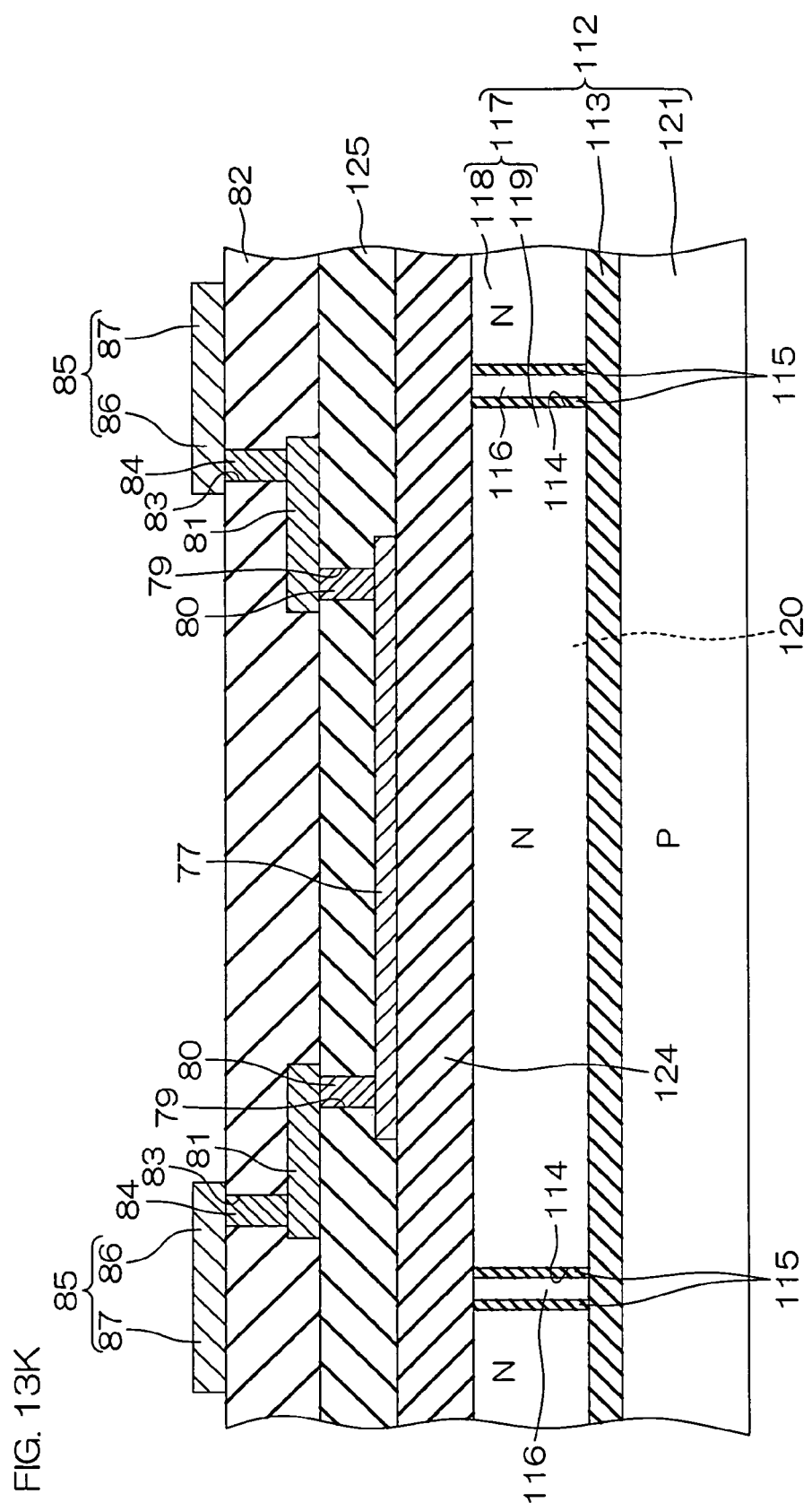
Figure 14:
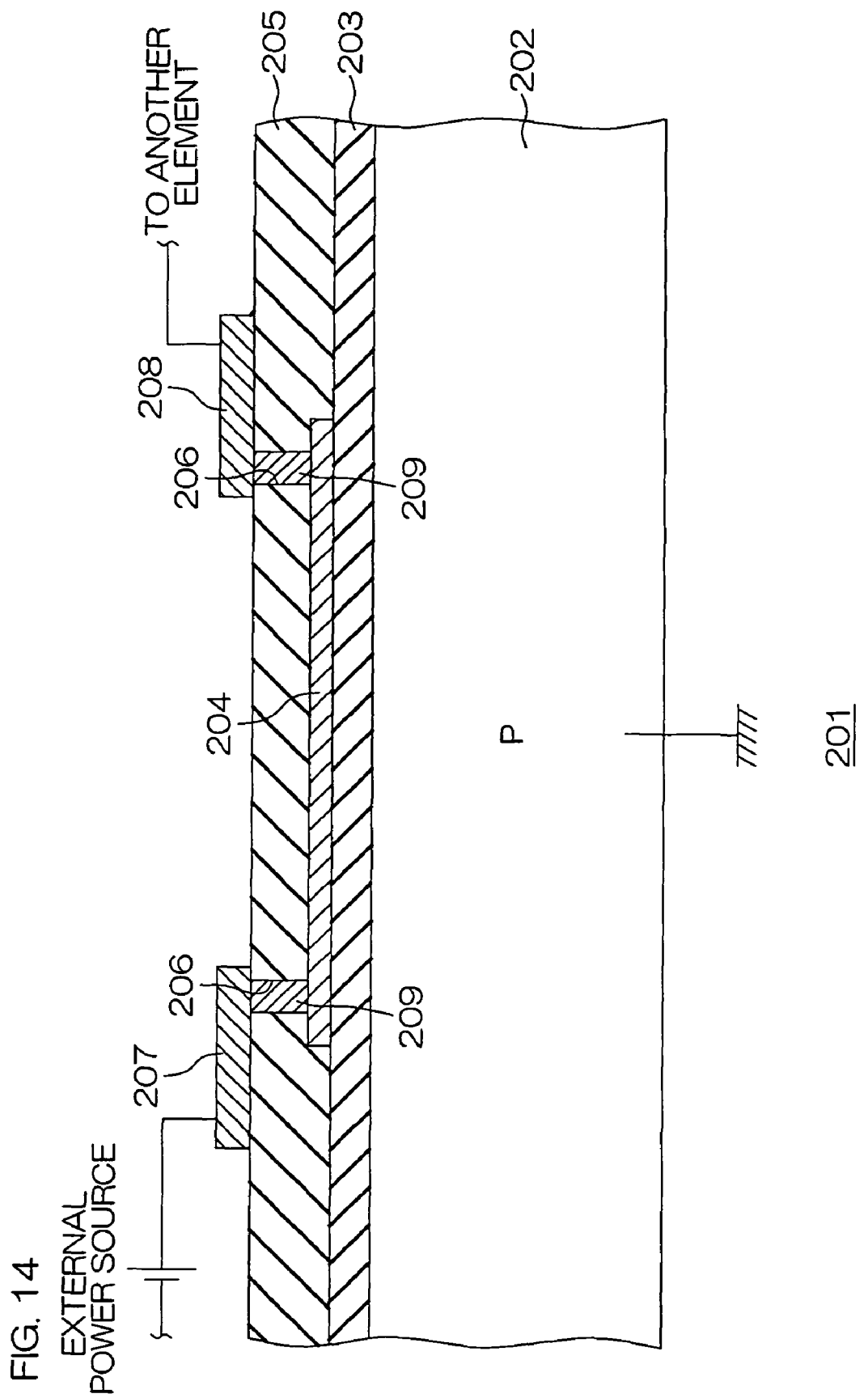
FIG. 14 is a schematic sectional view of a conventional high withstand voltage semiconductor device.

Then, a mask (not shown) having openings opposed to portions for forming contact holes 83 respectively is formed on the second interlayer dielectric film 82 by photolithography. Then, the contact holes 83 are formed in the second interlayer dielectric film 82 by etching through the mask, as shown in FIG. 13K. After the formation of the contact holes 83, the mask is removed from the second interlayer dielectric film 82.

Then, a conductive material is bonded onto the second interlayer dielectric film 82 by sputtering. The conductive material is bonded (deposited) to fill up the contact holes 83 and to form a thin film on the second interlayer dielectric film 82. The thin film of the conductive material formed on the second interlayer dielectric film 82 is patterned by photolithography and etching. Thus, contact plugs 84 and second wires 85 having first portions 86 and second portions 87 are formed, as shown in FIG. 13K. The semiconductor device 111 shown in FIG. 11 is obtained through the aforementioned steps.

While a plurality of embodiments of the present invention have been described, the present invention may be embodied in other ways.

For example, the conductivity types of the semiconductor portions in the semiconductor devices 1, 61, 71, 101 and 111 may be reversed. In the semiconductor device 1, for example, the P-type portions may be converted to N-type portions, and vice versa.

The method for forming the resistive element 3 is not restricted to that described with reference to FIGS. 2O to 2R. The resistive element 3 can also be formed by forming a polysilicon film previously doped with an N-type impurity on the epitaxial layer 5 and patterning the polysilicon film by photolithography, for example.

While the plurality of interlayer dielectric films (the first interlayer dielectric film 78 or 125 and the second interlayer dielectric film 82) are formed on the element isolation film 76 or the LOCOS oxide film 124 in each of the aforementioned embodiments, only a single interlayer dielectric film, i.e., only the first interlayer dielectric film 78 or 125 may be formed, for example.

While the present invention has been described in detail byway of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2008-147872 filed with the Japanese Patent Office on Jun. 5, 2008 and Japanese Patent Application No. 2008-149440 filed with the Japanese Patent Office on Jun. 6, 2008, the disclosures of which are incorporated herein by reference.

What is claimed is:

1. A semiconductor device, comprising:
a semiconductor layer;
an insulating film formed on a surface of the semiconductor layer;
a first insulator embedded in the semiconductor layer with a thickness larger than the thickness of the insulating film, and with an upper surface of the first insulator being set in an intermediate portion of the insulating film in a thickness direction, such that the upper surface of the first insulator is below an upper surface of the insulating film and above a lower surface of the insulating film; and
a resistive element formed on the upper surface of the first insulator;
wherein the first insulator does not overlap with the insulating film in plan view, but is in contact with the inner end surface of the insulating film on the side surface thereof.

2. The semiconductor device according to claim 1, wherein a trench is dug in a portion of the semiconductor layer opposed to the resistive element downward from the surface thereof, and
the first insulator is made of an insulating material charged into the trench.

3. The semiconductor device according to claim 2, further comprising: a first conductivity type drift region formed in the semiconductor layer so that the surface thereof is selectively exposed from the insulating film; a first conductivity type drain region formed on the surface layer portion of the drift region so that the surface thereof is exposed in a region surrounded by the insulating film; a second conductivity type body region formed on the surface layer portion of the drift region so that the surface thereof is exposed from the insulating film; a first conductivity type source region formed on the surface layer portion of the body region; a gate electrode provided over the surfaces of the drift region and the body region; and a second insulator embedded in the drift region in contact with the insulating film, wherein the second insulator is formed by digging a second trench in the drift region downward from the surface thereof and charging an insulating material into the second trench, and the width of the second trench is smaller than the width of the trench charged with the first insulator.

4. The semiconductor device according to claim 1, further comprising: a first conductivity type drift region formed in the semiconductor layer so that the surface thereof is selectively exposed from the insulating film; a first conductivity type drain region formed on the surface layer portion of the drift region so that the surface thereof is exposed in a region surrounded by the insulating film; a second conductivity type body region formed on the surface layer portion of the drift region so that the surface thereof is exposed from the insulating film; a first conductivity type source region formed on the surface layer portion of the body region; a gate electrode provided over the surfaces of the drift region and the body region; and a second insulator embedded in the drift region in contact with the insulating film.

5. The semiconductor device according to claim 4, wherein the thickness of the second insulator is identical to the thickness of the first insulator.

6. The semiconductor device according to claim 4, wherein the resistive element is made of polysilicon doped with a second conductivity type impurity, and the gate electrode is made of polysilicon doped with a first conductivity type impurity.

7. The semiconductor device according to claim 4, wherein the insulating film is a LOCOS oxide film partitioning the semiconductor layer into a resistive element forming region for forming the resistive element and a DMOSFET forming region for forming a DMOSFET including the drift region, the drain region, the body region, the source region and the gate electrode.

8. The semiconductor device according to claim 7, wherein the semiconductor layer forms a second conductivity type region doped with a second conductivity type impurity in the resistive element forming region, and the drift region is formed adjacently to the second conductivity type region.

9. The semiconductor device according to claim 1, wherein the thickness of the insulating film is 0.3 to 0.8 µm, and the thickness of the first insulator is 1.0 to 10 µm.

* * * * *